(12) United States Patent
Jeon et al.

(10) Patent No.: US 6,690,347 B2
(45) Date of Patent: Feb. 10, 2004

(54) SHIFT REGISTER AND LIQUID CRYSTAL DISPLAY USING THE SAME

(75) Inventors: Jin Jeon, Anyang-si (KR); Hyung-Guel Kim, Yongin-si (KR); Seung-Hwan Moon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/068,892

(22) Filed: Feb. 11, 2002

(65) Prior Publication Data

US 2002/0149318 A1 Oct. 17, 2002

(30) Foreign Application Priority Data

Feb. 13, 2001 (KR) .............................. 01-7068
Aug. 13, 2001 (KR) ............................ 01-48649
Jan. 21, 2002 (KR) ............................. 02-3398

(51) Int. Cl.$^7$ ................................. G09G 3/36
(52) U.S. Cl. .................. 345/100; 345/103; 315/169.2
(58) Field of Search ......................... 315/169.1–169.4; 345/94, 98–100, 204, 211, 213, 103

(56) References Cited

U.S. PATENT DOCUMENTS

| | | | | |
|---|---|---|---|---|
| 4,447,812 A | | 5/1984 | Soneda et al. ............... 340/784 |
| 4,864,182 A | * | 9/1989 | Fujioka et al. ............. 315/169.3 |
| 5,426,447 A | * | 6/1995 | Lee ............................. 345/103 |
| 6,052,426 A | | 4/2000 | Maurice ...................... 377/78 |
| 6,166,715 A | * | 12/2000 | Chang et al. ................ 345/100 |
| 6,300,928 B1 | * | 10/2001 | Kim ............................ 345/92 |
| 6,426,743 B1 | * | 7/2002 | Yeo et al. .................... 345/213 |

FOREIGN PATENT DOCUMENTS

| | | | |
|---|---|---|---|
| EP | 0315362 A2 | 5/1989 | |
| JP | 11-176186 | 7/1999 | ........... G11C/19/00 |
| KR | 2000-0066493 | 11/2000 | ......... G02F/1/1345 |

OTHER PUBLICATIONS

International Search Report, International Application No. PCT/KR02/00191.

* cited by examiner

*Primary Examiner*—Don Wong
*Assistant Examiner*—Wilson Lee
(74) *Attorney, Agent, or Firm*—McGuireWoods LLP

(57) ABSTRACT

There is provided a shift register in which multiple stages are connected one after another to each other, the multiple stages having a first stage in which a start signal is coupled to an input terminal, the shift register sequentially outputting output signals of respective stages. The multiple stages have odd stages for receiving a first clock signal, and even stages for receiving a second clock signal having a phase opposite to the first clock signal. Each of the multiple stages has a pull-up section for providing a corresponding one of the first and second clock signals to an output terminal. A pull-up driving section is connected to an input node of the pull-up section, for turning on the pull-up section in response to a front edge of an input signal and for turning off the pull-up section in response to an output signal of a next stage. A pull-down section provides a first power voltage to the output terminal. A pull-down driving section is connected to an input node of the pull-down section, for turning off the pull-down section in response to a front edge of the input signal and turning on the pull-down section in response to the front edge of the output signal of the next stage.

76 Claims, 37 Drawing Sheets

FIG. 24A
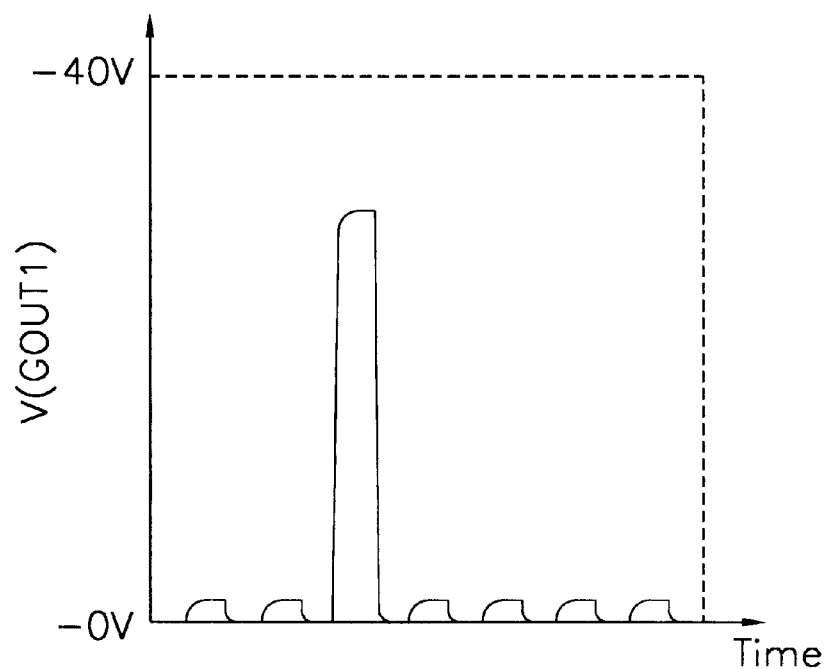
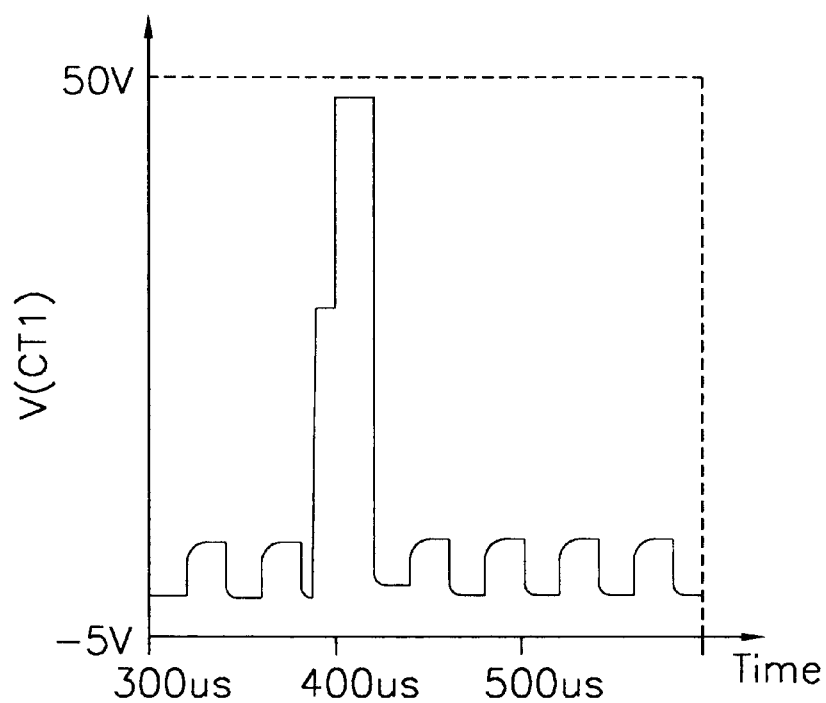

FIG. 24B
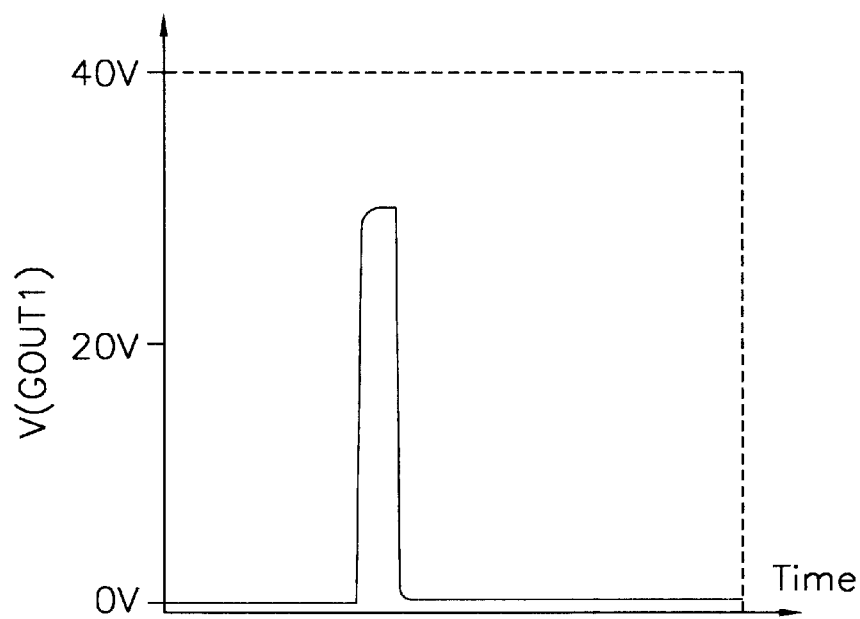
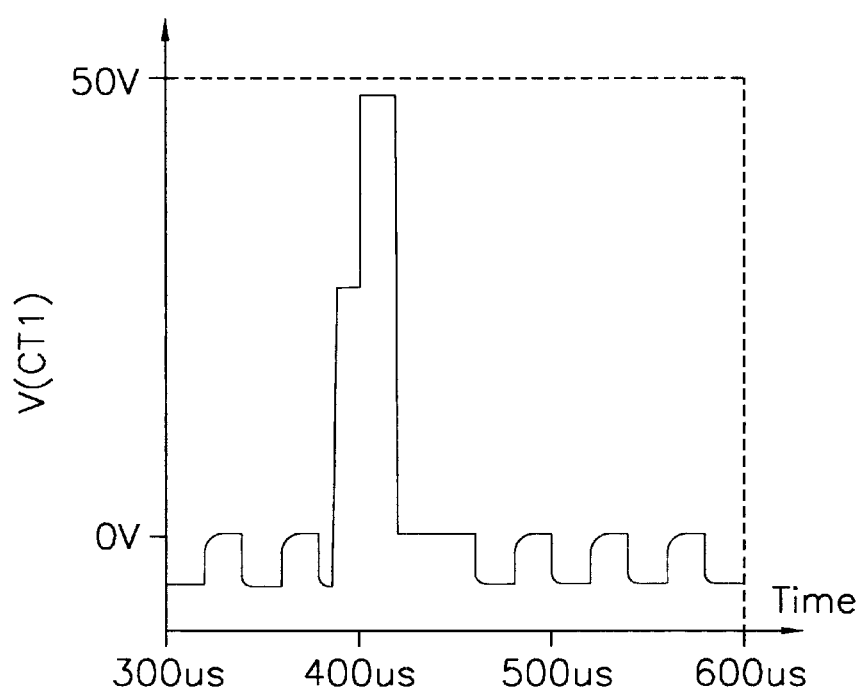

SHIFT REGISTER AND LIQUID CRYSTAL DISPLAY USING THE SAME

BACKGROUND OF THE INVENTION

1. Field of the Invention

The present invention relates to a shift register of a display device and a liquid crystal display (LCD) using the same, and more particularly, to a shift register generating a scanning signal for scanning gate lines in a gate line driving circuit of AMTFT-LCD (Active Matrix Thin Film Transistor Liquid Crystal Display) and for selecting a block of data lines in a data line block driving circuit.

2. Description of the Related Art

In these days, information processing devices have been rapidly developed in a trend with various architectures, functions and faster information processing speed. Information processed in these information processing devices has an electrical signal format. In order to visually confirm information processed in the information processing device, a display for a role as an interface should be provided.

LCDs have advantages such as the lighter weight, small size, high resolution, lower power consumption and friendly relation with environment and they render display of full colors compared with the traditional cathode ray tube (CRT). Such the advantages allow the LCDs to replace the CRTs and to be spotlighted as a next generation display.

LCDs apply an electric power to liquid crystal having a specific molecular configuration to vary the molecular arrangement of liquid crystal. The variation in the molecular configuration of liquid crystal causes a variation in optical properties such as birefringence, optical rotary power, dichroism and light scattering. The LCDs utilize such variations in optical properties to display an image.

The LCD device is largely sorted into a TN (Twisted Nematic) type and a STN (Super-Twisted Nematic) type. The liquid crystal display device is, according to the driving method, sorted into an active matrix display type, which uses a switching device and a TN liquid crystal, and a passive matrix type, which uses an STN liquid crystal.

A distinguishable difference of two types is in that the active matrix display type is applied to a TFT-LCD that drives the LCD by using a TFT and the passive matrix display type dispenses with a complicated circuit associated with a transistor because of using no transistor TFT-LCD is divided into amorphous silicon TFT LCD (a-Si TFT-LCD) and polycrystalline silicon TFT LCD (poly-Si TFT-LCD). Poly-Si TFT-LCD has advantages of lower power consumption, lower price compared with a-Si TFT-LCD but has a drawback in that its manufacturing process is complicated. Thus, poly-Si TFT-LCD is mainly used in a small sized display such as mobile phones.

Amorphous-Si TFT-LCD is applied to a large screen sized display such as notebook personal computer (PC), LCD monitor, high definition (HD) television, etc., due to easy application of large screen and high production yield.

As shown in FIG. 1, poly-Si TFT LCD includes a data driving circuit 12 and a gate driving circuit 14 that are formed on a glass substrate 10 having a pixel array. A terminal part 16 is connected with an integrated printed circuit board (PCB) 20 using a film cable 18. This structure saves the manufacturing costs and minimizes the power loss due to the integration of driving circuits.

As shown in FIG. 2, amorphous-Si TFT LCD has a data driving chip 34 formed on a flexible printed circuit board 32 in a manner of COF (Chip-On-Film). A data printed circuit board 36 is connected with a data line terminal of the pixel array through the flexible PCB 32. A gate driving chip 40 is formed on a flexible PCB 38 in a manner of COF. A gate PCB 42 is connected with a gate line terminal through the flexible PCB 40.

Recently, there is also disclosed a technique for removing the gate PCB from the LCD by employing an integrated PCB technique mounting a gate power supply part on the data PCB. Korean Patent Laid-Open Publication No. 2000-66493 previously filed by the present assignee discloses an LCD module employing an integrated PCB by which the gate PCB is removed.

However, although the integrated PCB is employed, the flexible PCB having the flexible PCB is still used. Thus, since multiple flexible PCBs should be assembled in a glass substrate, a fabrication process of a-Si TFT LCD, especially OLB (Outer Lead Bonding) process becomes complicated compared with that of poly-Si TFT LCD, whereby its fabrication costs becomes higher.

Thus, there are many endeavors for decreasing the number of the assembly process by simultaneously forming data driving circuit and gate driving circuit along with pixel array on a glass substrate in a-Si TFT LCD like poly-Si TFT LCD.

U.S. Pat. No. 5,517,542 discloses a technique for an a-Si TFT gate driving circuit formed on a glass substrate.

In the above U.S. Pat. No. 5,517,542, a shift register of the gate driving circuit uses three clock signals. Each stage of the shift register two clock signals of three clock signals, is enabled with an output signal of previous stage as an input signal, and maintains the disable state by feed backing an output of the second next stage.

Each stage in the U.S. Patent provides a voltage applied to gate of full-down transistor in a capacitor charge manner in order to maintain the disable status. Thus, when an increase in gate threshold voltage of the full-down transistor due to stress of the full-down transistor is elevated higher than the charge voltage of the capacitor, there may occur a turn-off of the full-down transistor in the disable status.

The above U.S. patent employs a power supply circuit elevating a VDD in proportional to the increase in the threshold voltage of the a-Si TFT LCD in order to prevent an error operation due to the increase in the threshold voltage.

SUMMARY OF THE INVENTION

Accordingly, it is a first object of the present invention to provide a shift register making it possible to perform a stable operation regardless of the fluctuation in the threshold voltage of a-Si TFT LCD on a use of a long-term by maintaining an input node of the full-down means at a coupled status with the power voltage.

It is a second object of the present invention to provide an LCD capable of minimizing the number of external connection terminals on the LCD panel for the connection with an external circuit by using two clock signals.

It is a third object of the present invention to provide an amorphous silicon LCD in which a data driving circuit is integrated on a substrate.

It is a fourth object of the present invention to provide a method for operating gate lines of an LCD.

It is a fifth object of the present invention to provide a method for block-operating data lines of an LCD.

To accomplish the first object, there is provided a shift register in which multiple stages are connected one after another to each other, the multiple stages having a first stage in which a start signal being coupled to an input terminal, the shift register sequentially outputting output signals of respective stages. The multiple stages has odd stages for receiving a first clock signal and even stages for receiving a second clock signal having a phase opposite to the first clock signal.

Each of the multiple stages has: a pull-up means for providing a corresponding one of the first and second clock signals to an output terminal; a pull-up driving means connected to an input node of the pull-up means, for turning on the pull-up means in response to a front edge of an input signal and turning off the pull-up means in response to an output signal of a next stage; a pull-down means for providing a first power voltage to the output terminal; and a pull-down driving means connected to an input node of the pull-down means, for turning off the pull-down means in response to a front edge of the input signal and turning on the pull-down means in response to the front edge of the output signal of the next stage.

Here, the first power voltage is a turn off voltage (VOFF, VSS) and the second power voltage is a turn on voltage (VON, VDD).

Preferably, each stage further comprises a turn-on preventing means connected to the input node of the pull-down means, wherein the turn-on preventing means connects the first power voltage to the input node of the pull-down means in response to the output signal of the output terminal to prevent the pull-down means from being turned on.

The turn-on preventing means comprises an NMOS transistor of which drain is connected to the input node of the pull-down means, gate is connected to the output terminal and source is connected to the first power voltage.

Also, the pull-up driving means has a capacitor connected between the input node of the pull-up means and the output terminal; a first transistor of which drain and gate are commonly connected to the input terminal and source is connected to the input node of the pull-up means; a second transistor of which drain is connected to the input node of the pull-up means, gate is connected to the input node of the pull-down means and source is connected to the first power voltage; and a third transistor of which drain is connected to the input node of the pull-up means, gate is connected to an output signal of a next stage and source is connected to the first power voltage.

The pull-down driving means comprises: a fourth transistor of which drain is connected to the second power voltage, gate is connected to the output signal of the next stage and source is connected to the input node of the pull-down means; and a fifth transistor of which drain is connected to the input node of the pull-down means, gate is connected to the input signal and source is connected to the first power voltage.

The floating preventing means has a sixth transistor of which drain and gate are connected to the second power voltage and source is connected to the input node of the pull-down means, wherein the sixth transistor has a size smaller sufficiently than the fifth transistor. Here, it is preferable that a size ratio of the fifth transistor to the sixth transistor is approximately 20:1.

By the above constitution, it is desirable that the external connection terminal connected to the shift register comprises five terminals of a first clock signal input terminal, a second clock signal input terminal, a start signal input terminal, a first power voltage input terminal and a second power voltage input terminal.

Also, it is desirable that a size ratio of the fifth transistor to the seventh transistor is approximately 2:1.

To achieve the first object, there is provided a shift register according to another aspect of the present invention. The shift register includes multiple stages connected in cascade fashion. The multiple stages have a first stage in which a start signal is coupled to an input terminal. The shift register sequentially outputs output signals of the respective stages. The multiple stages have odd stages for receiving a first clock signal and a second clock signal having a phase opposite to the first clock signal at a first clock terminal and a second clock terminal of the odd stages, and even stages for receiving the second clock signal and the first clock signal at a first clock termianl and a second clock terminal of the even stages.

Each of the multiple stages comprises: an input terminal connected to an output terminal of a previous stage; an output terminal connected to a corresponding gate line; a first control terminal connected to a second control terminal of a stage after the next stage; a second control terminal; a clock terminal into which a corresponding clock signal is inputted; a pull-up means for providing a corresponding one out of the first and second clock signals to the output terminal; a pull-down means for providing a first power voltage to the output terminal; a pull-up driving means connected to an input node of the pull-up means, for turning on the pull-up means in response to a front edge of an input signal and turning off the pull-up means in response to a front edge of a control signal supplied to the control terminal; and a pull-down driving means connected to an input node of the pull-down means and an input node of the pull-up means, for turning off the pull-down means, and for turning on the pull-down means in response to a front edge of an output signal of the next stage.

Here, the pull-up driving means comprises: a capacitor connected between the input node of the pull-up means and the output terminal; a first transistor of which drain and gate are commonly connected to the input signal and source is connected to the input node of the pull-up means; and a second transistor of which drain is connected to the input node of the pull-up means, gate is connected to the output signal of the next stage and source is connected to the first power voltage.

Preferably, the first transistor receives the start signal or the input signal from the previous stage through the commonly connected gate and drain, and charges the capacitor through the capacitor.

Also, the pull-up driving means discharges the control signal of the pull-up means using a pull-up control signal provided from the second control terminal.

Further, the pull-down driving means comprises: a third transistor of which drain is connected to the first power voltage, gate is connected to the output signal of the next stage and source is connected to the input node of the pull-down means; and a fourth transistor of which drain and gate are commonly connected to the second clock signal and source is connected to the input node of the pull-down means.

To achieve the first object of the present invention, there is provided a shift register according to further another aspect of the invention. The shift register includes multiple stages connected in cascade fashion. The multiple stages having a first stage in which a start signal is coupled to an input terminal. The shift register sequentially outputs output signals of the respective stages. The multiple stages include odd stages for receiving a first clock signal and a second clock signal having a phase opposite to the first clock signal.

Each of the multiple stages comprises: a, pull-up means for providing a corresponding one out of the first and second clock signals; a pull-down means for providing a first power voltage to the output terminal; a pull-down driving means connected to an input node of the pull-down means, for turning off the pull-down means in response to a front edge of the input signal and turning on the pull-down means in response to a front edge of an output signal of a next stage; and a pull-up driving means provided with a capacitor of which one end is connected to an input node of the pull-up means and the other end is connected to the output terminal, and a discharging means for forcibly discharging the capacitor depending on an external input control signal, the pull-up driving means turning on the pull-up means by charging the capacitor in response to the front edge of the input signal and turning off the pull-up means by forcibly discharging the capacitor in response to the front edge of the output signal of the next stage.

Here, the pull-up driving means comprises: a capacitor connected between the input node of the pull-up means and the output terminal; a first transistor of which gate is connected to the input signal, drain is connected to a second power voltage and source is connected to the input node of the pull-up means; a second transistor of which drain is connected to the input node of the pull-up means, gate is connected to the input node of the pull-down means and source is connected to the first power voltage; a third transistor of which drain is connected to the input node of the pull-up means, gate is connected to the output signal of the next stage and source is connected to the first power voltage; and a fourth transistor of which drain is connected to the input node of the pull-up means, source is connected to the first power voltage and gate forcibly discharges the capacitor which receives the external input control signal.

Preferably, the external input control signal has a voltage level capable of turning on the transistor when a power is applied and turning off the transistor before the start signal is applied to the first stage. Also, the external input control signal has a voltage level capable of turning off the transistor while the start signal is applied to the first stage and an output of a last shift register is generated, and turning on the transistor after the output of the last shift register is generated, thereby discharging the capacitor of the last shift register.

Further, the pull-up driving means comprises: a capacitor connected between the input node of the pull-up means and the output terminal; a first transistor of which gate is connected to the input signal, drain is connected to a second power voltage and source is connected to the input node of the pull-up means; a second transistor of which drain is connected to the input node of the pull-up means, gate is connected to the input node of the pull-down means and source is connected to the first power voltage; and a third transistor of which drain is connected to the input node of the pull-up means, gate is connected to the output signal of the next stage and source receives the external input control signal to forcibly discharge the capacitor.

The sources of the second transistor and the third transistor are commonly connected to each other. The external input control signal maintains a low state simultaneously with an application of a power to thereby forcibly discharge the capacitor, and maintains a high state before the start signal applied to the first stage is generated.

Furthermore, the external input control signal has a voltage level capable of turning on the third transistor when a power is applied, and turning off the third transistor before the start signal is applied to the first stage. The turning on voltage level is the second power voltage, and the turning off voltage level is the first power voltage.

Moreover, the second power voltage is above a threshold voltage capable of turning on the third transistor even when the first power voltage is applied to the gate terminal of the third transistor and less than the first power voltage. The external input control signal has a voltage level capable of turning off the transistor while the start signal is applied to the first stage and an output of a last shift register is generated, and turning on the transistor after the output of the last shift register is generated, thereby discharging the charge accumulated in the capacitor of the last shift register.

To accomplish the second and third objects of the present invention, there is an LCD comprising a display cell array circuit, a data driving circuit and a gate driving circuit formed on a transparent substrate.

The display cell array circuit has multiple data lines and multiple gate lines, each of the display cell arrays connected to a corresponding pair of data line and gate line.

The gate driving circuit has a first shift register comprising multiple stages connected one after another to each other, the multiple stages having a first stage in which a start signal is coupled to an input terminal, for sequentially selecting the multiple gate lines using an output signal of each stage.

The data driving circuit comprising multiple data line blocks and a second shift register, each of the data line blocks comprising multiple driving transistors each of which drain and source are connected between a data input terminal and the data line and gate is commonly connected to a block selection terminal, the second shift register comprising multiple stages connected one after another to each other, the multiple stages having a first stage in which a data block selection start signal is coupled to an input terminal, for sequentially selecting the multiple data line blocks using an output signal of each stage.

The LCD further comprises a flexible PCB on which an integral control and data driving chip is mounted, for providing the input terminals of the gate and data driving circuits with a control signal and a data signal.

The first and second shift registers employ the shift register for accomplishing the first object of the present.

It is desirable that a duty period of the first and second clock signals applied to the first shift register is greater than a period of a duty period of the first and second clock signals applied to the second shift register multiplied by a number of the data line blocks.

The transparent substrate is connected to the flexible PCB through an external connection terminal. The external connection terminal has; five terminals connected to the data driving circuit of a first clock signal input terminal, second clock signal input terminal, scan start signal input terminal, first power voltage input terminal and second power voltage input terminal; and three control terminals of first clock signal input terminal, second clock signal input terminal and block selection start signal input terminal; and multiple data input terminals all of which are connected to the data driving circuit.

To accomplish the fourth object of the present invention, there is provided a method for driving gate lines in the above LCD. In the above method, a capacitor is charged using an input signal to pull-up a gate line connected to the output terminal during a one-duty period of the clock signals. The pull-up state is maintained using the output signal of the output terminal. The pulling-down of the gate line and discharge of the capacitor are started in response to a rear edge of the output signal. The gate line is completely pulled-down in response to an output signal of a next stage. The pull-down state is maintained using a second power voltage that is always provided to the input node of the pull-down means.

Also, there is provided a method for driving gate lines in the above LCD. The method drives the multiple gate lines using the shift register having the multiple stages in response to the start signal.

In the above method, odd gate lines are driven by sampling a first clock signal using odd stages of the shift register for odd gate lines and driving the odd gate lines during an one-duty period of the sampled first clock signal and even gate lines are driven by sampling a second clock signal having an opposite phase to the first clock signal using even stages of the shift register for even gate lines and driving the even gate lines during an 1 duty period of the sampled second clock signal. Also, the sampling of each stage is initiated in response to an output signal of a previous stage and is ended in response to an output signal of a next stage.

To accomplish the fifth object of the present invention, there is provided a method for block-driving data lines in the above LCD. In the above method, a capacitor is charged using an input signal to enable a data line block connected to the output terminal during an 1 duty period of the clock signals. The enable state is maintained using the output signal of the output terminal. It is started to disable the data line block and discharge the capacitor in response to a rear edge of the output signal. The data line block is completely disabled in response to an output signal of a next stage. The disable state is maintained using a second power voltage that is provided to the input node of the pull-down means.

Also, there is provided a method for block-driving data lines in the above LCD. In the above method, the multiple gate lines are sequentially driven using the shift register having the multiple stages in response to the block selection start signal, in which odd gate lines are driven by sequentially sampling a first clock signal using odd stages of the shift register and driving the odd gate line blocks during an 1 duty period of the sampled first clock signal and even gate lines are driven by sampling a second clock signal having an opposite phase to the first clock signal and driving the even data line blocks during an 1 duty period of the sampled second clock signal, in which the sampling of each stage is initiated in response to an output signal of a previous stage and is ended in response to an output signal of a next stage.

BRIEF DESCRIPTION OF THE DRAWINGS

The above objects and other advantages of the present invention will become more apparently by describing in detail the preferred embodiments thereof with reference to the accompanying drawings, in which:

FIGS. 24A and 24B are simulation results of gate output waveforms of when an output GOUT of a next stage is used as an input of CT and of when a CT1 siganl of a stage after the next stage is used as an input of CT;

DETAILED DESCRIPTION OF THE PREFERRED EMBODIMENTS

Figure 1:
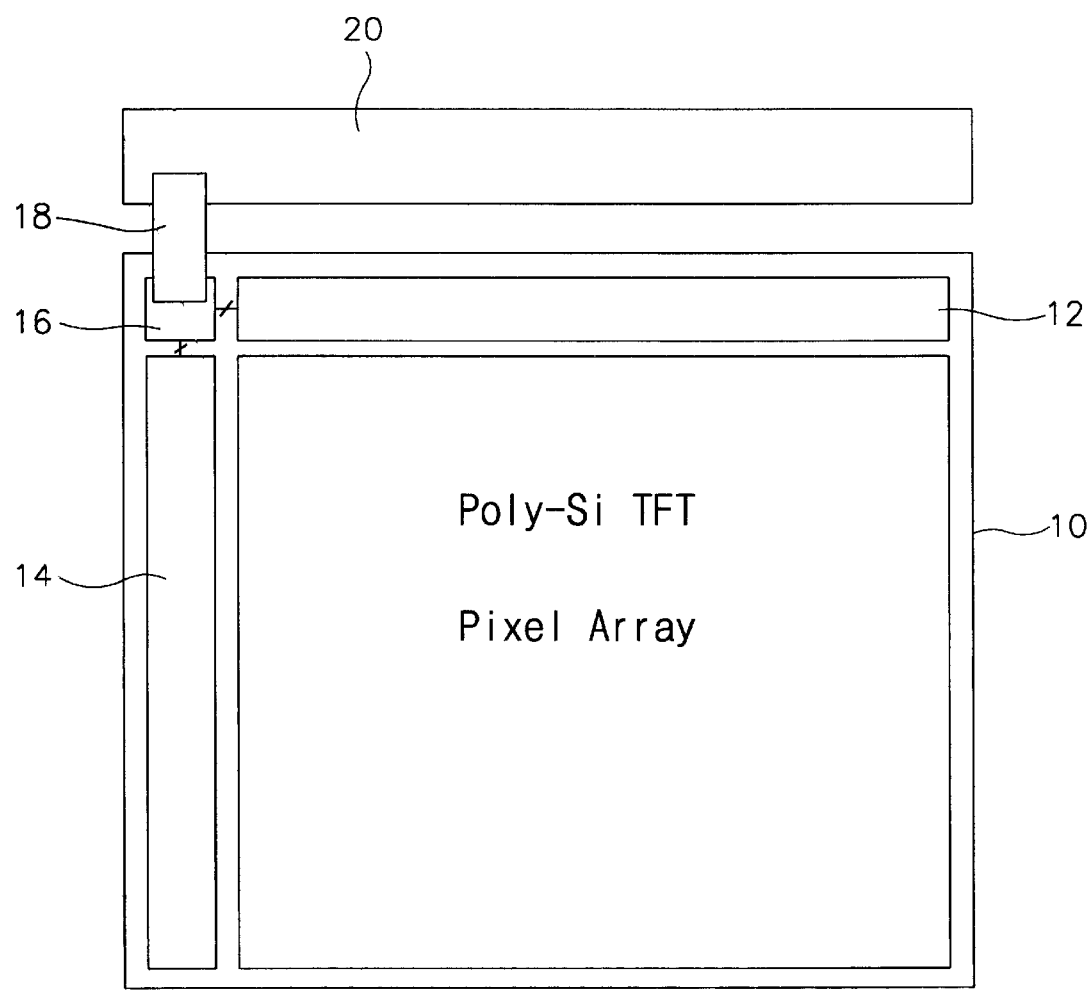
FIG. 1 is a simplified schematic view showing a TFT substrate in a poly-TFT LCD in accordance with the conventional art
Figure 2:
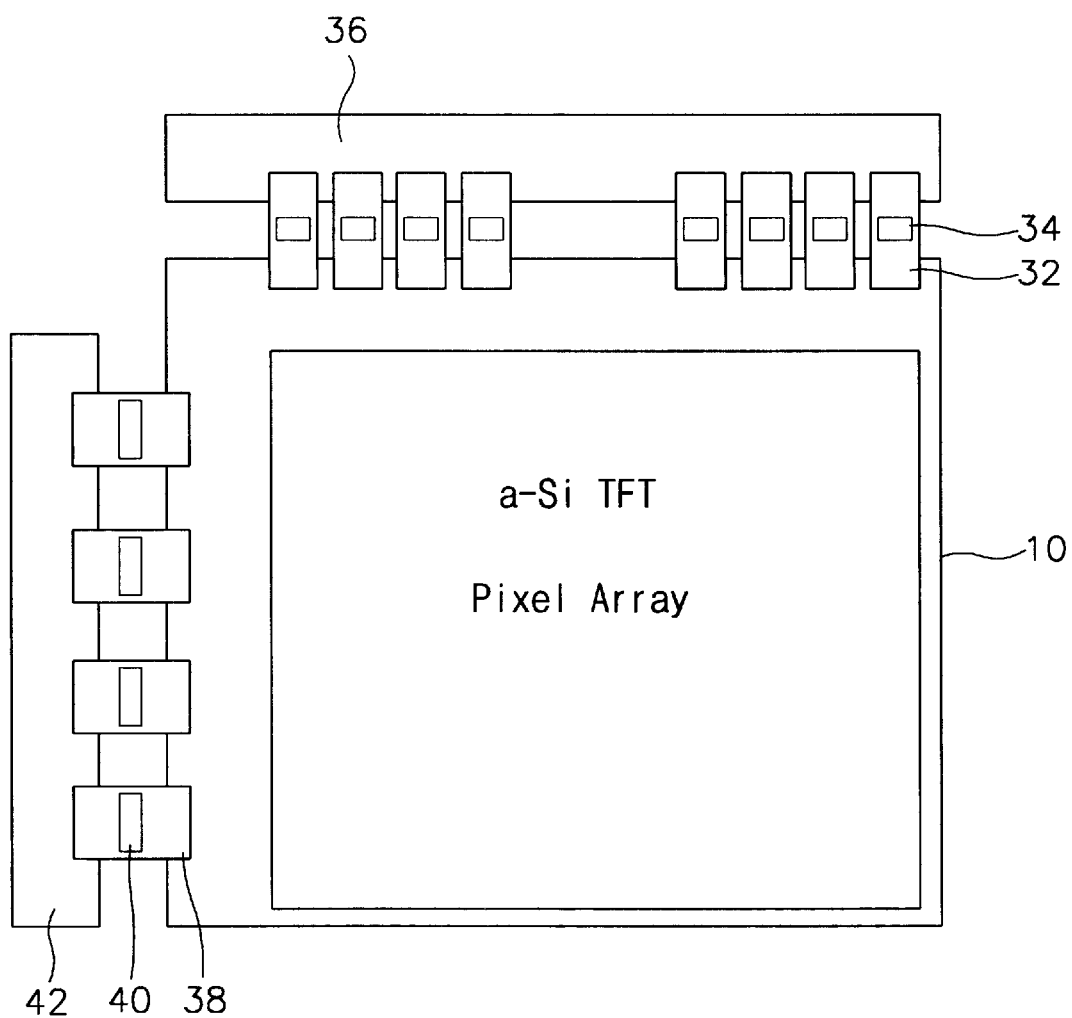
FIG. 2 is a simplified schematic view showing a TFT substrate in an amorphous-TFT LCD in accordance with the conventional art.
Figure 3:
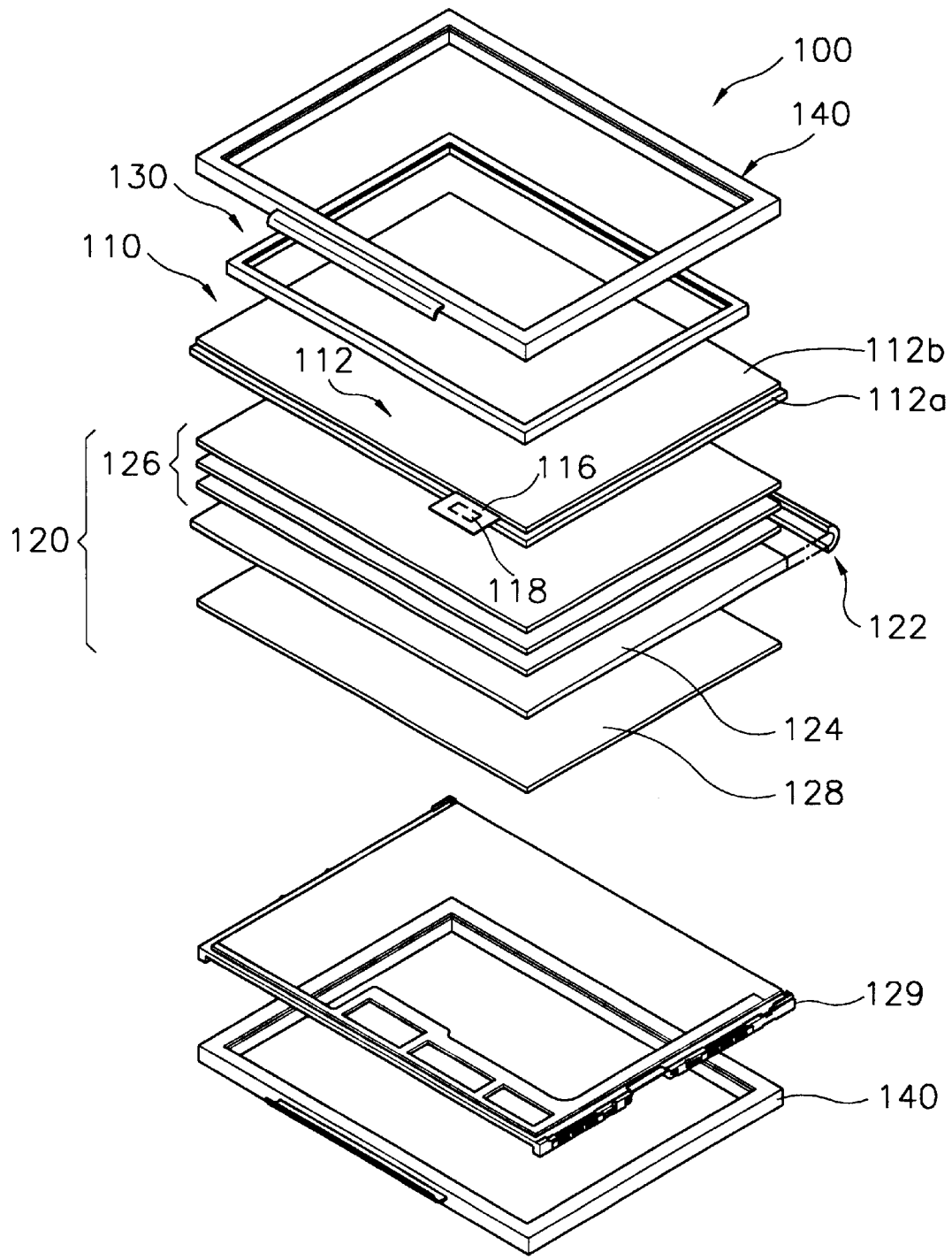
FIG. 3 is a disassembled perspective view of an amorphous-Si TFT LCD in accordance with a preferred embodiment of the present invention.

Reference will now be made in detail to the preferred embodiments of the present invention, examples of which are illustrated in the accompanying drawings. Hereinafter, preferred embodiments are described with reference to the accompanying drawings. FIG. 3 is a disassembled perspective view of an a-si TFT LCD in accordance with the present invention.

Referring to FIG. 3, an LCD 100 includes an LCD panel assembly 110, a backlight assembly 120, a chassis 130 and a cover 140.

The LCD assembly 110 includes an LCD panel 112, a flexible PCB 116 and an integral control and data driving chip 118. The LCD panel 112 includes a TFT substrate 112a and a color filter substrate 112b. On the TFT substrate 112a, there are disposed a display cell array circuit, a data driving circuit, a gate driving circuit and an external connection terminal. The TFT substrate 112a faces with the color filter substrate 112b. Liquid crystal is injected between the TFT substrate 112a and the color filter substrate 112b, and an injection inlet of liquid crystal is then sealed.

The integral control and data driving chip 118 mounted on the flexible PCB 116 is connected with circuits formed on the TFT substrate 112a through the flexible PCB 116. The flexible PCB 116 provides the data driving circuit and the gate driving circuit of the TFT substrate 112a with data signals, data timing signals, gate timing signals and gate driving voltages.

The backlight assembly 120 includes a lamp assembly 122, a light guiding plate 124, a series of optical sheets 126, a reflector plate 128 and a mold frame 129.

Figure 4:
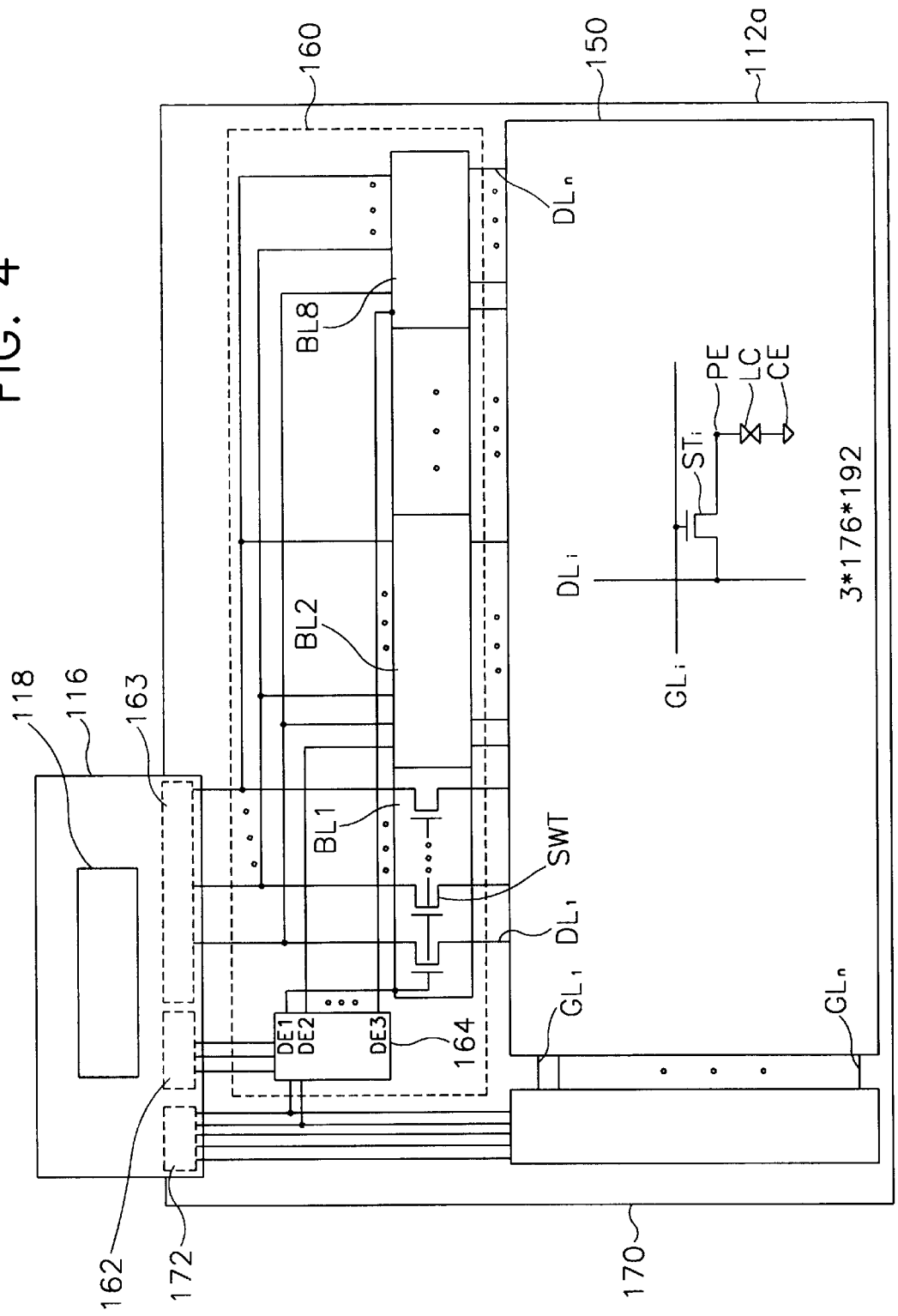
FIG. 4 is a schematic view showing the TFT substrate in an amorphous-Si TFT LCD in accordance with a preferred embodiment of the present invention.

Referring to FIG. 4, on the TFT substrate 112a of the present invention, there are arranged a display cell array circuit 150, a data driving circuit 160, a gate driving circuit 170, an external connection terminal 162 and 163 for the data driving circuit 170, which are formed during the formation of TFTs.

The display cell array circuit 150 includes an m-number of data lines DL1–DLm extended along the column direction and an n-number of gate lines GL1–GLn extended along the row direction.

In one embodiment of the present embodiment, there is provided an example of 2 inches-LCD panel having a resolution of 525(176×3)×192 corresponding to numbers of the gate lines and data lines.

Switching transistors ST are formed at the cross points of the data lines and the data lines. Switching transistor STi has a drain connected to a data line DLi and a gate connected to a gate line GLi. Source of the switching transistor STi is connected to a transparent pixel electrode PE. Liquid crystal LC is arranged between the transparent pixel electrode PE and a transparent common electrode CE.

Thus, a voltage applied between the transparent pixel electrode PE and the transparent common electrode CE controls the alignment of liquid crystal molecules, thus light amount passing through the liquid crystal molecules is controlled and thereby gray scales for respective pixels are displayed.

The data driving circuit 160 includes a shift register 164 and 568 switching transistors SWT. The 528 switching transistors SWT form eight data line blocks BL1–BL8 per sixty-six switching transistors.

In any data line block BLi, sixty-six input terminals are commonly connected to an external input terminal 163 consisting of sixty-six data input terminals and sixty-six output terminals are connected to the corresponding sixty-six data lines. Also, a block selection terminal is connected to a corresponding one output terminal of eight output terminals of the shift register 164.

The 528 switching transistors SWT is made of a-Si TFT MOS transistor of which source is connected to corresponding data line, drain is connected to a corresponding input terminal among 66 number of data input terminals, and gate is connected to block selection terminal.

Accordingly, 528 data lines are divided into eight blocks each having sixty-six data lines and the eight blocks are each selected sequentially by eight block selection signals.

The shift register 164 receives a first clock signal ("CKH"), a second clock signal ("CKHB") and a block selection start signal ("STH"). The output terminals of the shift register 164 are connected to the block selection terminals of corresponding lines blocks.

Figure 5:
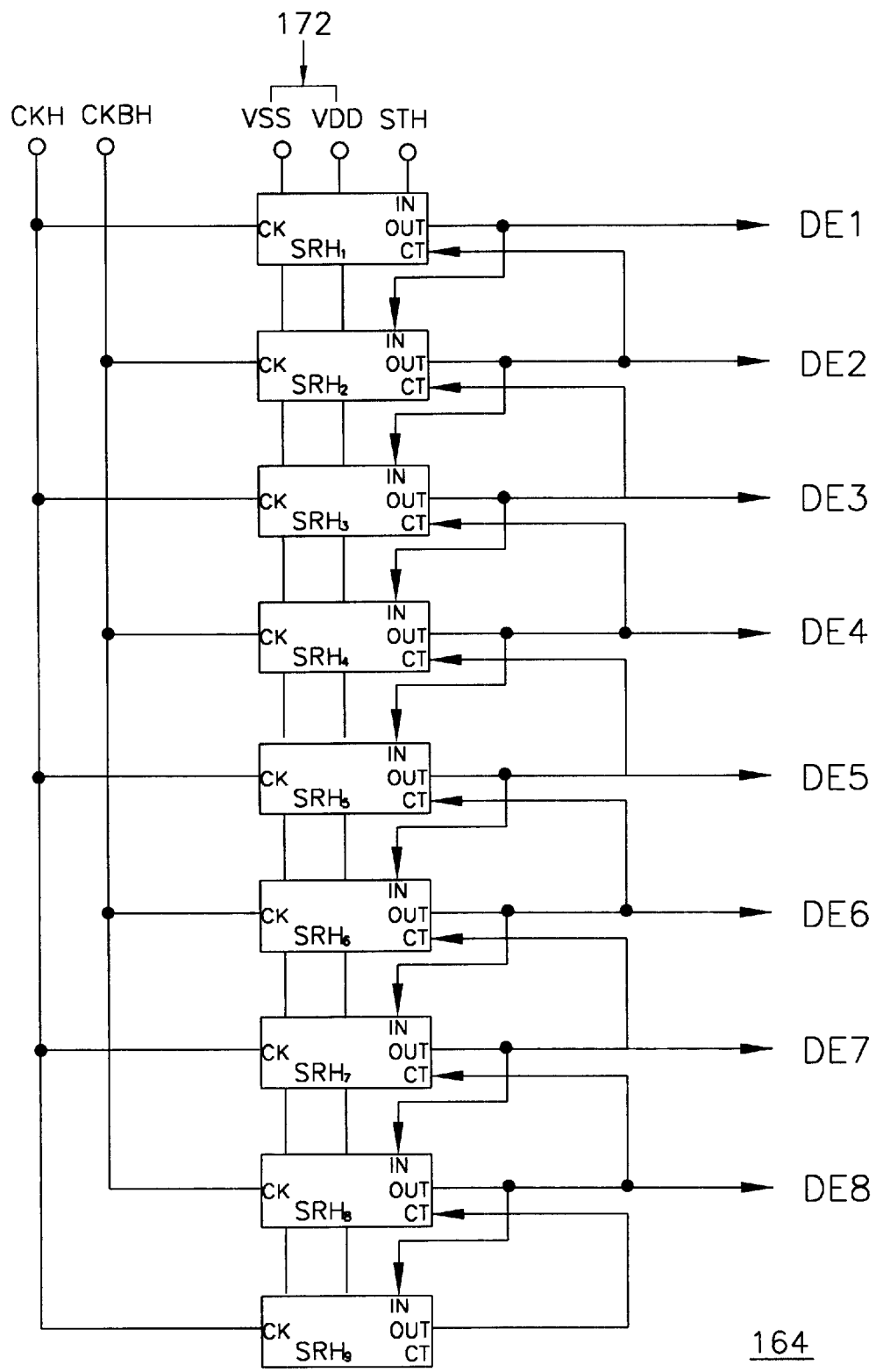
FIG. 5 is a block diagram of a shift register in the data driving circuit of FIG. 4.

Referring to FIG. 5, the shift register 164 includes nine stages SRH1 to SRH9 subordinated to one after another. In other words, the output terminal "OUT" of each stage is connected to the input terminal "IN" of the next stage. The nine stages have eight stages SRH1 to SRH8 corresponding to data line blocks and one dummy stage SRH9. Each stage has input terminal IN, output terminal OUT, control terminal "CT", clock signal input terminal "CK", first power voltage terminal "VSS" and second power voltage terminal "VDD". The eight stages SRH1 to SRH8 provide the block selection terminals of respective data line blocks BL1 to BL8 with the block selection start signals DE1 to DE8, respectively. The block selection start signals are the enable signals for respective line blocks.

Odd stages SRH1, SRH3, SRH5, SRH7, SrH9 receive the first clock signal "CKH" and even stages SRC2, SRC4, SRH6, SRH8 receive the second clock signal. The first clock signal CKH and the second clock signal CKHB have a phase opposite to each other. Duty periods of the first and second clock signals CKH and CKHB are set to be less than 1/66 ms.

The output signal of the next stage to a present stage is input to the control terminal CT of the present stage as a control signal. In other words, the control signal that is input to the control terminal CT is delayed by the duty period of the output signal itself.

Thus, since the output signals of respective stages are sequentially generated with active period of a high state, data line blocks corresponding to active periods of respective output signals are selected and become enable.

Dummy stage SRH9 is used for providing the control terminal CT of the previous stage SRH8 with a control signal.

Figure 6:
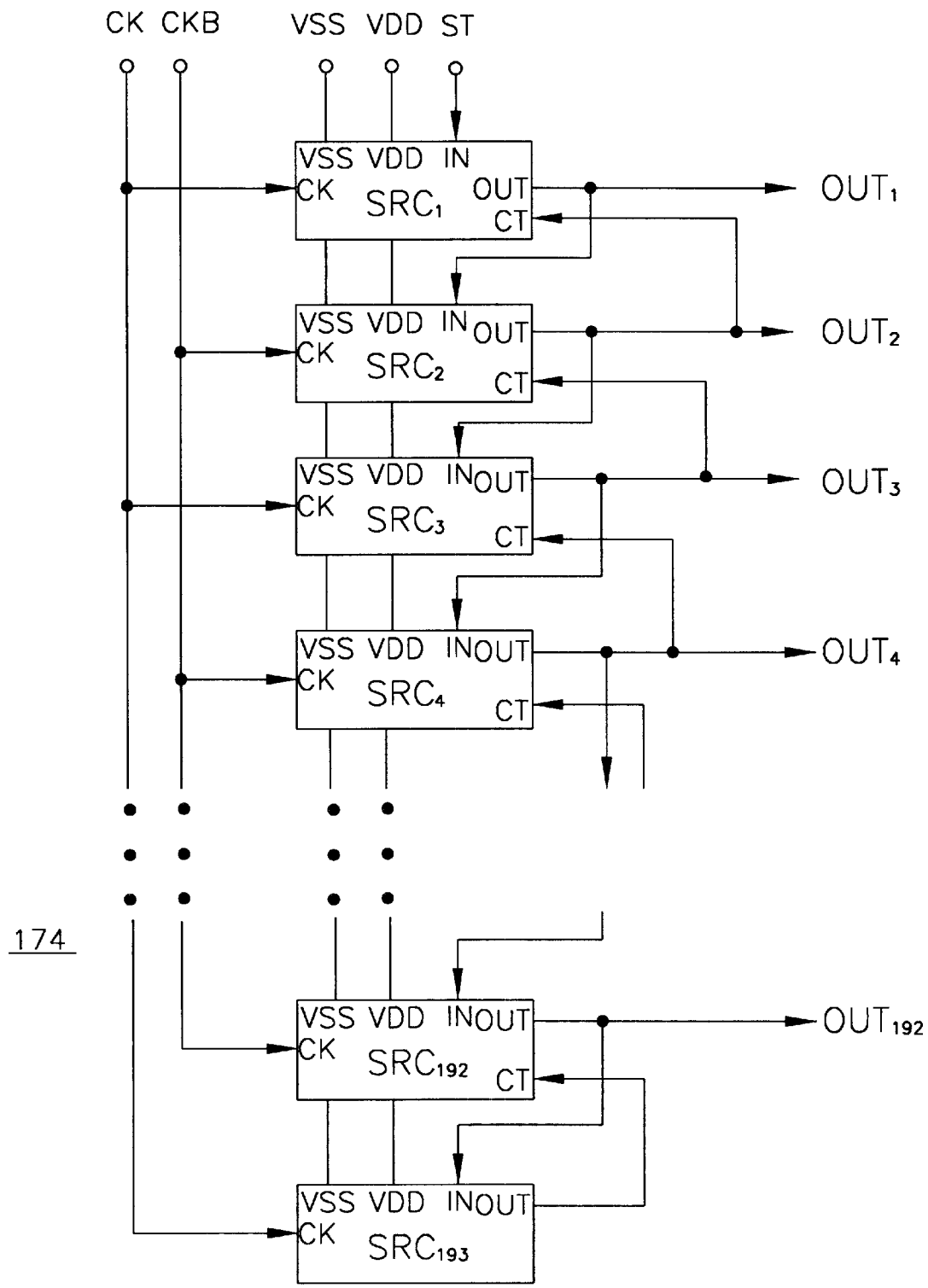
FIG. 6 is a block diagram of a shift register in the gate driving circuit of FIG. 4.

Referring to FIG. 6, the gate driving circuit 170 has a single shift register. The shift register 170 of FIG. 6 includes multiple stages SRC1 to SRC4 subordinated to one after another. In other words, the output terminal "OUT" of each stage is connected to the input terminal IN of the next stage. The stages consist of 192 stages SRC1 to SRC192 corresponding to gate lines and one dummy stage SRC193. Each stage has input terminal IN, output terminal OUT, control terminal CT, clock signal input terminal CK, first power voltage terminal VSS and second power voltage terminal VDD.

Figure 7:
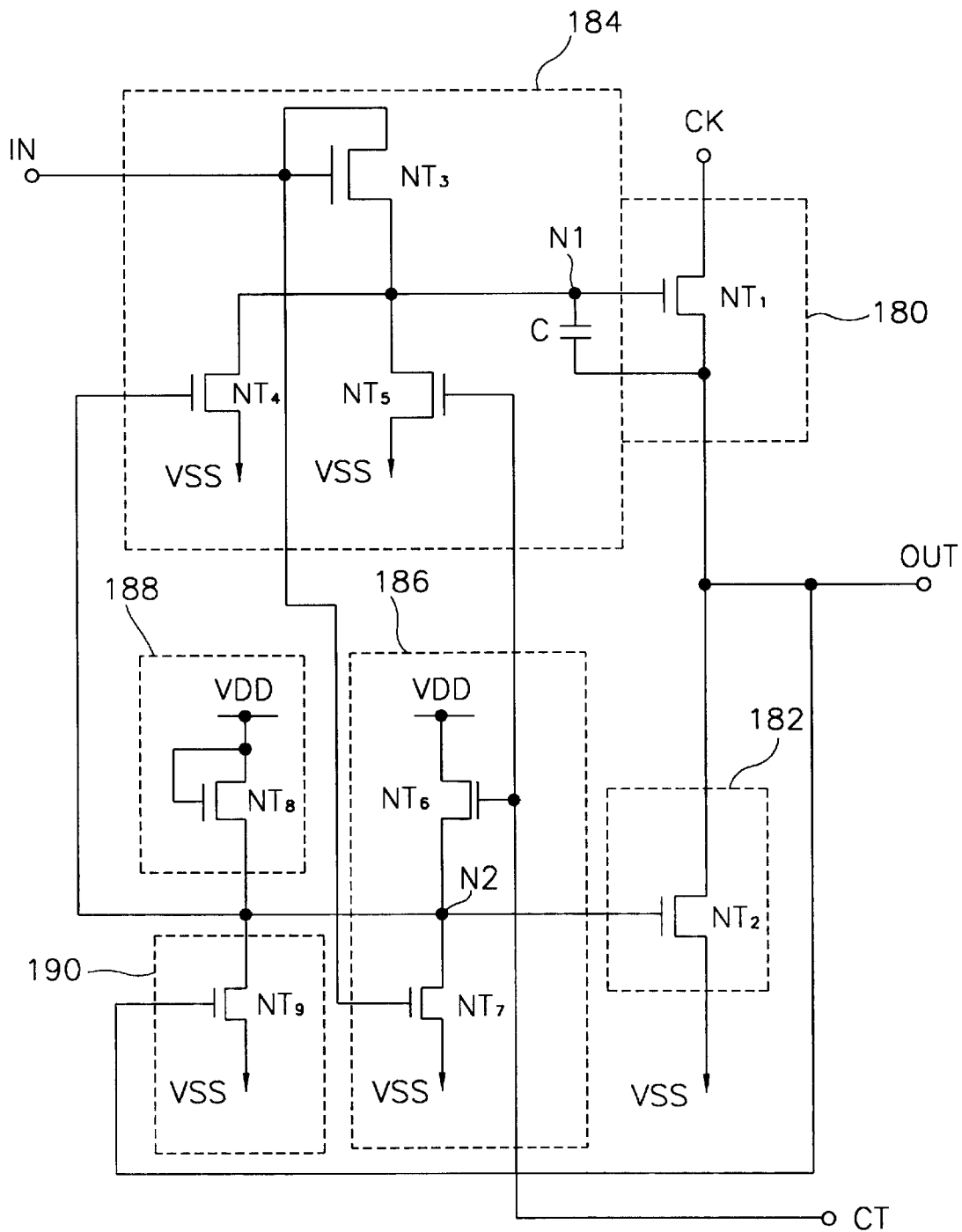
FIG. 7 is a detailed circuit diagram of each stage in the shift registers of FIGS. 5 and 6.

To the input terminal "IN" of the first stage is input a start signal "ST" as shown in FIG. 7. Here, the start signal is a pulse signal synchronized with a vertical synchronous signal.

Output terminals OUT1 to OUT192 of respective stages are connected to respective corresponding gate lines. To odd stages SRC1 and SRC3 is supplied the first clock signal CK and to even stages SRC2 and SRC4 is supplied the second clock signal CKB. The first clock signal CK has an opposite phase to the second clock signal CKB. The first and second clock signals CK and CKB have a duty period of 16.6/192 ms.

Thus, compared with the duty period of the clock signal of the shift register 164 for the data driving circuit, the duty period of the clock signal of the shift register 170 for the gate driving circuit is 8 times and more.

The output signals OUT2, OUT3 and OUT4 of the next stages SRC2, SRC3 and SRC4 to present stages SRC1, SRC2 and SRC3 are input to the control terminal CT of the present stages SRC1, SRC2 and SRC3 as a control signal. In other words, the control signal that is input to the control terminal CT is delayed by the duty period of the output signal itself.

Thus, since the output signals of respective stages are sequentially generated with active period of a high state, horizontal lines corresponding to active periods of respective output signals are selected.

Embodiment 1

Hereinafter, there is described a concrete circuit constitution of each stage of the shift registers in the aforementioned data driving circuit and gate driving circuit with reference to FIG. 7.

Referring to FIG. 7, each stage of the shift registers 164 and 170 includes a pull-up section 180, a pull-down section 182, a pull-up driving section 184, a pull-down driving section 186, a floating preventing section 188 and a turn-on preventing section 190.

The pull-up section 180 includes a pull-up NMOS transistor NT1 of which drain is connected to a clock signal input terminal CK, gate is connected to a first node N1 and source is connected to an output terminal OUT.

The pull-down section 182 includes a pull-down NMOS transistor NT2 of which drain is connected to an output terminal OUT, gate is connected to a second node N2 and source is connected to a first power voltage VSS.

The pull-up driving section 184 includes a capacitor C and an NMOS transistor NT3 to NT5. The capacitor C is connected between the first node N1 and the output terminal OUT. Transistor NT3 has a drain and gate commonly connected to the input terminal IN and a source connected to the first node "N1". Transistor NT4 has a drain connected to the first node N1, a gate connected to the second node "N2: and a source connected to the first power voltage VSS. Transistor NT5 has a drain connected to the first node N1, a gate connected to the control terminal "CT" and a source connected to the first power voltage VSS.

The pull-down driving section 186 includes two NMOS transistors NT6 and NT7. Transistor NT6 has a drain connected to the second power voltage VDD, a gate connected to the control terminal CT and a source connected to the second node "N2". Transistor NT7 has a drain connected to the second node "N2", a gate connected to the input terminal "IN" and a source connected to the first power voltage VSS.

The floating preventing section 188 includes an NMOS transistor NT8 of which drain and gate are commonly connected to the second power voltage VDD and a source is connected to the second node N2. Transistor NT8 has a size smaller sufficiently than transistor NT7, for example, has a size ratio of 1:20.

The turn-on preventing section 190 includes an NMOS transistor NT9 of which drain is connected to the second node N2, gate is connected to the output terminal OUT and source is connected to the first power voltage VSS. Transistor NT9 has a size ratio of 1:2 to transistor NT7.

Figure 8:
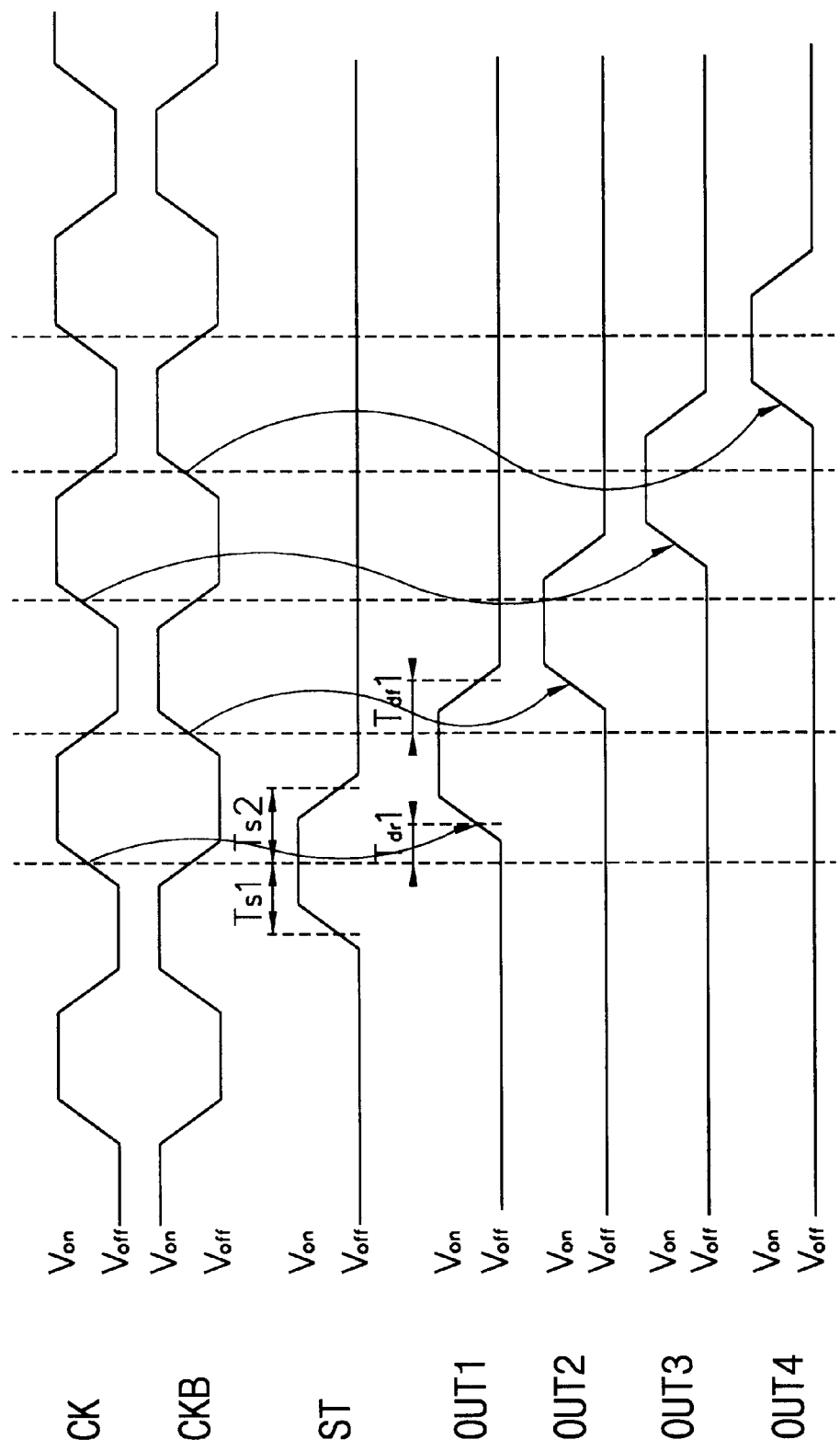
FIG. 8 is a timing diagram of respective elements of FIG. 7.

As shown in FIG. 8, as first and second clock signals CK and CKB and scan start signal ST are supplied to the shift register 170, the first stage SRC1 delays a high level period of the first clock signal CK in response to the front edge of the scan start signal ST for a predetermined time of Tdr1 to thereby output a delayed output signal OUT1.

The active period of the scan start signal ST has a phase faster by 1/4 than the high level period of the first clock signal CK. The active period of the scan start signal ST is divided into a set up time Ts1 from a front edge of a pulse, i.e., a rising edge and a hold time Ts2 to a rear edge of a pulse, i.e., a falling edge.

Accordingly, the front edge of the output signal OUT1 has a front edge, i.e., rising edge delayed by a certain time of approximately 2–4 $\mu$s from the start point of the hold time Ts2. In other words, active period of the first clock signal CK, i.e., high level period is delay-output by a time of Tdr1 to the output terminal OUT.

This delay characteristic is due to the fact that the capacitor C of the pull-up driving section 184 starts to be charged through the transistor NT3 in a state where the transistor NT4 is turned off at the front edge of the start signal ST and the pull-up transistor NT1 is turned on after the charged voltage of the capacitor C becomes higher than a threshold voltage between the gate and the source of the pull-up transistor NT1, whereby the high level period of the first clock signal CK is generated at the output terminal.

As the high level period of clock signal is generated at the output terminal OUT, this output voltage is bootstrapped at the capacitor C and thereby the gate voltage of the pull-up transistor NT1 rises over the turn-on voltage VDD. Accordingly, the pull-up transistor NT1 of NMOS transistor maintains a full turn-on state.

Meanwhile, in the pull-down driving section 186, since the transistor NT7 is turned on at the front edge of the start signal ST in a state where the transistor NT6 is turned off, a potential of the second node N2 is dropped to the first power voltage VSS. At this time, the transistor NT8 of the floating preventing section 188 maintains the turn on a state while since a size of the turn on transistor NT7 is larger 20 times than the transistor NT8, the second node N2 is voltage-dropped to the first power voltage VSS from the second power voltage VDD. Therefore, the pull-down transistor NT2 is transferred from the turn-on state to the turn-off state.

When the turn-on voltage (VON=VDD) is output from the output terminal OUT, the transistor NT9 of the turn on the preventing section 190 is turned on, so that a capability for driving the second node N2 using the first power voltage VSS increases approximately 50%. Thus, rising of the second node voltage can be prevented by a parasitic capacitance between drain and source of the pull-down transistor upon the rising transition of the output signal. As a result, an error operation of the pull-down transistor in which the pull-down transistor is turned on upon the rising transition of the output signal may be prevented. At this time, the output signal OUT1 of the output terminal OUT is delay-generated by the duty period of the first clock signal CK.

As a voltage of the output signal of the output terminal OUT is dropped to the turn off voltage state VOFF=VSS, the transistor NT9 is turned off and only the second power voltage VDD is supplied to the second node N2 through the transistor NT8. So, a potential of the second node N2 starts to rise from the first power voltage VSS to the second power voltage VDD. As the potential of the second node N2 rises, the transistor NT4 is turned on and thus a charge voltage of the capacitor is discharged through the transistor NT4. As a result, the pull-up transistor NT1 starts to be turned off.

Continuously, since an output signal of the next stage that is supplied to the control terminal CT rises to the turn-on voltage, the transistors NT5 and NT6 are turned on. Thus, a potential of the second node N2 starts to rise rapidly to the second power voltage VDD that is supplied by the transistors NT6 and NT8 and a potential of the first node N1 is rapidly dropped to the first power voltage VSS through the transistors NT4 and NT5.

Thus, the pull-up transistor NT1 is turned off and the pull-down transistor NT2 is turned on, so that a voltage of the output terminal OUT is dropped from the turn on voltage VON to the turn off voltage VOFF of the second power voltage VDD.

Although an output signal level of the next stage that is applied to the control terminal CT is dropped to a low level and thereby the transistor NT6 is turned off, the second node N2 maintains the second voltage VDD-biased state through the transistor NT8 and the first node N1 maintains the first power voltage VSS-biased state through the transistor NT4 maintaining the turn on state. Thus, although a threshold voltage of the transistors NT2 and NT4 due to the long term use rises, since a potential of the second node N2 is maintained at the second power voltage VDD, a stable operation can be secured without an error operation such as the pull-down transistor NT2 being turned off.

Figure 9:
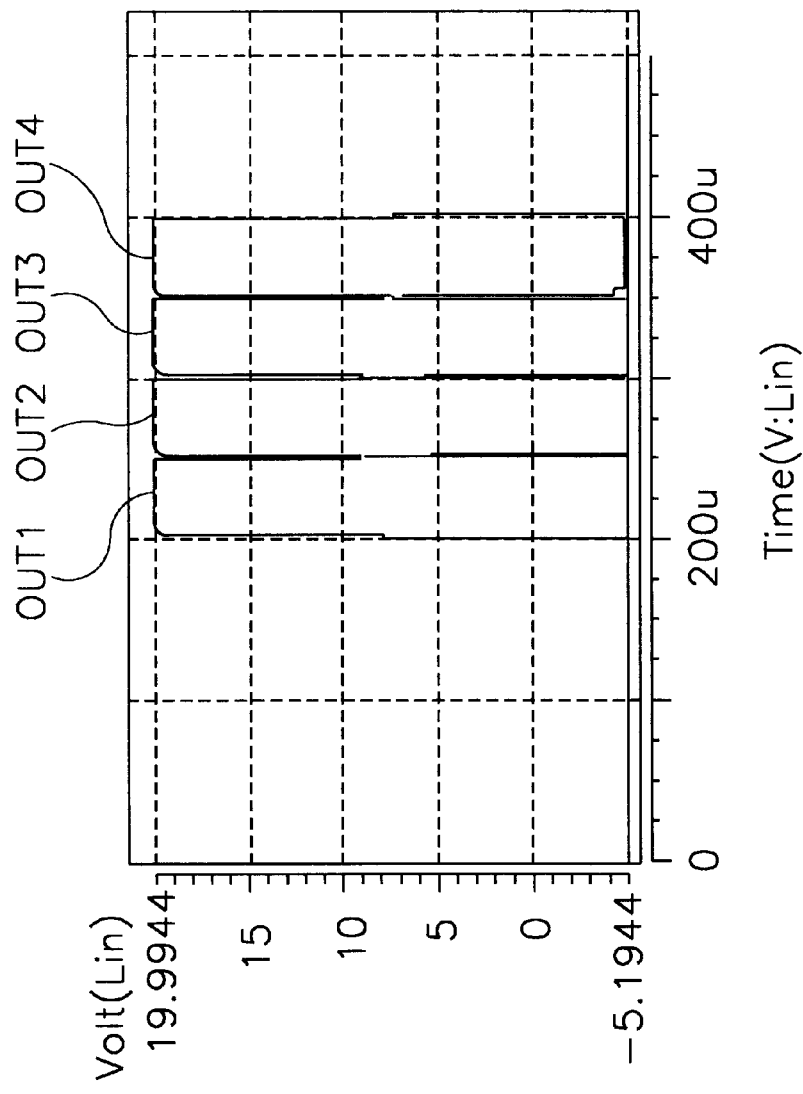
FIG. 9 is an output waveform simulated at each stage of FIG. 7.

Respective stages SRC1–SRC4 are operated in the same manner with the aforementioned method and thus output signals OUT1 to OUT4 are sequentially and stably generated as shown in FIG. 9.

Figure 10:
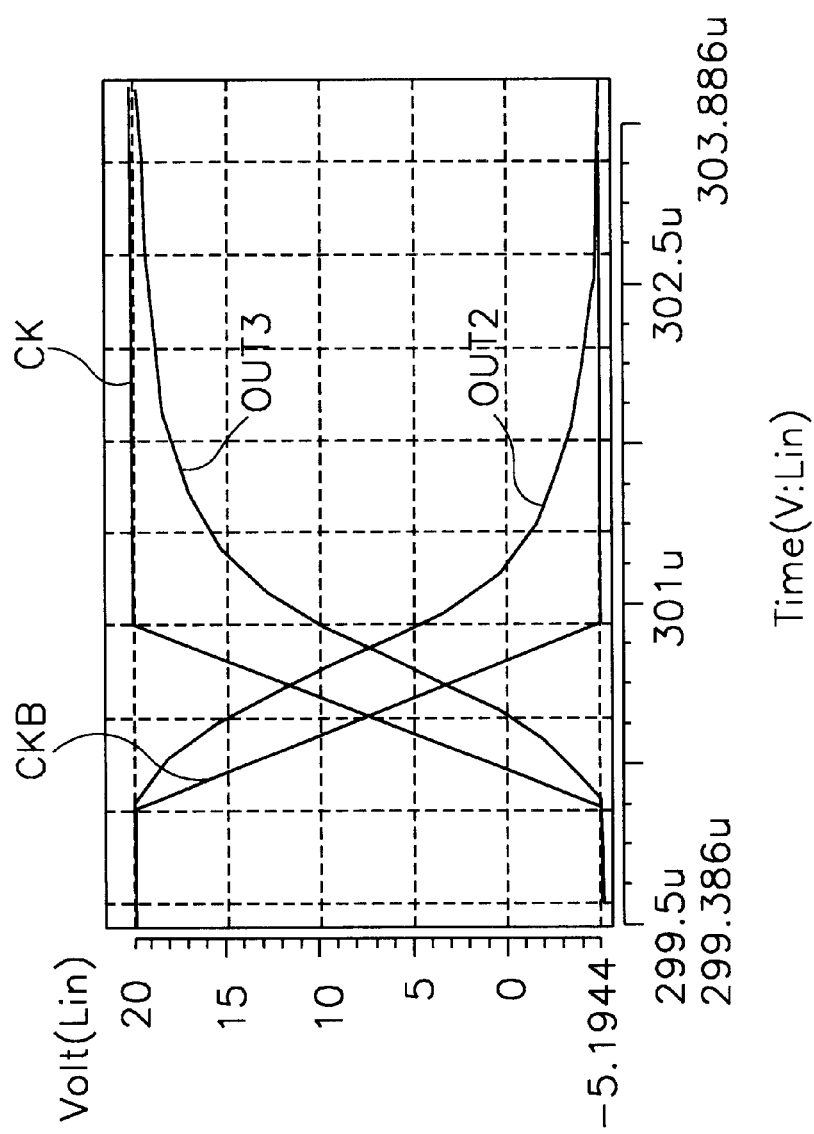
FIG. 10 is a simulated waveform of a delay characteristic for the clock signal of the output signals in FIG. 7.

FIG. 10 shows a simulation result of when a gate line load 30 pF for a 2 inches panel is connected to the aforementioned shift register of the present invention. As shown in FIG. 10, the result shows that output signals OUT2 and OUT 3 were delayed with respect to the clock signals CK and CKB, respectively. A rising time and a falling time of the output signals were approximately 1.5 $\mu$s, a delay rising time Tdr and a delay falling time Tdf of from the clock signal were approximately 0.3 $\mu$s.

Figure 11:
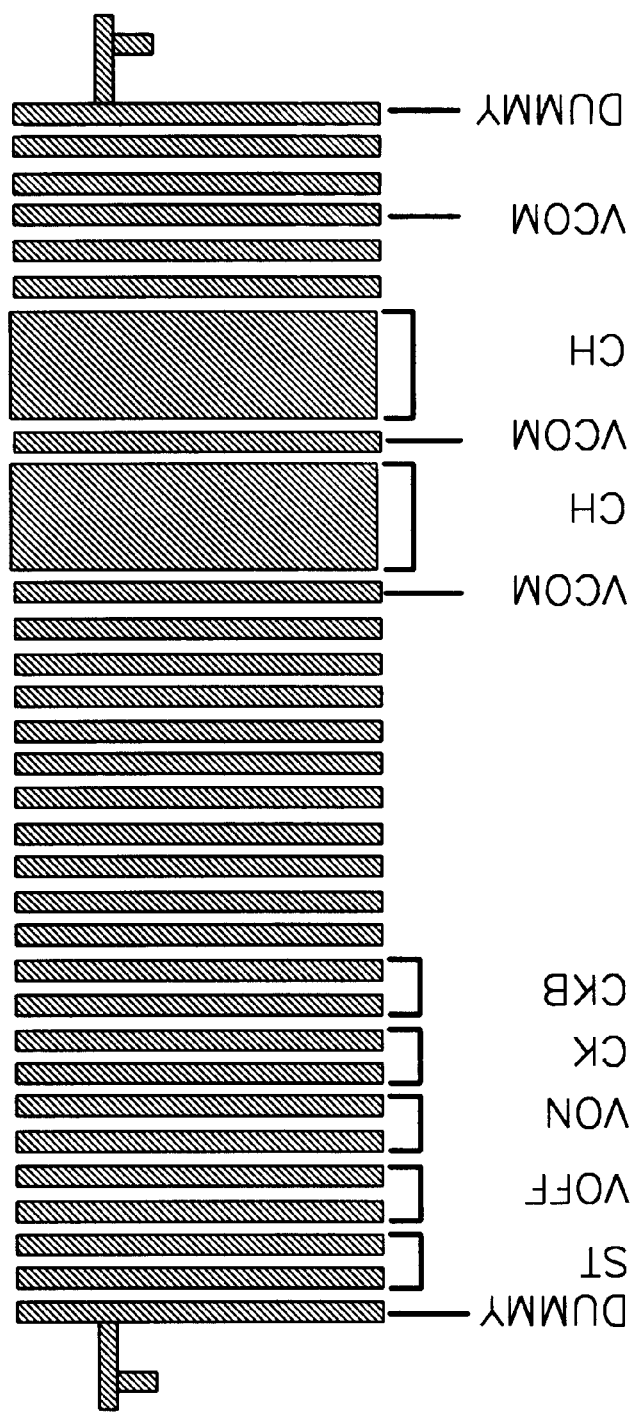
FIG. 11 is a layout of an external connection terminal in the gate driving circuit of the present invention.

FIG. 11 shows a layout of an external connection terminal part that is provided in a shift register of a gate driving circuit integrated on an LCD panel of the present invention. Right side of the layout is a TFT side and left side of the layout is a film cable side. As shown in FIG. 11, the shift register of the present invention needs only five external connection terminals of a start signal (ST) input terminal, a first clock signal input terminal CK, a second clock signal input terminal CKB, a first power voltage terminal VOFF or VSS and a second power voltage terminal VON or VDD. Accordingly, a space occupied by the terminal part 172 on the glass substrate can be decreased.

Figure 12:
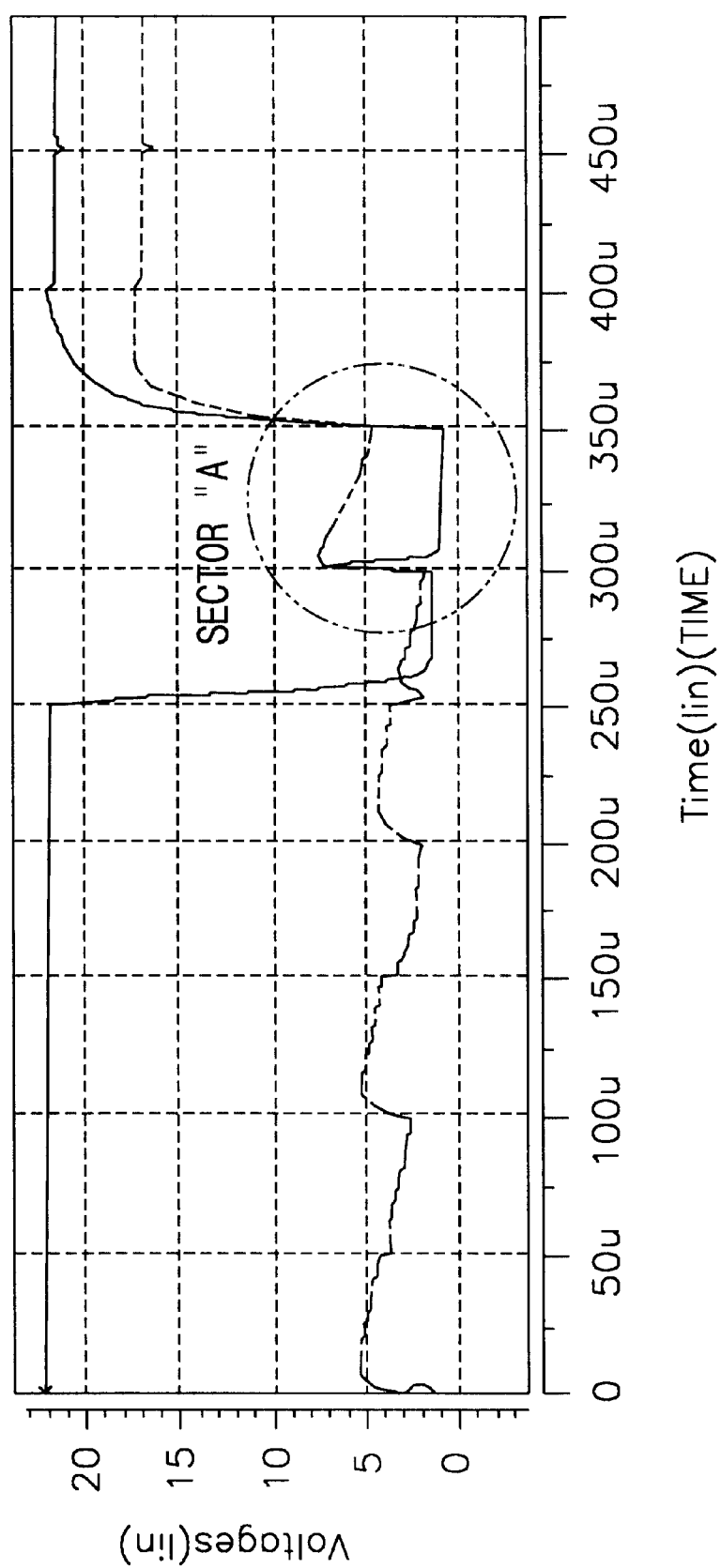
FIGS. 12 through 14 are comparative waveforms comparing the shift register of the present invention with that of the conventional art.
Figure 13:
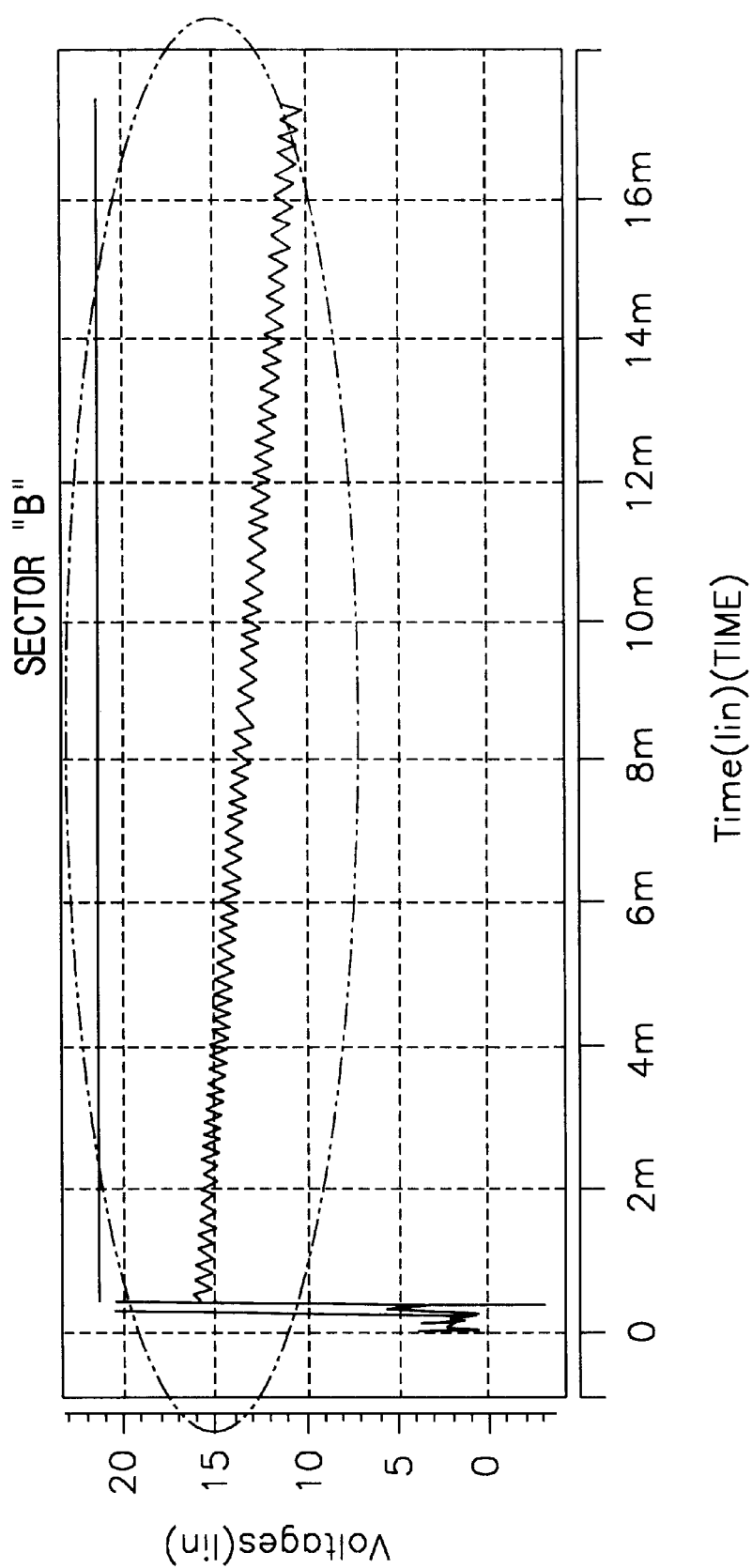
Figure 14:
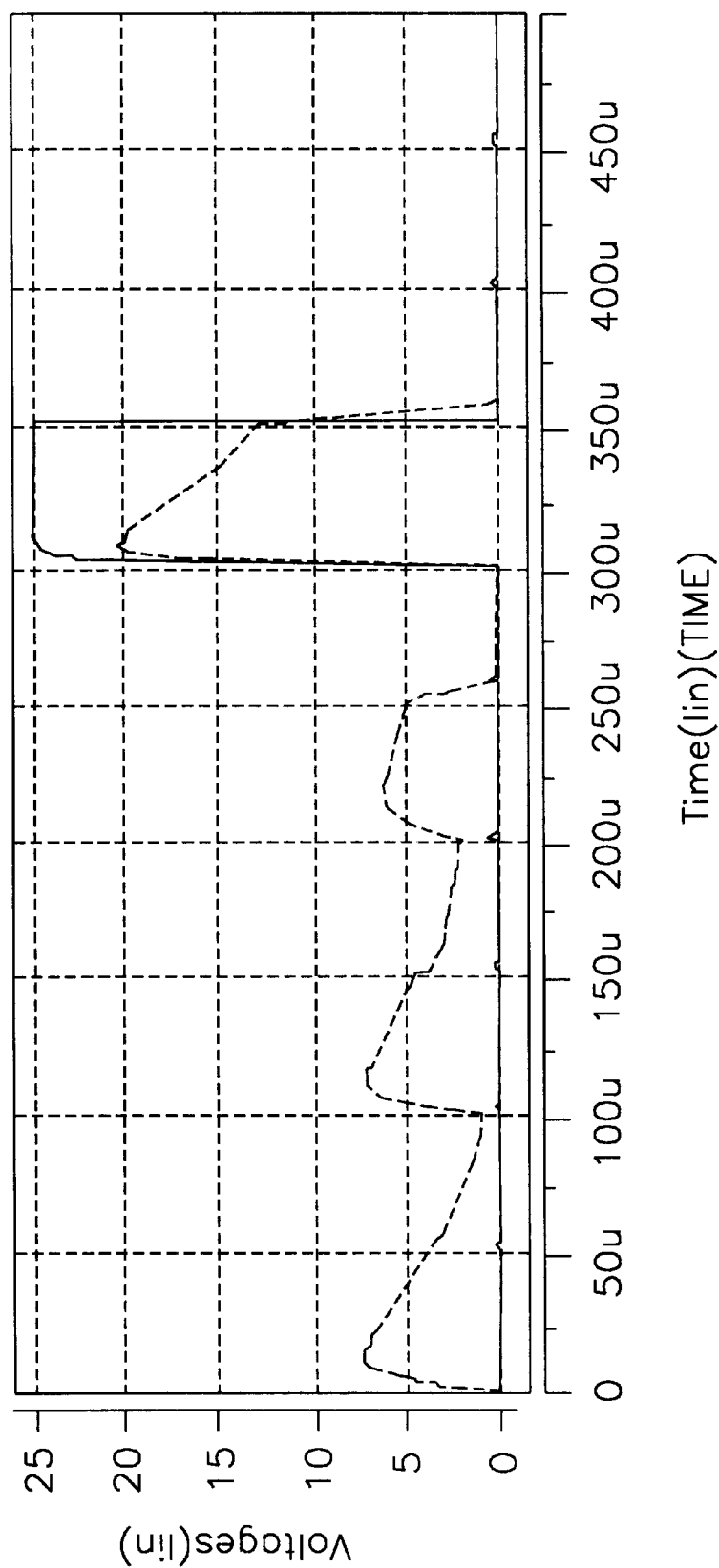

FIGS. 12 to 14 are waveforms comparing an output characteristic of a conventional shift register employing a pull-down control technique using a capacitor with that of a shift register of the present invention.

FIG. 12 is a graph for comparing a voltage waveform of the second node N2. As shown in FIG. 12, the present invention corresponding to the solid line maintains more stable low level state than the conventional art of the dotted line in a sector "A".

FIG. 13 is a graph for comparing a state variation in the high level of the second node N2. The conventional art of the dotted line shows that the level is decreased according to the time elapse while the present invention of the solid line shows that a constant level is maintained regardless of the time elapse. This is because the present invention always maintains a supply state of the power voltage VDD through the floating preventing section.

FIG. 14 is a graph for comparing waveforms of output signals in the output terminals. It is shown that an output signal waveform of the solid line corresponding to the present invention maintains more stable high level state in the active state (that is, high level state) compared with an output signal waveform of the broken line corresponding to the conventional art. It is also known that the present invention maintains a stable low level-biased state in the non-active state (that is, low level state).

Embodiment 2

Figure 15:
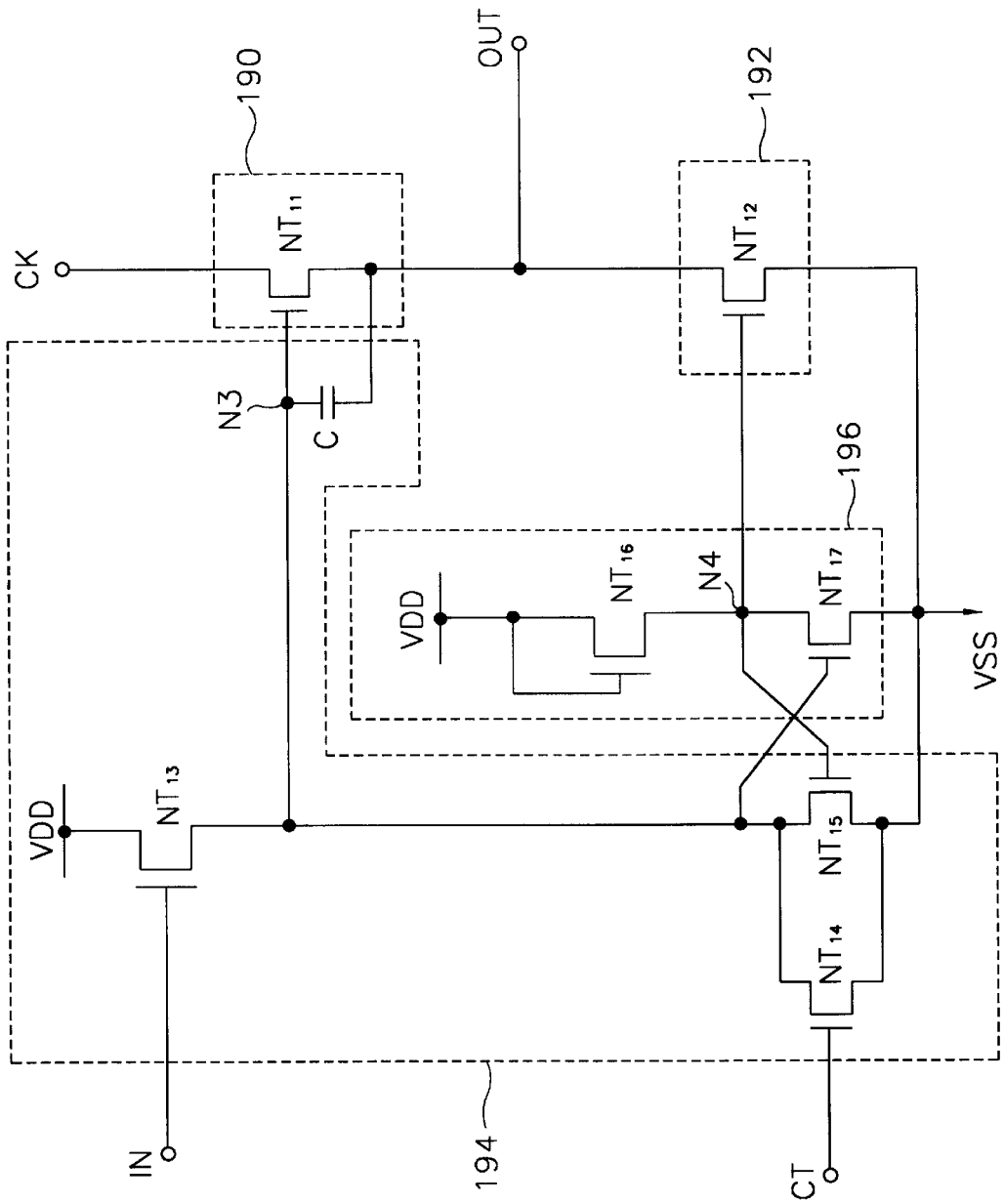
FIG. 15 is a circuit diagram of each stage in the shift register in accordance with a second embodiment of the present invention.

FIG. 15 is a circuit diagram of each stage of the shift registers in the data driving circuit and the gate driving circuit.

Referring to FIG. 15, each stage of the shift registers 164 and 170 includes a pull-up section 190, a pull-down section 192, a pull-up driving section 194 and a pull-down driving section 196.

The pull-up section 190 includes a pull-up NMOS transistor NT11 whose drain is connected with a clock signal input terminal CK, gate is connected with a third node N3 and source is connected with an output terminal OUT.

The pull-down section 192 includes a pull-down NMOS transistor NT12 whose drain is connected with the output terminal OUT, gate is connected with a fourth node N4 and source is connected with a first power voltage VSS.

The pull-up driving section 194 includes a capacitor C and NMOS transistors NT13, NT14 and NT15. The capacitor C is connected between the third node N3 and the output terminal OUT. The transistor NT13 includes drain connected with a second power voltage VDD, gate connected with an input terminal IN and source connected with the third node N3. The transistor NT14 includes drain connected with the third node N3, gate connected with a control terminal CT and source connected with the first power voltage VSS. The transistor NT15 includes drain connected with the third node N3, gate connected with the fourth node N4 and source connected with the first power voltage VSS. Here, the transistor NT13 has a size approximately two times larger than the transistor NT15.

The pull-down driving section 196 includes two NMOS transistors NT16 and NT17. The transistor NT16 includes drain and gate both of which are commonly connected with the second power voltage VDD, and source connected with the fourth node N4. The transistor NT17 includes drain connected with the fourth node N4, gate connected with the third node N3 and source connected with the first power voltage VSS. Here, the transistor NT16 has a size 16 times larger than the transistor NT17.

Figure 16:
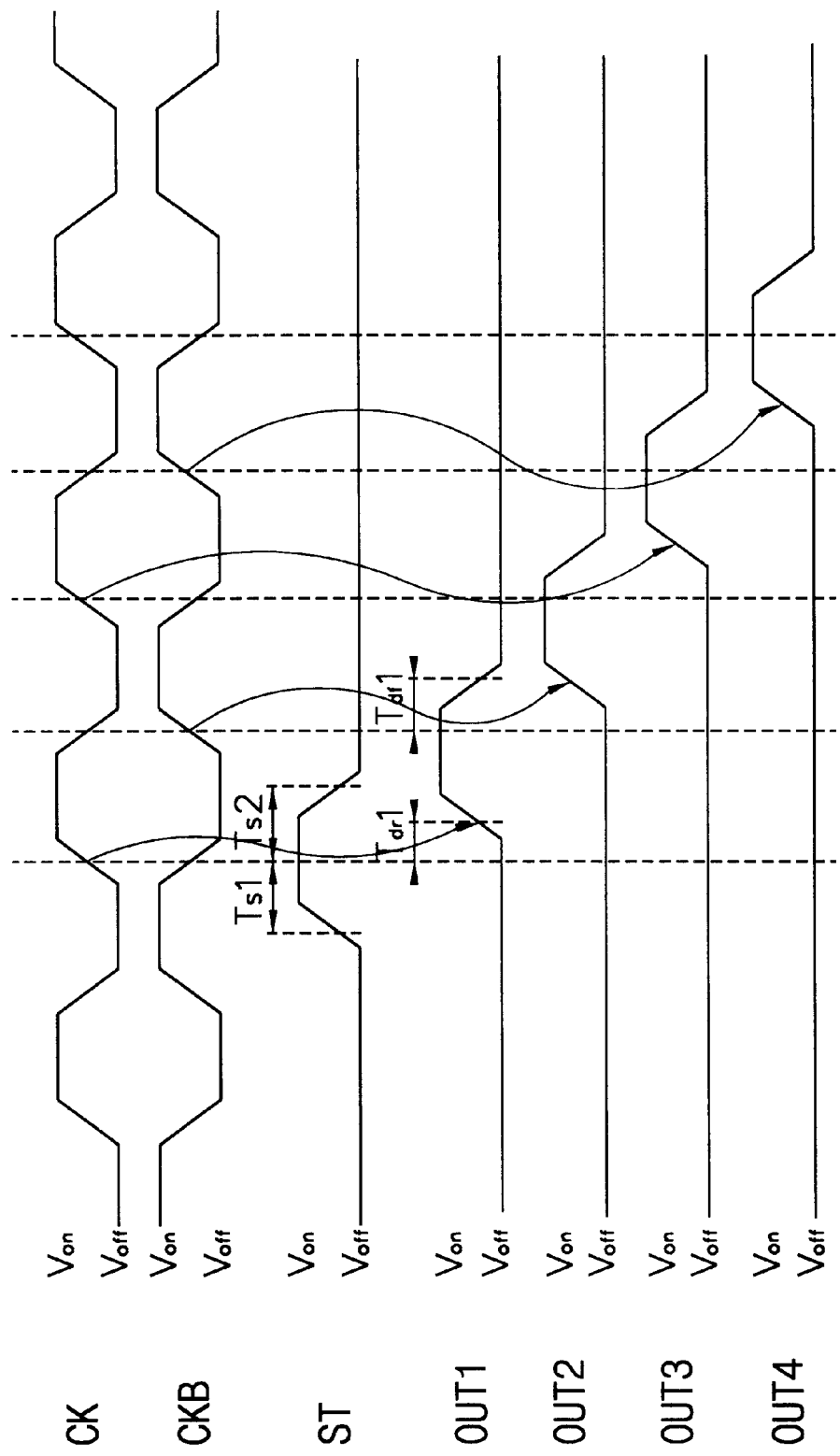
FIG. 16 is a timing diagram of respective elements of FIG. 15.

As shown in FIG. 16, as first and second clock signals CK and CKB and scan start signal ST are supplied to the shift register 170, the first stage of the shift register 170 delays a high level period of the first clock signal CK for a predetermined time of Tdr1 in respond to a front edge of the scan start signal ST, to thereby output a delayed output signal OUT1.

An active period of the scan start signal ST has a phase faster by approximately 1/4 than the high level period of the first clock signal CK. The active period of the scan start signal ST is divided into a set up time Ts1 from a front edge of a pulse, i.e., a rising edge and a hold time Ts2 to a rear edge of the pulse, i.e., a falling edge.

Thus, an output signal OUT1 has a front edge, i.e., a rising edge delayed by a certain time of approximately 2–4 μs from a start point of the hold time Ts2. In other words, the active period of the first clock signal CK, i.e., high level period is delay-output by a time of Tdr1 to the output terminal OUT. This delay characteristic is due to the fact that the capacitor C of the pull-up driving section 194 starts to be charged through the transistor NT13 in a state where the pull-up transistor NT11 is turned on after the charged voltage of the capacitor C becomes higher than a threshold voltage or more between the gate and the source of the pull-up transistor NT11, whereby the high level period of the first clock signal CK is generated at the output terminal.

As the high level period of the clock signal starts to be generated at the output terminal OUT, this output voltage is bootstrapped at the capacitor C and thereby the gate voltage of the pull-up transistor NT11 rises over the turn-on voltage VDD. Accordingly, the pull-up transistor NT11 of NMOS transistor maintains a full turn-on state. At this time, since the transistor NT13 has the size two times larger than the transistor NT15, even if the transistor NT15 is turned on by the start signal ST, the transistor NT11 is transferred from the turn-off state to the turn-on state.

Meanwhile, in the pull-down driving section 196, since the transistor NT17 is turned off by an input signal, a potential of the fourth node N4 rises to the second power voltage VDD to thereby turn on the transistor NT12. Accordingly, the voltage of the output signal in the output terminal OUT is in the state of the first power voltage VSS. At this time, since the transistor NT17 is turned on by the start signal ST, the potential of the fourth node N4 is dropped to the first power voltage VSS. After that, since the transistor NT17 has a size 16 times larger than the transistor NT16, even if the transistor NT16 is turned on, the fourth node N4 continues to maintain the state of the first power voltage VSS. Accordingly, the pull-down transistor NT12 is transferred from the turn-on state to the turn-off state.

The output signal OUT1 of the output terminal OUT is delay-generated by the duty period of the first clock signal CK.

As a voltage of the output signal of the output terminal OUT is dropped to the turn off voltage state VOFF=VSS, the transistor NT17 is turned off and only the second power voltage VDD is supplied to the fourth node N4 through the transistor NT16. So, a potential of the fourth node N4 starts to rise from the first power voltage VSS to the second power voltage VDD. As the potential of the fourth node N2 rises, the transistor NT15 is turned on and thus a charge voltage of the capacitor is discharged through the transistor NT15. As a result, the pull-up transistor NT11 starts to be turned off.

Continuously, since an output signal of the next stage that is supplied to the control terminal CT rises to the turn-on voltage, the transistor NT14 is turned on. At this time, a potential of the third node N3 is dropped to the first power voltage VSS faster than a drop rate where only the transistor NT15 is turned on since the transistor NT14 has a size twice times larger than the transistor NT16. So, the pull-up transistor NT11 is turned off and the pull-down transistor NT12 is turned on, so that a voltage of the output terminal OUT is dropped from the turn-on voltage VON to the turn-off voltage VOFF of the second power voltage VDD.

Although an output signal of the next stage that is applied to the control terminal CT is dropped to low level and thus the transistor NT14 is turned off, the fourth node N4 maintains the second power voltage VDD-biased state through the transistor NT16 and the third node N3 maintains the transistor NT15 that is held at the turn-on state in the first power voltage VSS-biased state. Thus, since the potential of the fourth node N4 is maintained at the second power voltage VDD, a stable operation can be secured without anxiety of an error operation.

Figure 17:
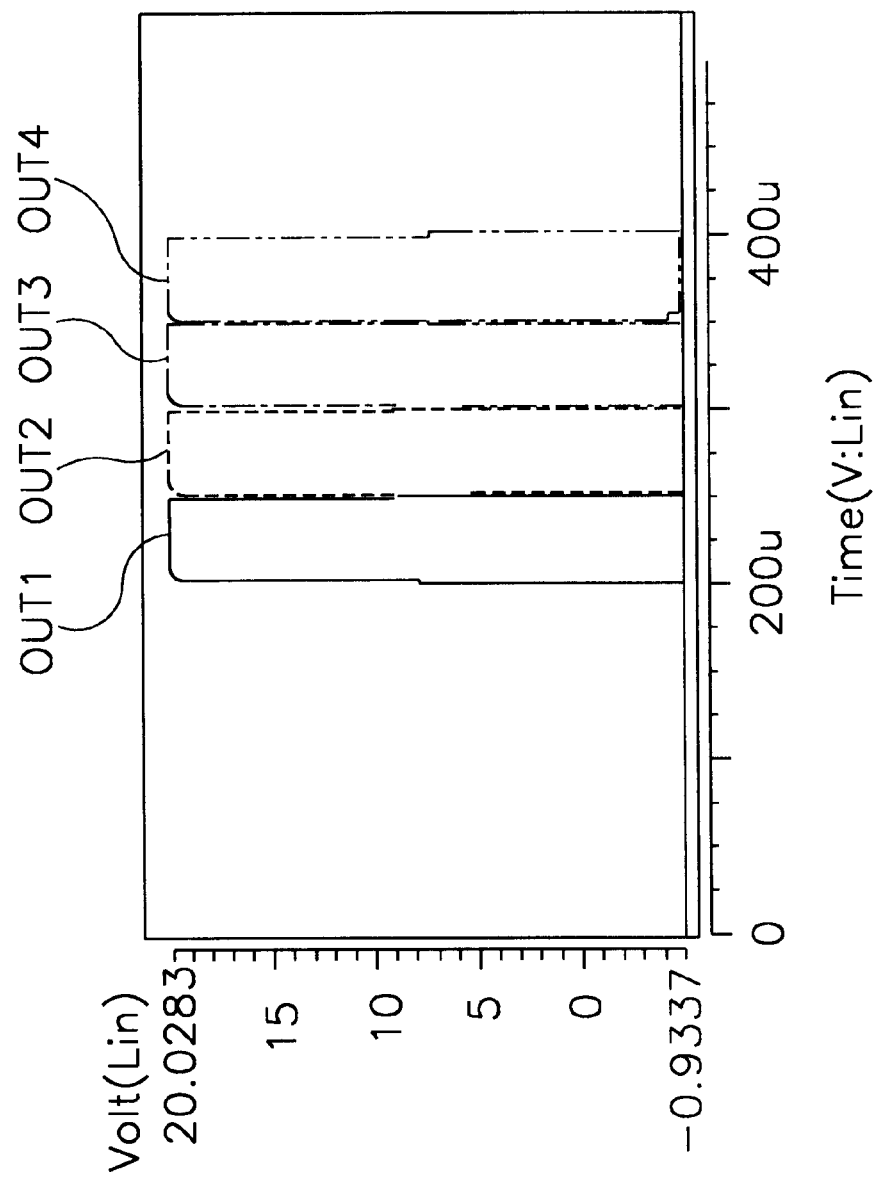
FIG. 17 is an output waveform simulated at each stage of FIG. 15.

Each of the stages is operated by the aforementioned manner, so that output signals OUT1, OUT2, OUT3 and OUT4 are sequentially and stably generated as shown in FIG. 17.

As noted above, the second embodiment arranges the transistors NT15 and NT17 in a latch type to thereby maintain a stable state at the third node N3 and the fourth node N4. Also, the second embodiment not only removes two transistors but decrease size of the transistor, thereby capable of decreasing the area occupied by the shift register within the LCD panel 10%. Moreover, compared with the first embodiment, the second embodiment makes it possible to secure a stable operation regardless of the pulse width of the scan start signal ST.

In other words, the first embodiment starts to discharge the capacitor before clock signal is input in a case where the pulse width of the scan start signal ST is narrower than that of the clock signal. To this end, the pull-down transistor is turned on, so that any output is not generated. As a result, since an output signal is not shifted to a next terminal, an impossible state in the operation may occur.

However, since the second embodiment latches the scan start signal ST, a stable operation is possible regardless of narrowness and wideness of the pulse width.

Figure 18:
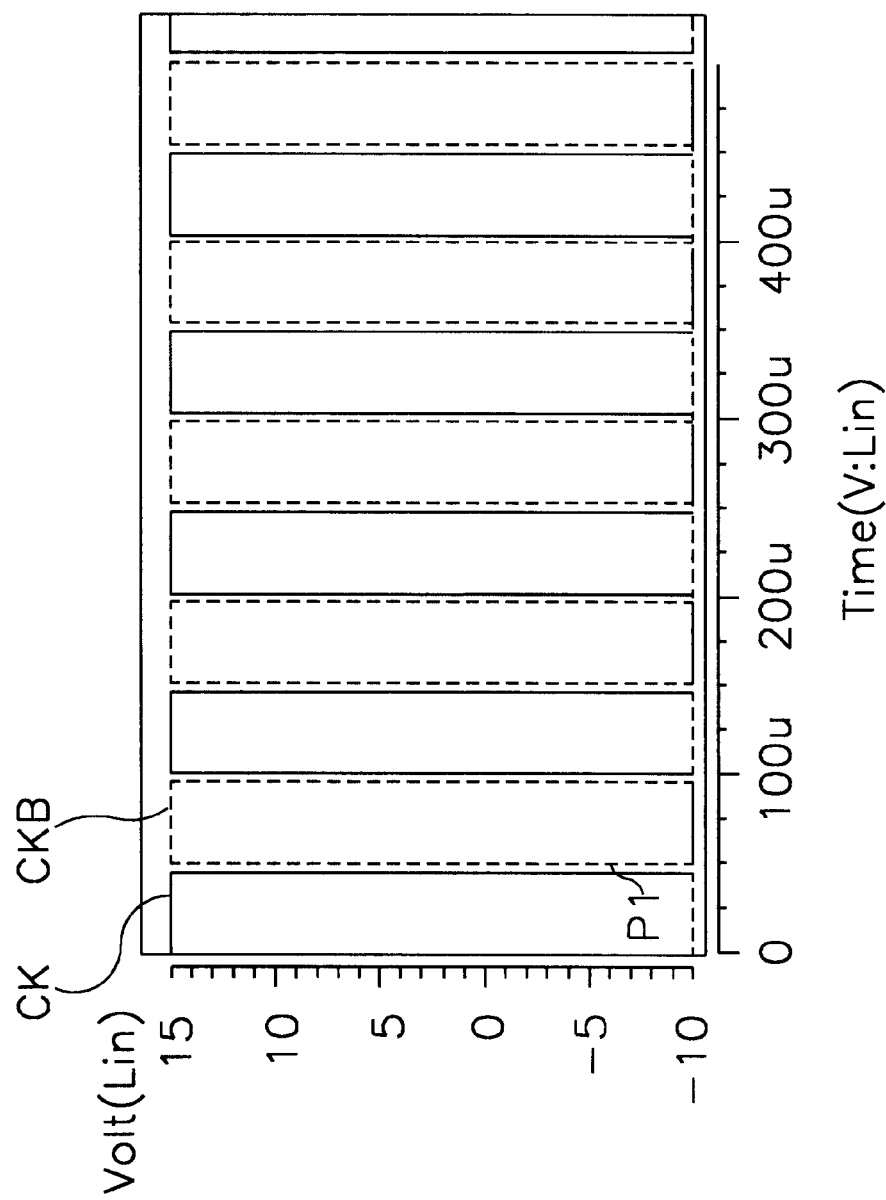
FIG. 18 is a simulated waveform of the first and second clock signals in accordance with another embodiment of the present invention.
Figure 19:
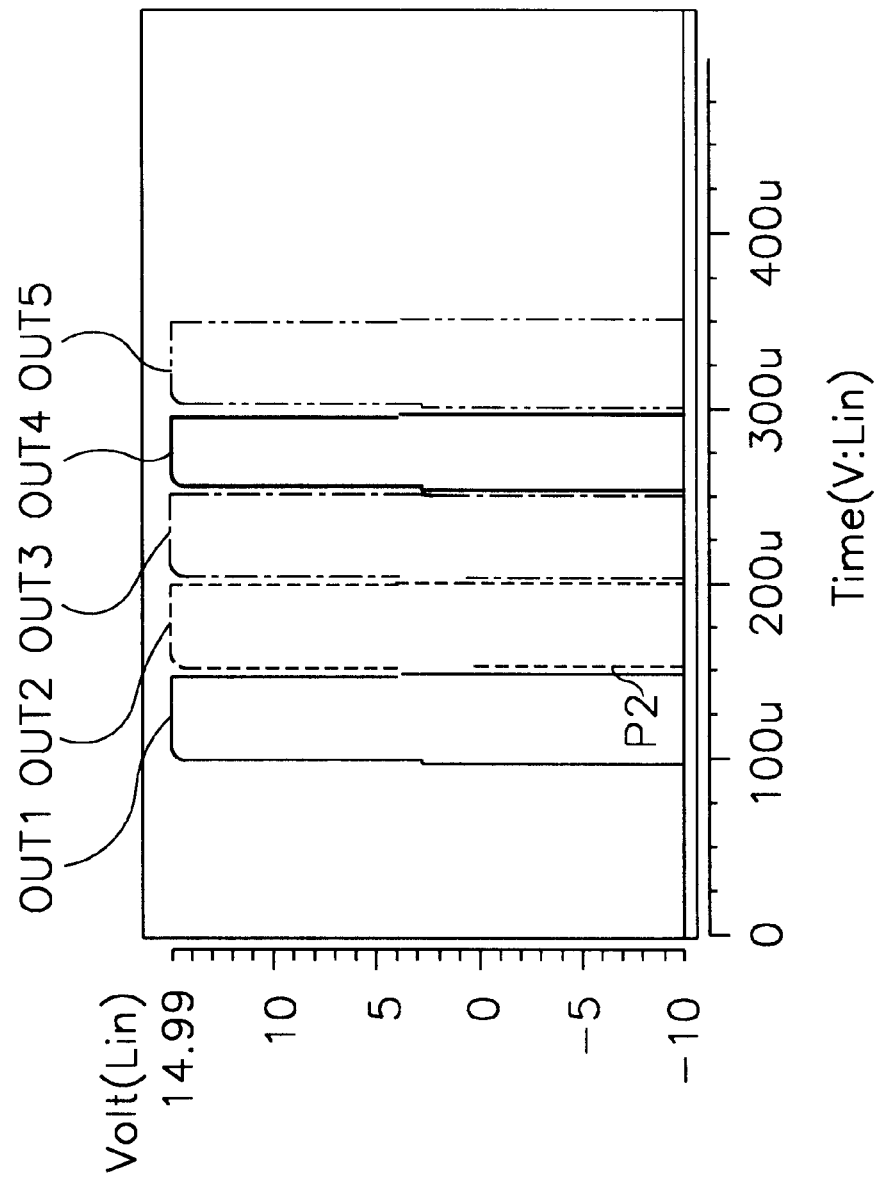
FIG. 19 is a simulated waveform of the respective stages.

FIG. 18 is waveforms of first and second clock signals in accordance with another embodiment of the present invention and FIG. 19 is output waveforms of respective stages.

Referring to FIGS. 18 and 19, the first and second clock signals CK and CKB are supplied to each stage of the shift registers 164 and 170. Specifically, to odd stages is supplied the first clock signal CK and to even stages is supplied the second clock signal CKB. The first clock signal CK has an opposite phase to the second clock signal CKB. As the first and second clock signals CK and CKB are supplied to respective stages, high level periods of the second clock signals CK and CKB are generated at the output terminal OUT of the respective stages as an output signal.

A constant phase difference P1 is placed between the high level periods that are respectively generated at the first clock signal CK and the second clock signal CKB that are supplied to the respective stages. In other words, the high level period of the first clock signal CK is supplied to the odd stage and the high level period of the second clock signal CKB is then supplied to the even stage after an elapse of a certain time.

Accordingly, as shown in FIG. 19, a constant phase difference P2 is generated between high periods of output signals OUT1, OUT2, OUT3, OUT4, and OUT5 that are generated at the respective stages. In other words, after high level periods of the output signals OUT1, OUT3, OUT5 of the odd stages to which the first clock signal CK is supplied are generated and a predetermined time has been elapsed, high level periods of the output signals OUT2 and OUT4 of the even stages to which the second clock signal CKB is supplied are generated. Accordingly, there can be prevented an overlap phenomenon that the falling transfer of the output signal of each stage is overlapped with the rising transfer of the output signal of the next stage.

Embodiment 3

Figure 20:
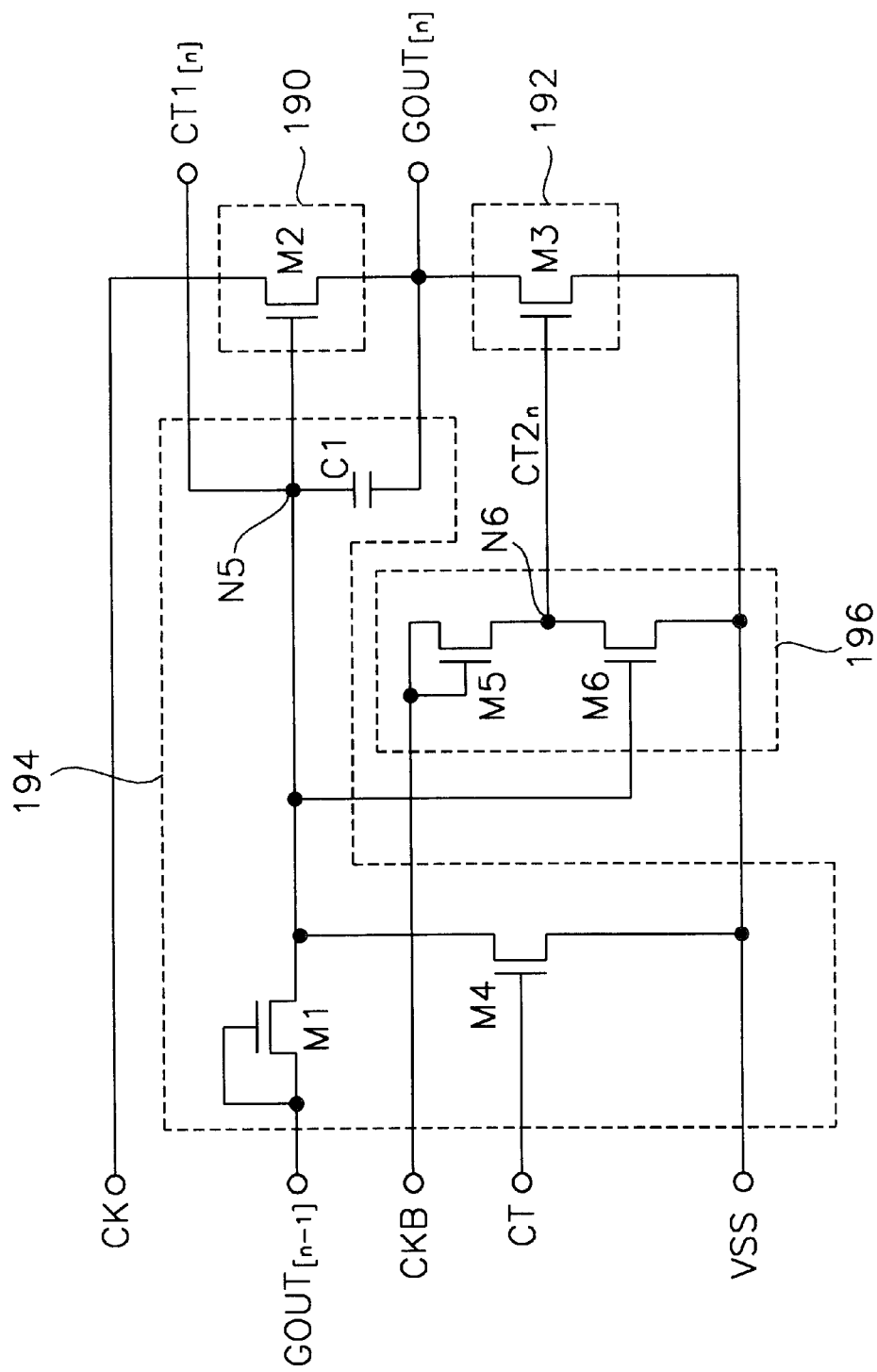
FIG. 20 is a circuit diagram of each stage in the shift register in accordance with a third embodiment of the present invention.
Figure 21:
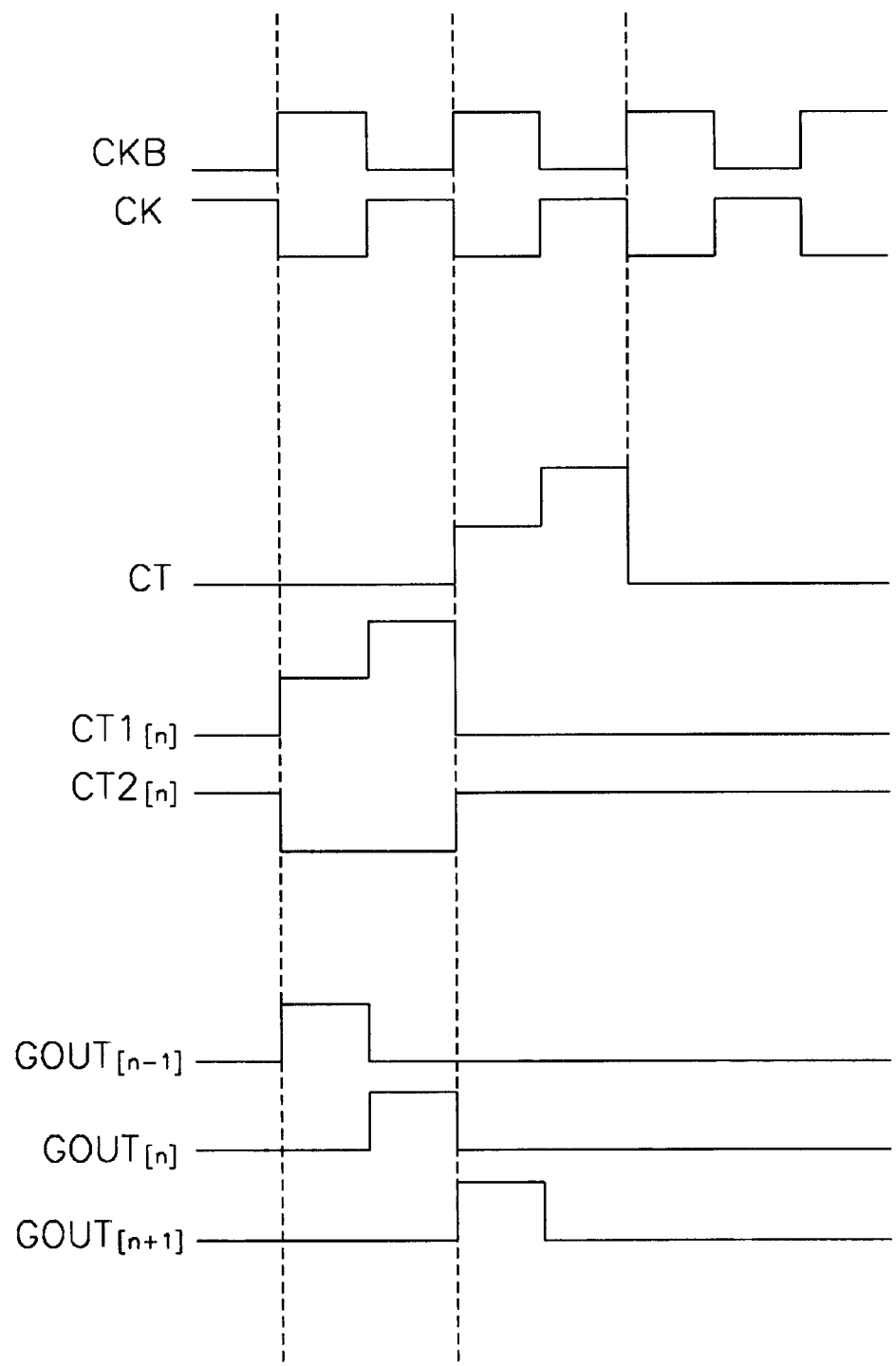
FIG. 21 is a timing diagram of respective elements of FIG. 20.

FIG. 20 is a circuit diagram of each stage in the shift register in accordance with a third embodiment of the present invention and FIG. 21 is a timing diagram for illustrating the driving waveform of the shift register of FIG. 20.

Referring to FIG. 20, each stage of the shift registers 170 in accordance with the third embodiment of the invention includes a pull-up section 190, a pull-down section 192, a pull-up driving section 194 and a pull-down driving section 196.

The pull-up section 190 includes a pull-up NMOS transistor M2 of which drain is connected to a clock signal input terminal CK, gate is connected to a fifth node N5 and source is connected to an output terminal GOUT.

The pull-down section 192 includes a pull-down NMOS transistor M3 of which drain is connected to the output terminal OUT, gate is connected to a sixth node N6 and source is connected to a first power voltage VSS.

The pull-up driving section 194 includes a capacitor C and NMOS transistors M1 and M4. The capacitor C is connected between the fifth node N5 and the output terminal OUT. Transistor M1 has a drain and gate commonly connected to an input signal and a source connected to an input node of the pull-up section 190 via the fifth node N5. If it is assumed that the stage shown in FIG. 20 is the first stage, the drain and gate connected to each other are commonly connected to the input signal while it is assumed that the stage shown in FIG. 20 is the second stage or more, the drain and gate connected to each other are commonly connected to an output terminal of a previous stage to receive a previous carry signal. Transistor M4 has a drain connected to the input node of the pull-up section 190, a gate connected to an output signal of a next stage and a source connected to the first power voltage VSS.

The pull-down driving section 196 includes two NMOS transistors M5 and M6, and performs an inverter operation. Transistor M5 has a drain and gate commonly connected to a second power voltage VDD and a source connected to the sixth node "N6". Transistor M6 has a drain connected to the sixth node "N6", a gate connected to the fifth node "N5" and a source connected to the first power voltage VSS. Here, the transistor M5 has a size 16 times larger than the transistor M6.

In operation, if the capacitor C1 is charged by an output signal "GOUT[n−1]" (or "STV") of the previous stage, a bias VGS is applied between gate and source of the transistor M2 and thereby the transistor M2 is in a turn on-possible standby state. After that, if the clock signal CK in a high level is applied to drain of the transistor M2, the clock signal is carried on an output node GOUT[n]. At this time, the capacitor C1 having the output node GOUT[n] as a reference potential, level-shifts a potential of a node 'CT1[n]' and thereby the transistor M2 maintains a turn-on state during the high level period of the clock signal CK.

If a signal CT1[n+2] of the next stage is applied to gate of the transistor M4 as the signal CT, the transistor M4 is turned on, so that the fifth node N5 is discharged to the first power voltage (VSS) level.

At this time, when the transistor M2 is in a turn-on state, the transistor M3 should be turned off. If the transistor M3 is not sufficiently turned off, a leakage current is generated at a path between the transistor M2 and the transistor M3, so that power consumption increases.

To this end, the transistors M5 and M6 invert the gate voltage of the transistor M2, i.e., the voltage of the fifth node N5, to thereby prevent the transistors M2 and M3 from being turned on at the same time.

Figure 22:
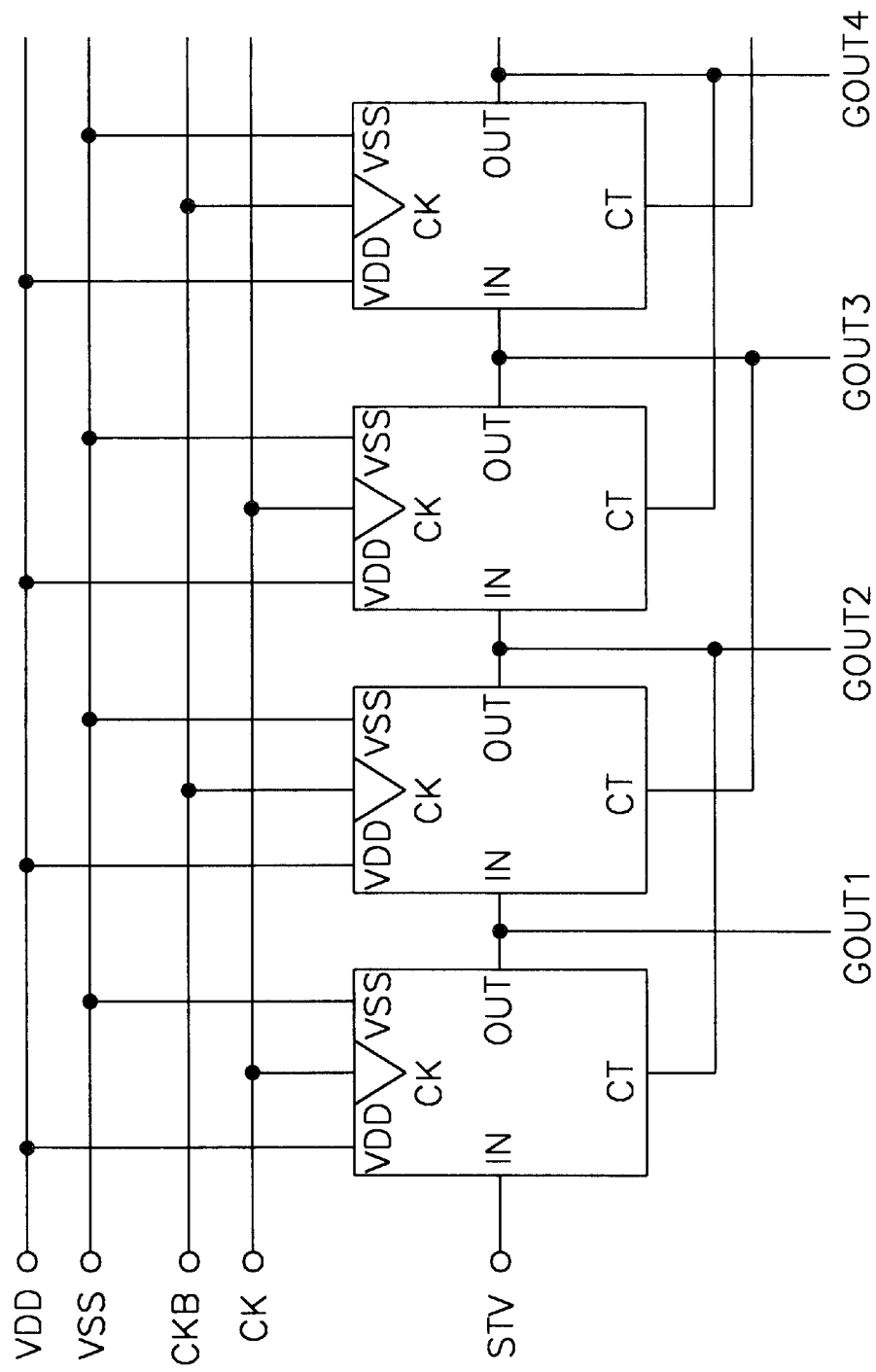
FIG. 22 is a circuit diagram for illustrating an a-TFT LCD gate driving circuit using the shift register in accordance with the second embodiment of the present invention.
Figure 23:
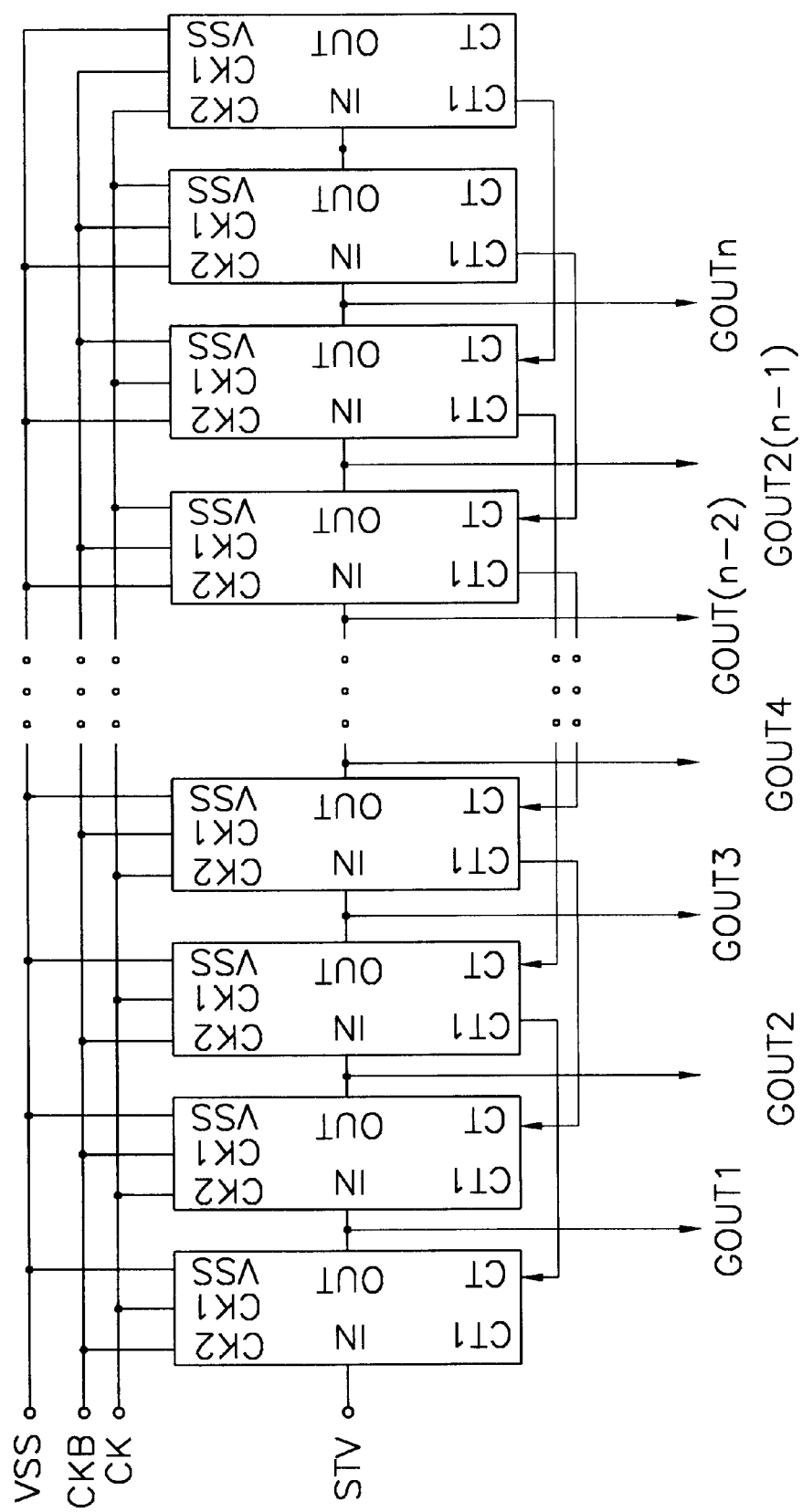
FIG. 23 is a circuit diagram for illustrating an a-TFT LCD gate driving circuit using the shift register in accordance with the third embodiment of the present invention.

FIG. 22 is a circuit diagram for illustrating an a-TFT LCD gate driving circuit using the shift register in accordance with the second embodiment of the present invention and FIG. 23 is a circuit diagram for illustrating an a-TFT LCD gate driving circuit using the shift register in accordance with the third embodiment of the present invention.

The foregoing stages of FIG. 15 are connected in series above the number of the gate lines to carry out the operation of the gate driving circuit. Then, because they need a total of five transmission lines (VDD, VSS, CKV, CKVB, STV) as the external inputs, and seven transistors every stage, i.e., they need too many transistors and transmission lines, there exists a spatial limitation for a layout thereof on a-TFT LCD substrate.

Also, in the inverting circuit 196 including the transistors NT16 and NT17 for making a level capable of turning off the pull-down section NT12, a condition in which the two transistors NT16 and NT17 are simultaneously turned on is generated during its operation, so that a problem on the power consumption occurs. Since it is difficult that VSS is appleid to the pull-down section NT12 as the turn-off voltage, there occurs a leakage current problem at a path between the pull-up section NT11 and the pull-down section NT12.

Further, since the fourth node N4 is in a high state at an initial state, there occurs a limit on the circuit in that the charging of the capacitor becomes difficult in turn-on state of the transistor NT15. So, unless the sizes of the transistors NT13, NT14, NT16 and NT17 are precisely adjusted, there occurs an operation failure problem in that the signal "IN" is not charged in the capacitor because of turn-on of the transistor NT15.

However, according to the shift register disclosed in the third embodiment of the present invention, it is possible to apply less number of transistors and transmission lines to a-TFT LCD substrate. Accordingly, it is possible to provide a-TFT gate driving circuit having easy design characteristic and capable of solving the problems occurring on the operation.

Referring to FIG. 23, there is no need to supply the second power voltage VDD, and a signal CT1 of the stage after the next stage is used as an input of the control terminal CT.

Thus, by using the signal CT1 of the stage after the next stage as the input of the control terminal CT, there is prevented an error operation due to a potential fluctuation of the fifth node N5 generated by a parasitic coupling capacitance is between drain and gate of the transistor M2. In other words, it becomes possible to remove the separate discharging transistor NT15 that is necessary for removing error operation due to the potential fluctuation of the fifth node N5.

For instance, when the output GOUT of the next stage is used as an input of the control terminal CT, in case where the clock signal CK rises, accordingly the node CK1 rises, and the CT1 node voltage is above VSS+Vth (threshold voltage of transistor M2), there occurs an error operation in that transistor M2 is turned on, and at the same time a problem in that much current flows into the transistor M3.

FIGS. 24A and 24B are simulation results of gate output waveforms of when the output GOUT of the next stage is used as an input of the node CT and of when the signal CT1 of the stage after the next stage is used as an input of the node CT.

Referring to FIG. 24A, when assuming that the output GOUT[n+1] of the next stage is used for turning on the transistor M4, there occurs an error operation in that when CK is in a low state, CT1 is clamped into VSS, when CK enters into a rising, a coupling voltage of CT1 is above VSS+Vth, and thereby the transistor M2 is turned on. To prevent this error operation, a discharge transistor is further necessary.

However, in FIG. 24B, when CT1 is coupled to CK and CK is in a high state, the discharge transistor M4 can clamp CT1 by VSS. After that, although CK enters into the falling, the coupling voltage of CT1 is allowed to be maintained at VSS or less, thereby removing a circumstance in that the transistor M2 is turned on.

As will be seen in the simulation results, although the CT1 voltage is coupled to CK in the third embodiment of the present invention, it is possible to maintain the coupling voltage of CT1 at VSS or less, thereby preventing an error operation of the transistor M2.

Thus, according to the third embodiment of the present invention, it is possible to remove the discharge transistor NT15 shown in FIG. 15. As a result, error operation on the circuit due to the transistor NT15 can be prevented, and the number of the transistors in the shift register can be simplified to 6 in number.

Figure 25A:
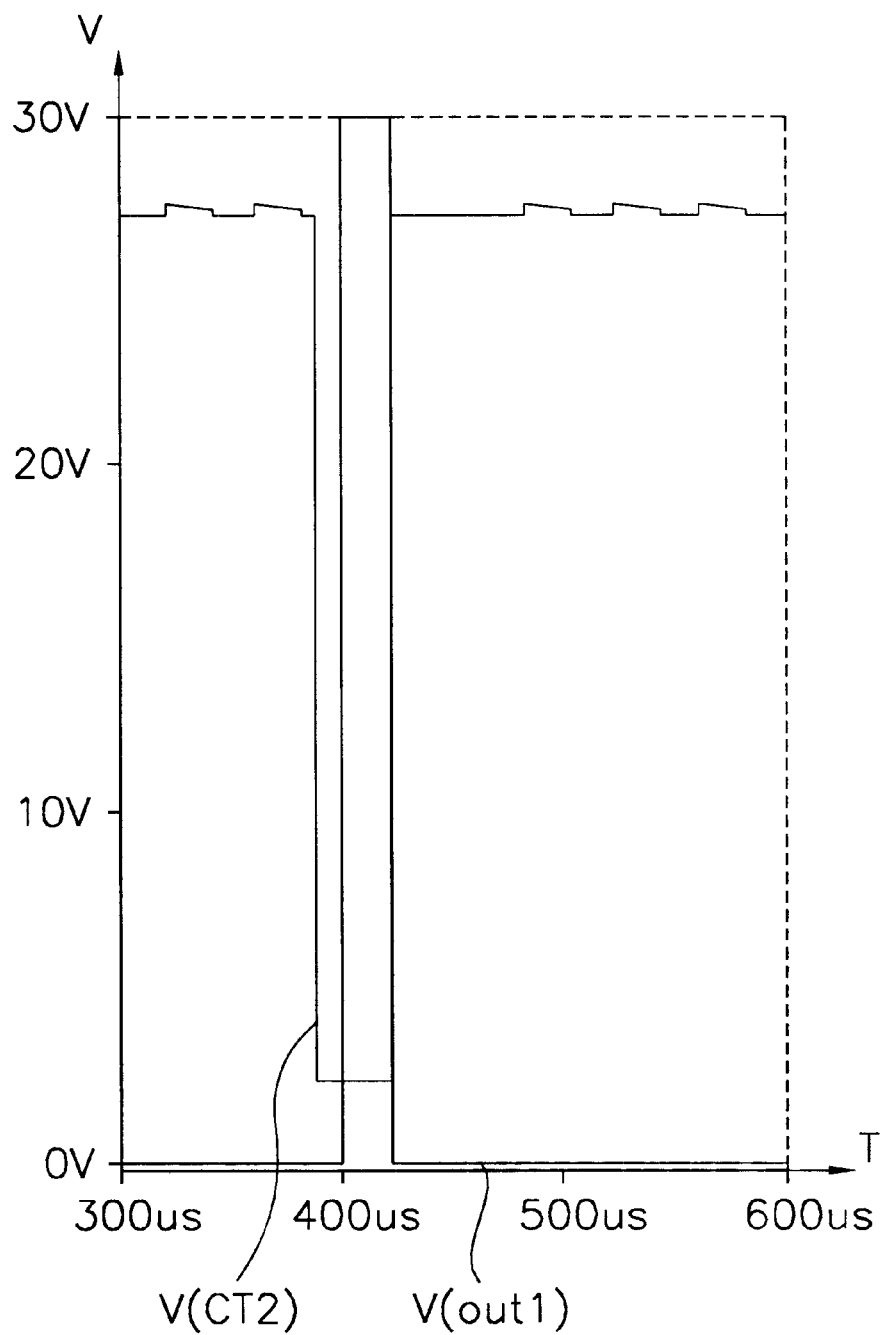
FIGS. 25A and 25B are waveforms of gate signals respectively output from the second embodiment and the third embodiment of the present invention.
Figure 25B:
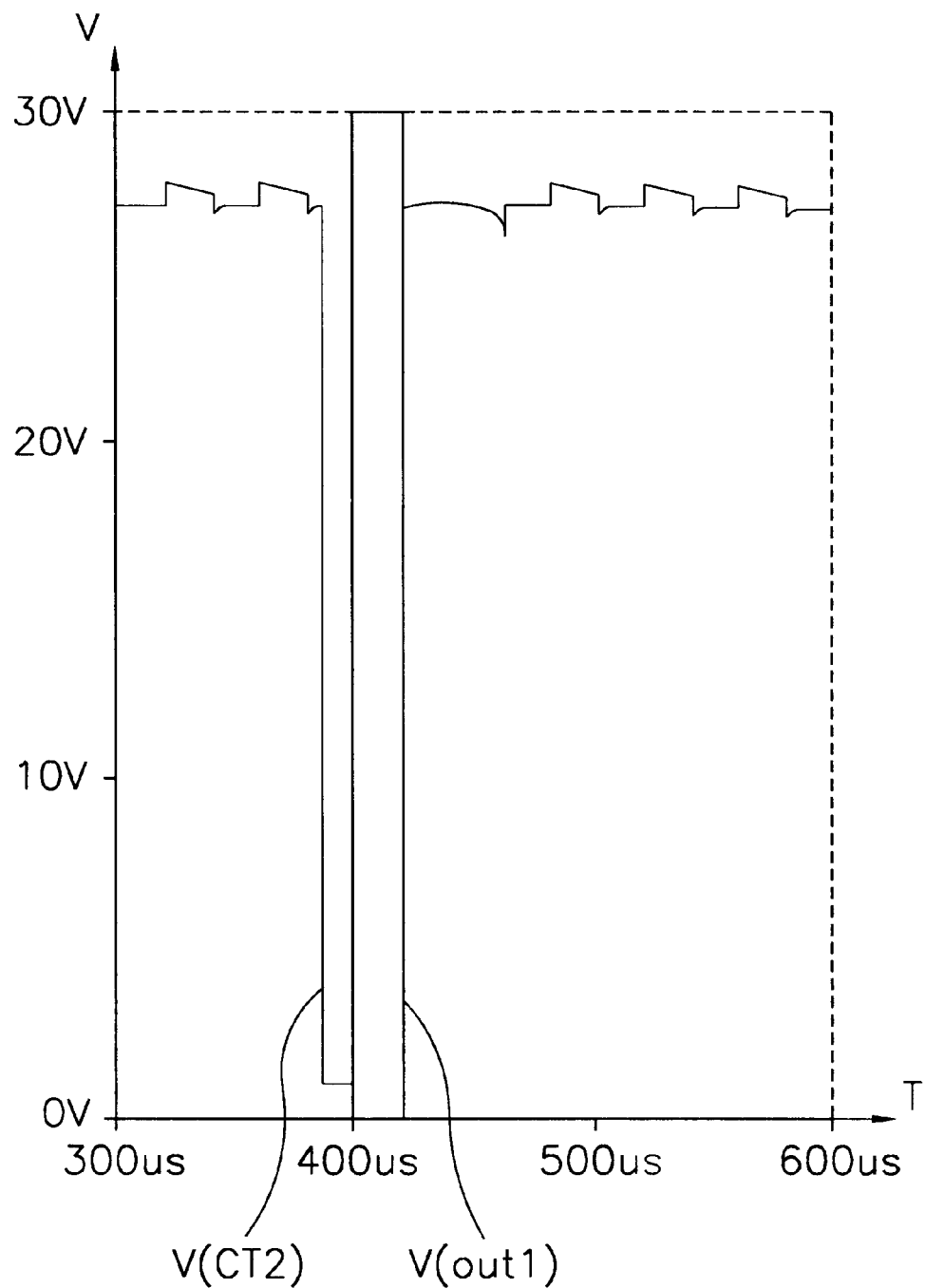

FIGS. 25A and 25B are waveforms of gate signals respectively outputted from the gate drivers in accordance with the second embodiment and the third embodiment of the present invention. In particular, they describe simulation results of CT2 waveform for turning off the transistor M3.

According to the second embodiment of the invention shown in FIG. 25A, because a level of CT2 is above VSS, and thereby there occurs a circumstance in which the transistors M3 and M2 are simultaneously turned on, so that over current may be generated.

However, according to the third embodiment of the invention shown in FIG. 25B, by using CKB signal which reaches a low state when transistor M2 is turned on, instead of the conventional second power voltage VDD, when the transistor M2 is turned on and accordingly signal OUT1 is generated, CT2 necessarily reaches the first power voltage level to thereby turn off the transistor M3 and remove an occurrence of over current.

Thus, as will be seen in the simulation results, the third embodiment of the invention removes error operation or over current occurrence of the conventional a-TFT gate driving circuit, thereby securing stability and superior characteristic compared with the second embodiment.

Further, the third embodiment enables to remove transmission lines for one transistor and further second power voltage VDD that are essential elements for the consititution of the shift register, so that a-TFT gate driving circuit having a high integrity is provided.

As described previously, when compared with FIG. 20 of the third embodiment with FIG. 15 of the second embodiment, the number of the transistors can be decreased from 7 to 6, and the number of the external input terminals can be decreased from 5 to 4, thereby securing the circuit stability and realizing a high integrity.

Meanwhile, the respective stages are fabricated as shown in FIG. 15, connected in series above the number of the gates as shown in FIG. 22. The respective stages carries out the function of gate drive IC.

However, the circuit of FIG. 22 has the following problems.

First, the circuit is low in the reliability. In other words, over current flows into the signal transmission line VSS, CKV or CKVB, so that the signal transmission line is open, or overload is applied to the circuit, whereby system has broken down.

From analysis of such problems, it was found that the capacitor C of the node N3 causes such the problems. This phenomenon occurs when nondesired charge is accumulated in the capacitor by static electricity at multiple stages, when an initial external power is applied, the charge is accumulated in the capacitor at unstable power and unstable signal state, or CKV and CKVB are applied to the circuit and multiple stages are simultaneously operated.

In a case that charge is accumulated in the capacitor, transistor NT11 of each stage carries out a charging process of the load capacitor applied to GOUT. In a moment, when signals of CKV and CKVB are phase-transferred, discharging process is carried out by the transistor NT12. If this operation is simultaneously carried out at the multiple stages, over current flows into the signal transmission line VSS, CKV or CKVB.

When assuming that a driving current of a single transistor is 0.1 mA, because 768 of gate lines exist in case of a resolution of XGA-grade (1024×3×3768), at the most 38.4 mA (=0.1 mA×768/2) current can flow.

This over current is generated during one frame in which shifting operation is completed, for instance, for 16.7 msec in 60 Hz, so that heat is generated in the transmission line of VSS having a resistance during the time and thus there occurs a phenomenon in which the transmission line is melted by the heat and is opened.

This circumstance occurs when the power supplied to the stage is stable. Meanwhile, when the transmission line has a high resistance and thereby a voltage drop is generated, or transistors are abnormally operated under an insufficient voltage, the error operation continues for 16.7 msec or more, so that the stage reaches an operation-impossible state.

Second, because the capacitor of the last stage cannot be discharged in operation, there is a problem causing an error operation in that an output voltage of the last gate line is low or is not generated. Of course, in order to solve this problem, a further stage can be equipped after the last stage. However, because this proposal cannot discharge the capacitor of the added stage too, there occurs a problem in that the capacitor of the added stage periodically hinders to charge the capacitor of the previous stage depending on CK or CKB.

So, the following embodiments 4 and 5 solve these two problems, thereby provide a-TFT LCD gate driving circuit having a superior reliability and good functions.

Embodiment 4

Figure 26:
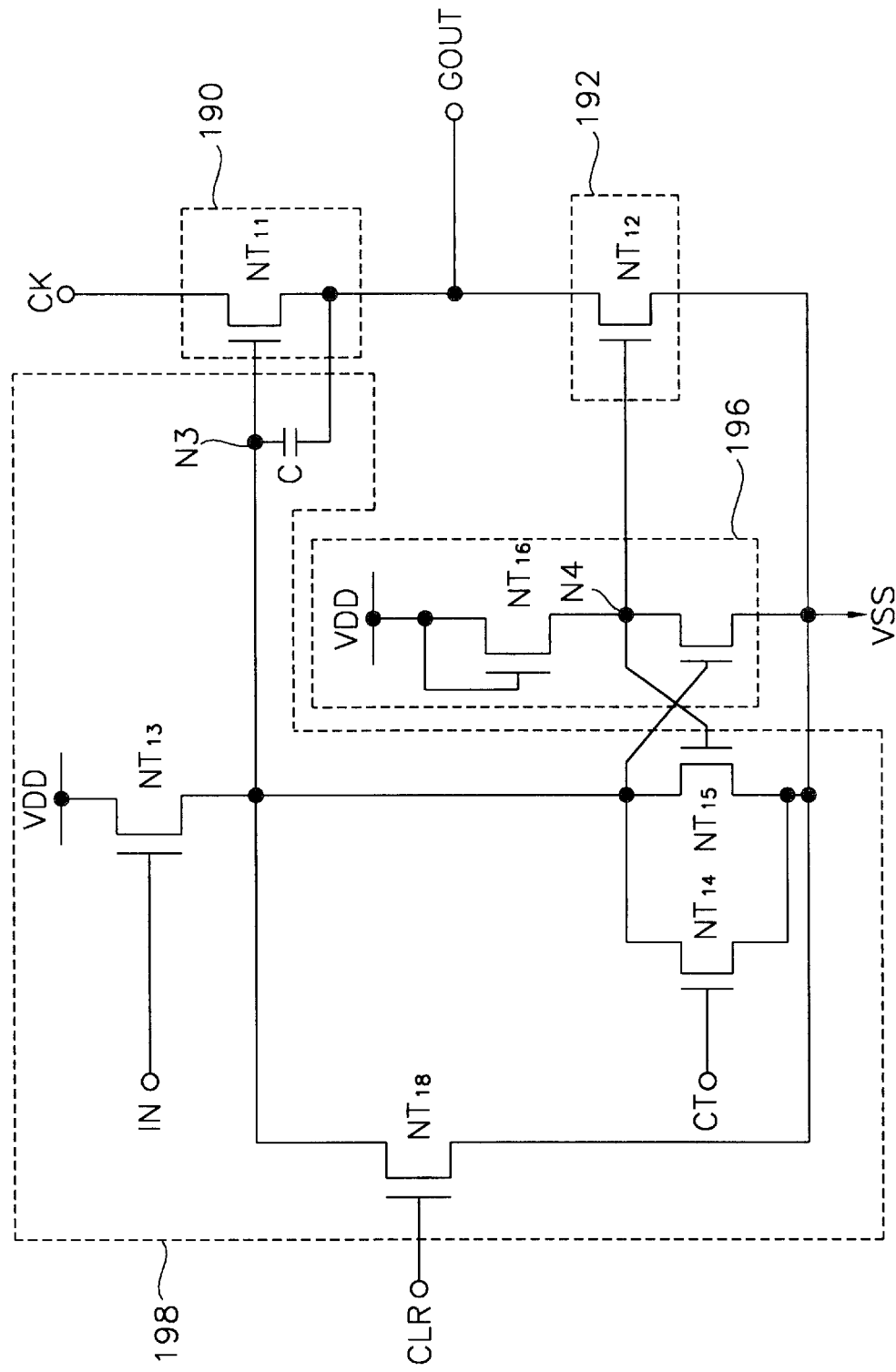
FIG. 26 is a circuit diagram of each stage in the shift register in accordance with a fourth embodiment of the present invention.
Figure 27:
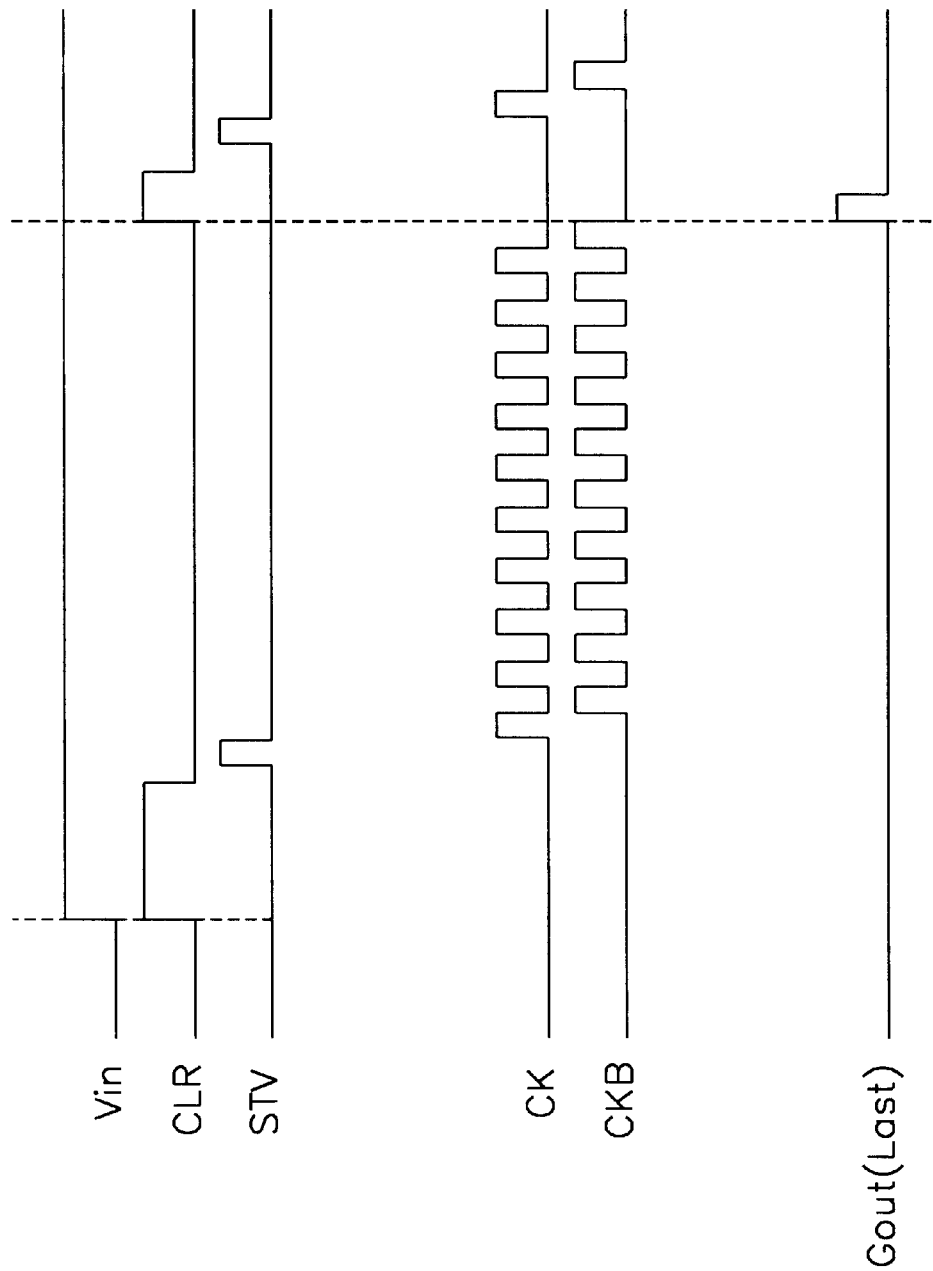
FIG. 27 is driving waveforms of the circuit of FIG. 26.

FIG. 26 is a circuit diagram of each stage in the shift register in accordance with a fourth embodiment of the present invention and FIG. 27 is driving waveforms of the circuit of FIG. 26. In particular, each stage of FIG. 26 is provided with a transistor for discharge alone for discharging the charge accumulated in the capacitor.

Referring to FIG. 26, each stage of the shift registers 170 in accordance with the present embodiment includes a pull-up section 190, a pull-down section 192, a pull-up driving section 198 and a pull-down driving section 196. When compared with FIG. 15, since the pull-up section 190, the pull-down section 192 and the pull-down driving section 196 are the same as those of FIG. 15, their description will be omitted.

The pull-up driving section 198 includes a capacitor C and an NMOS transistor NT13, NT14, NT15 and NT18. More particularly, the capacitor C is connected between the third node N3 and the output terminal OUT. Transistor NT13 has a drain connected to the second power voltage VDD, gate connected to an input terminal IN and a source connected to the third node N3. Transistor NT14 has a drain connected to the third node N3, gate connected to a control terminal CT and a source connected to the first power voltage VSS. Transistor NT15 has a drain connected to the third node N3, a gate connected to a fourth node N4 and a source connected to the first power voltage VSS. Here, the transistor NT13 has a size approximately two times larger than the transistor NT15. Transistor NT18 has a source connected to the first power voltage VSS, a gate connected to an external input control signal (or clear signal) CLR and a drain for forcibly discharging the charge accumulated in the capacitor connected in parallel to the input node N3 of the pull-up section 190 using the drain.

Here, the external input control signal CLR is a signal for discharging the charge accumulated in the capacitor C to the first power voltage VSS, and maintains the second power voltage VDD state during a predetermined time such that the capacitor is discharged on an initial power on. The signal CLR is a signal of less than the threshold voltage, which allows a transistor to maintain the turn-off state during a time period when a picture is displayed, for instance, is a signal having the first power voltage (VSS) state.

Referring to FIG. 27, the external input control signal CLR maintains a high state simultaneously when a power Vin is applied, to thereby discharge the charged capacitor of the stage and then generate a vertical start signal STV.

Also, in order to prevent overload from being applied to signals CK and CKB, when the external input signal is in a high state, the two signals of CK and CKB are in a low state.

In a normal operation, after a last gate pulse $Gout_{(Last)}$ is generated, the external input control signal CLR reaches a high state to thereby discharge the capacitor of the last stage.

As described above, according to the fourth embodiment of the invention, a means for discharging the charge accumulated in the capacitor of the pull-up driving section is independently provided, which can resolve an error operation due to the charge accumulated in the capacitor during the initial operation, or a damage problem of transmission line of an LCD panel, in particular, a-TFT LCD panel, thereby giving a TFT-LCD module having a high reliability.

Further, the current embodiment solves an error in the driving signal of the last gate line to thereby remove a line damage occurring in an end of a picture, so that there can be provided a TFT-LCD module provided with a gate driving circuit made of a functionally stable a-TFT.

Embodiment 5

Figure 28:
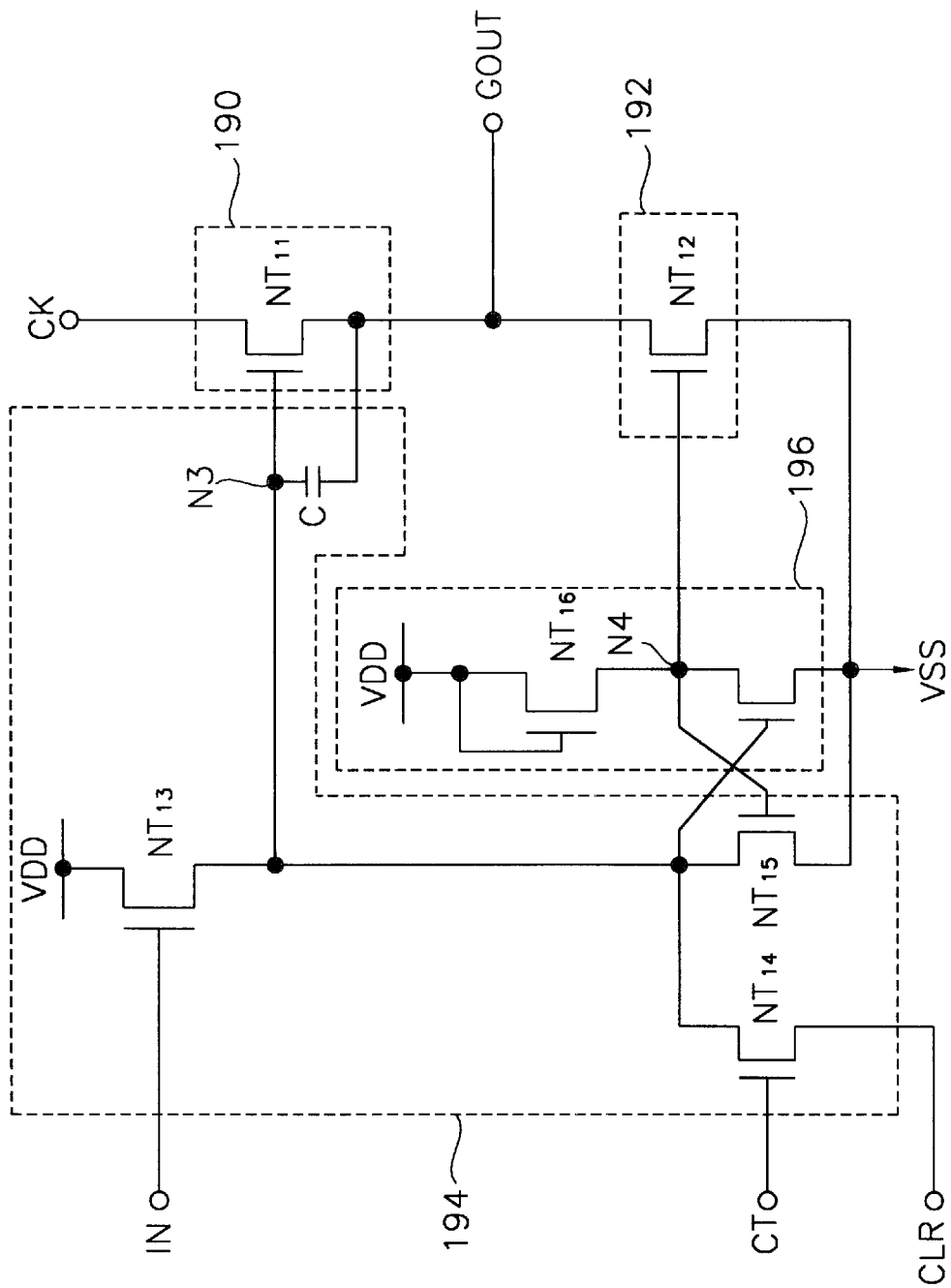
FIG. 28 is a circuit diagram of each stage in the shift register in accordance with a fifth embodiment of the present invention.
Figure 29:
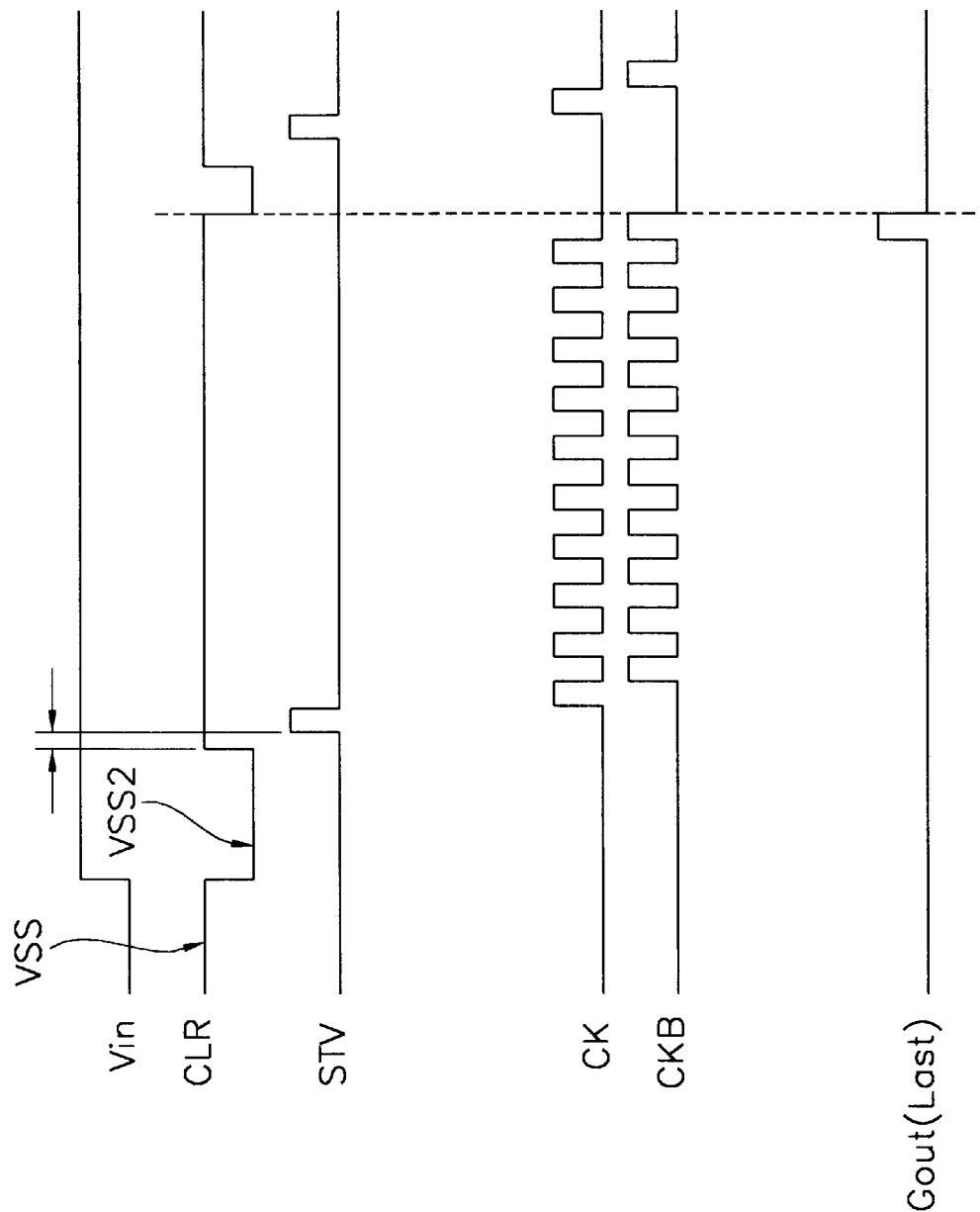
FIG. 29 is driving waveforms of the circuit of FIG. 28.

FIG. 28 is a circuit diagram of each stage in the shift register in accordance with a fifth embodiment of the present invention and FIG. 29 is driving waveforms of the circuit of FIG. 28. In particular, FIG. 28 is a circuit diagram for discharging the charge accumulated in the capacitor of the stage without adding a transistor for discharging alone.

Referring to FIG. 28, each stage of the shift registers 170 in accordance with the present embodiment includes a pull-up section 190, a pull-down section 192, a pull-up driving section 194 and a pull-down driving section 196. Unlike that of FIG. 15, an external input control signal CLR is applied to source of transistor NT14 of the pull-up driving section 194. Although not shown in the drawings, the external input control signal can be applied to source of transistor NT15 or to source of the transistor NT14 and transistor NT15 of which sources are commonly connected to each other.

As shown in FIG. 28, the current embodiment utilizes that a voltage of VSS and more is always applied to gate of transistor NT14. In order to obtain a condition of Vgs>Vth (here, Vth is a threshold voltage of transistor NT14), a voltage of VSS2 having a condition of VSS2<VSS-Vth is applied to turn on the transistor NT14, thereby carrying out the discharging operation which forcibly lowers the charged voltage of the capacitor to the voltage level of VSS2.

For this purpose, the external input control signal CLR maintains a low state (VSS2) simultaneously with an application of a power, to thereby discharge the charge accumulated in the capacitor of the stage, and then the external input control signal CLR reaches a high state before STV signal is generated.

Also, in order to prevent an overload from being applied to the signals of CKV and CKVB, the two signals CKV and CKVB are in a low state when the external input control signal CLR is in the low state (VSS2).

In a normal operation, after the last gate pulse $Gout_{(Last)}$ is generated, the external input control signal CLR again reaches a low state (VSS2) to discharge the capacitor of the last stage.

As described previously, according to the present embodiment, an external input control signal is supplied to source of a transistor of the pull-up driving section so as to discharge the charge accumulated in the capacitor, which can resolve an error operation due to the charge accumulated in the capacitor during the initial operation, or a damage problem of transmission line of an LCD panel, thereby giving a TFT-LCD module having a high reliability.

Further, the present embodiment solves an error in the driving signal of the last gate line to thereby remove a line damage occurring in an end of an image, so that there can be provided a TFT-LCD module provided with a gate driving circuit made of a functionally stable a-TFT.

Figure 30:
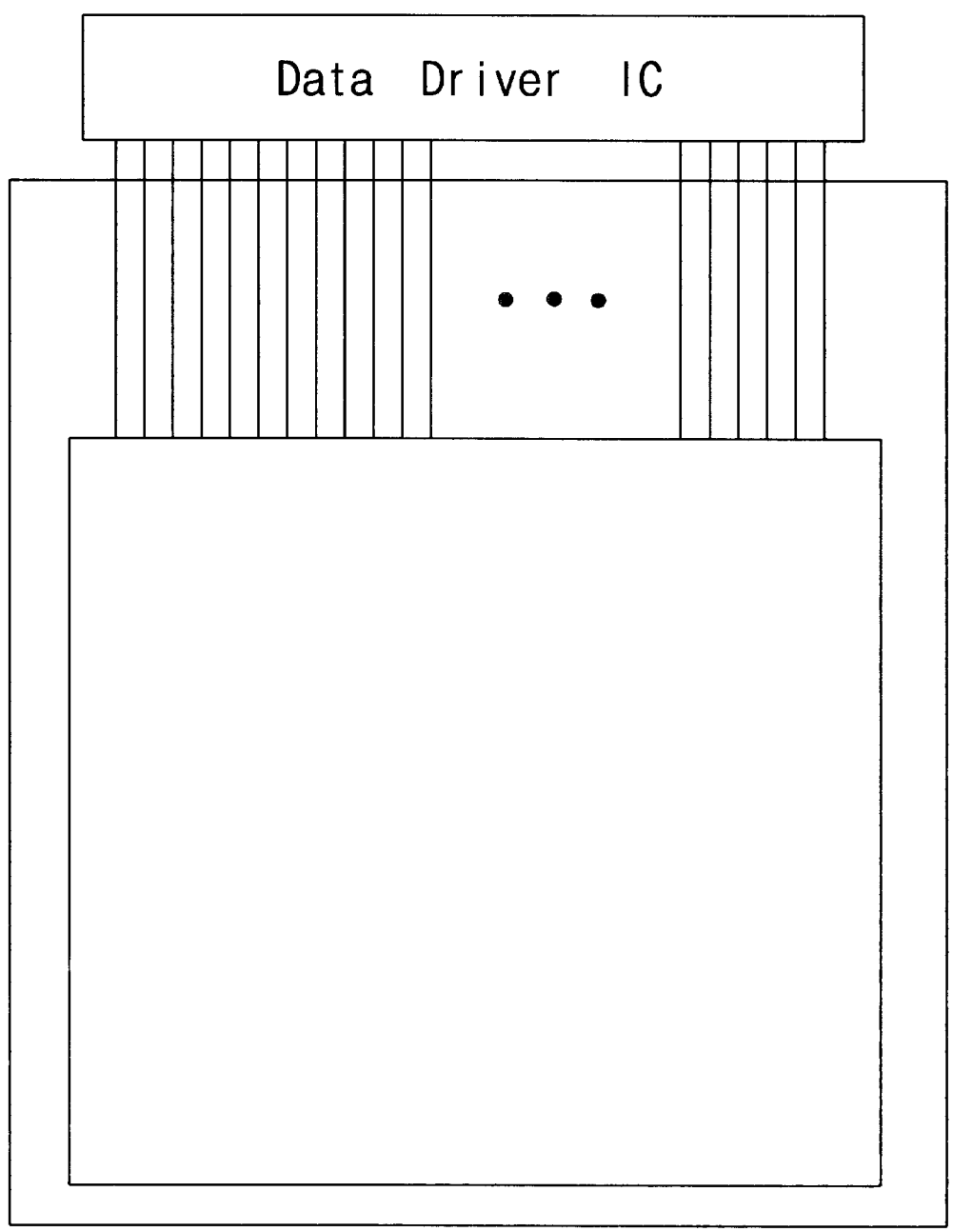
FIG. 30 is a schematic view illustrating a panel in which the entire channels are simultaneously driven.
Figure 31:
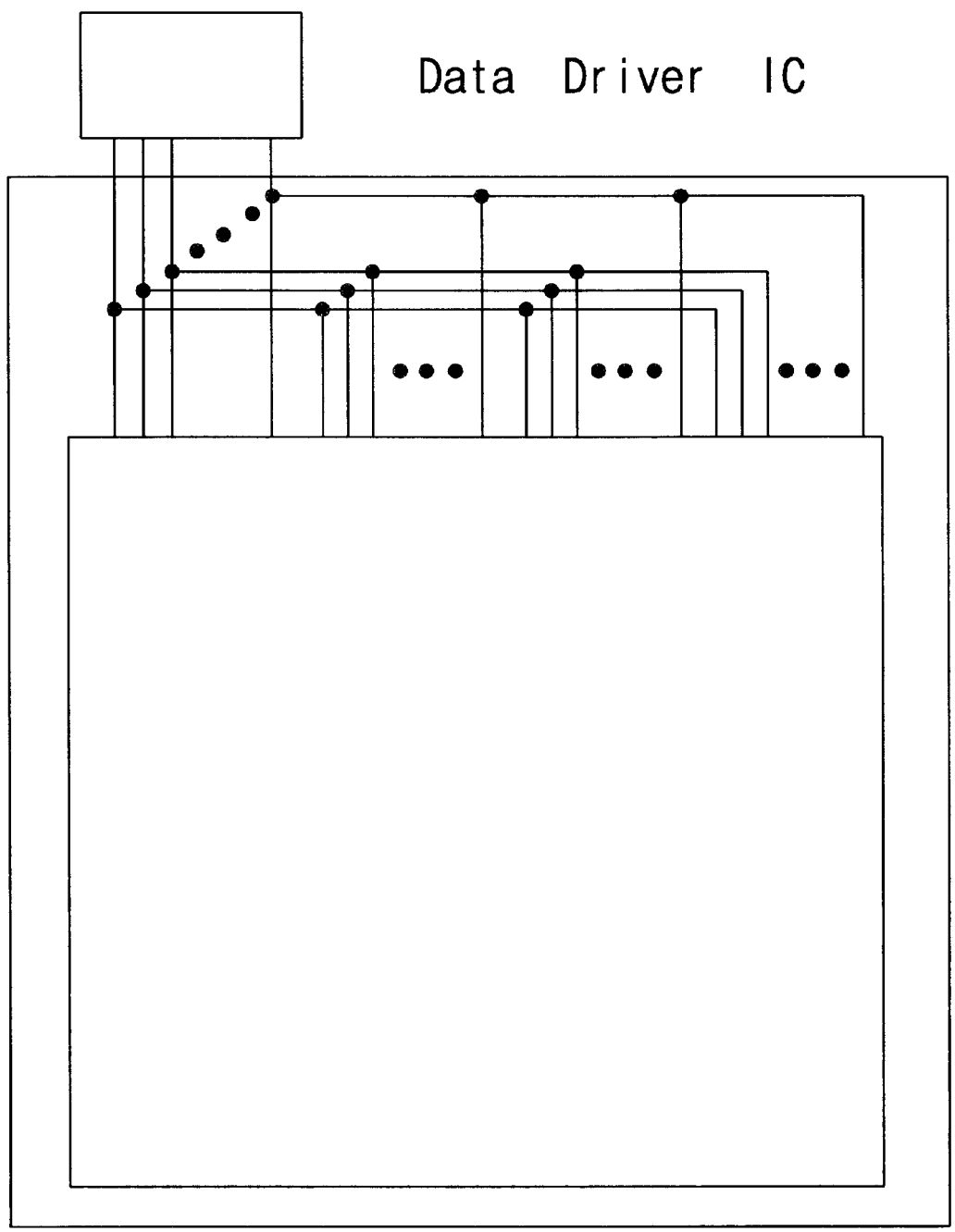
FIG. 31 is a schematic view of a panel driven in a block driving method in accordance with the present invention.

The data driving circuit 160 of the present invention employs not a simultaneous operative manner of whole channels (see FIG. 30) but a block driving method (see FIG. 31).

It is not easy to accomplish a complicated analog function of a data driving chip using a-Si TFT. However, the block driving using a switching transistor can remarkably decrease the number of video channels that are provided to an LCD panel from the data driving chip. The block driving renders the charge time of the pixels to decrease. But, since a small sized panel of 2 inches can have a sufficient line time compared with the monitor for notebook computer or desk top computer, it is possible to employ the block operation.

The charge time of the pixel according to the resolution is shown in the following table 1.

TABLE 1

| RESOLUTION | 2" (176*192) | XGA (1024*768) | SXGA (1280*1024) | UXGA (1600*1200) |
|---|---|---|---|---|
| CHARGE TIME | 86 µs | 20 µs | 15 µs | 13 µs |

In an UXGA level panel, a possible charge time is 7~8 µs upon considering a load and a delay depending on the panel size. Accordingly, upon considering a data driving chip having the same driving capability, 2"-sized panel has a charge time ten times or more than an UXGA level panel. Thus, although a block operation dividing the data line into ten blocks is performed, a 2"-sized panel has the same charge characteristic with an UXGA level panel.

Accordingly, the present invention block-operates the data lines divided into eight blocks in the 2" sized panel. Therefore, if 528 video channels are divided into eight blocks, each block is assigned sixty-six channels. Thus, when compared with the simultaneous operation manner of 528 whole channels (see FIG. 20), it is possible to decrease a connection channel number from 528 channels to sixty-six channels.

It Thus, the present invention employs the block operation method of the data lines and integrates on a panel the data line driving circuit that sequentially selects respective blocks using the shift register, thereby remarkably decreasing the connection terminal number between the data driving chip and the panel to 1/8.

Accordingly, since embodiments in accordance with the present invention need only total connection terminals of sixty-six channel terminals, three data control terminals, five gate control terminals and one common voltage terminal (VCOM), seventy-five total connection terminals are necessary.

Thus, the present invention can decrease the number of the external connection terminals remarkably and the outer track size of the panel, so that the manufacturing cost is saved and the productivity and the price of the goods due to the slimmed panel are enhanced.

Figure 32:
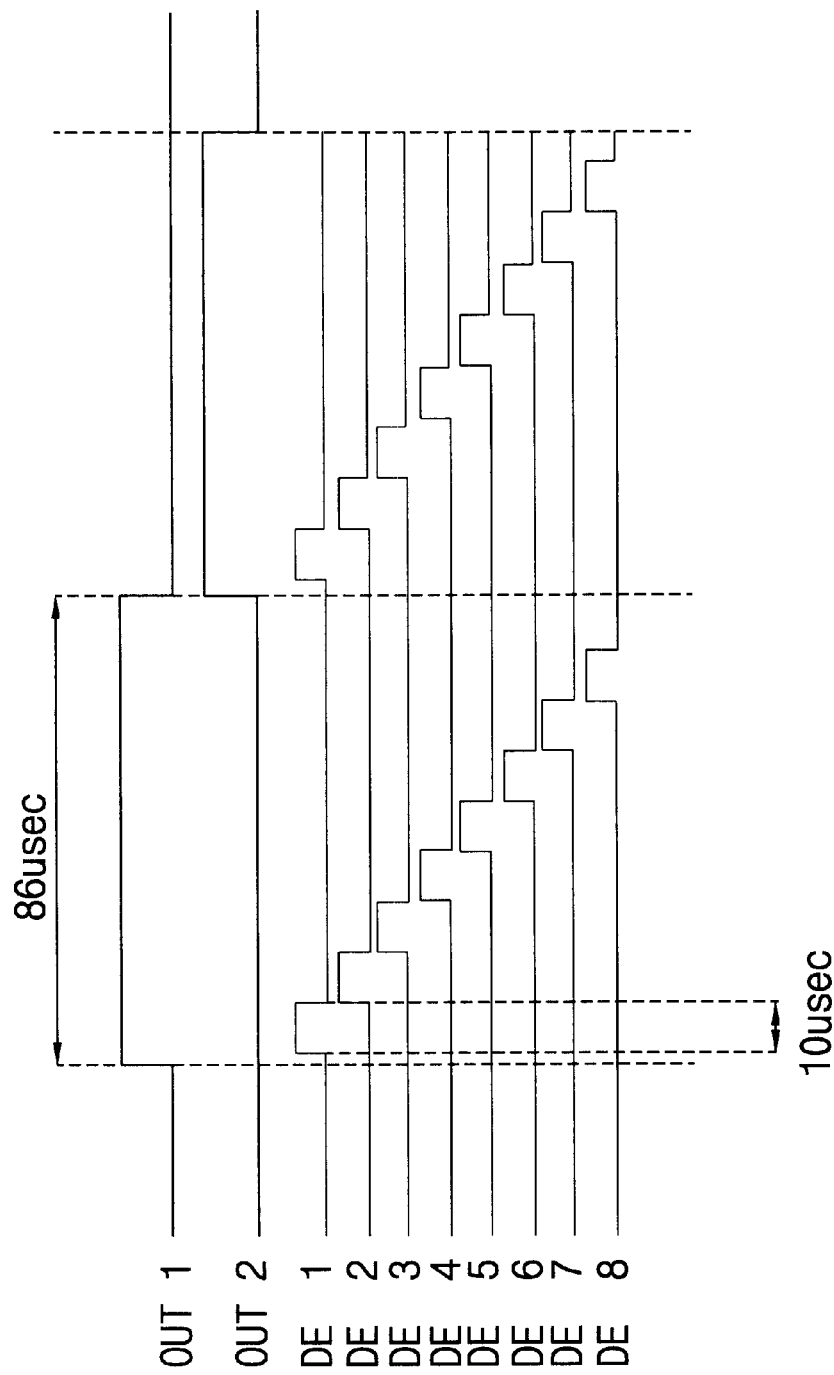
FIG. 32 is a timing chart of respective elements in the block driving method of the present invention.

Referring to FIG. 32, the block operation method generates block selection signals DE1 to DE8 through the shift register 164 in order to sequentially enable 8 blocks at the active section.

The present invention designs a 2" panel having a resolution of 176*192 to have a gate line active period of 86 $\mu s$ and an active period of 10 $\mu s$ for each block selection signal. Accordingly, it is possible to maintain a sufficient pixel charge characteristic upon the block operation.

Figure 33:
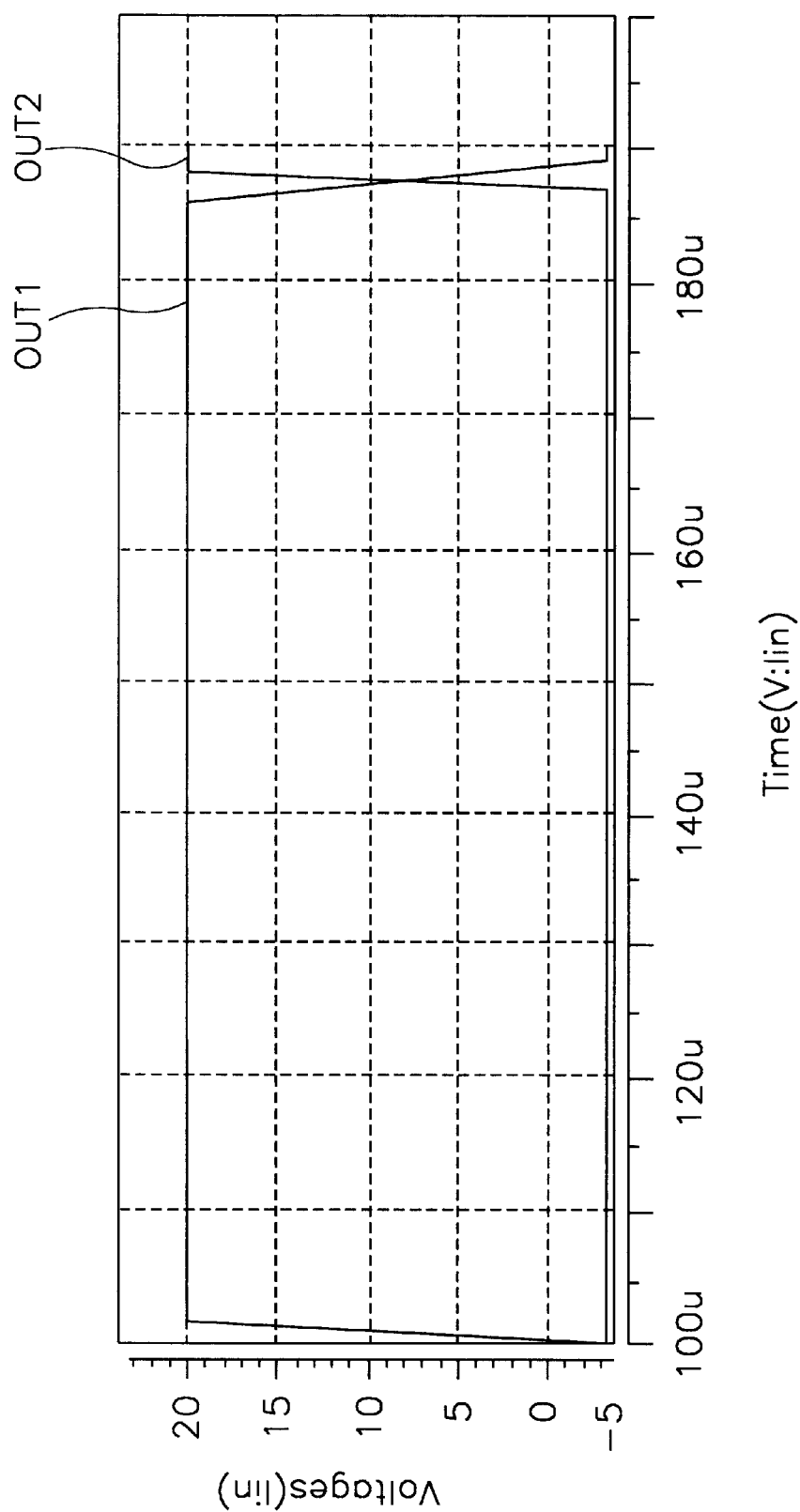
FIGS. 33 through 35 are views showing simulated results of gate line driving signal, data line block selection signal and pixel charge characteristic in which a switching transistor (SWT) is designed to have a width of 4,000 µm and a length of 5 µs.
Figure 34:
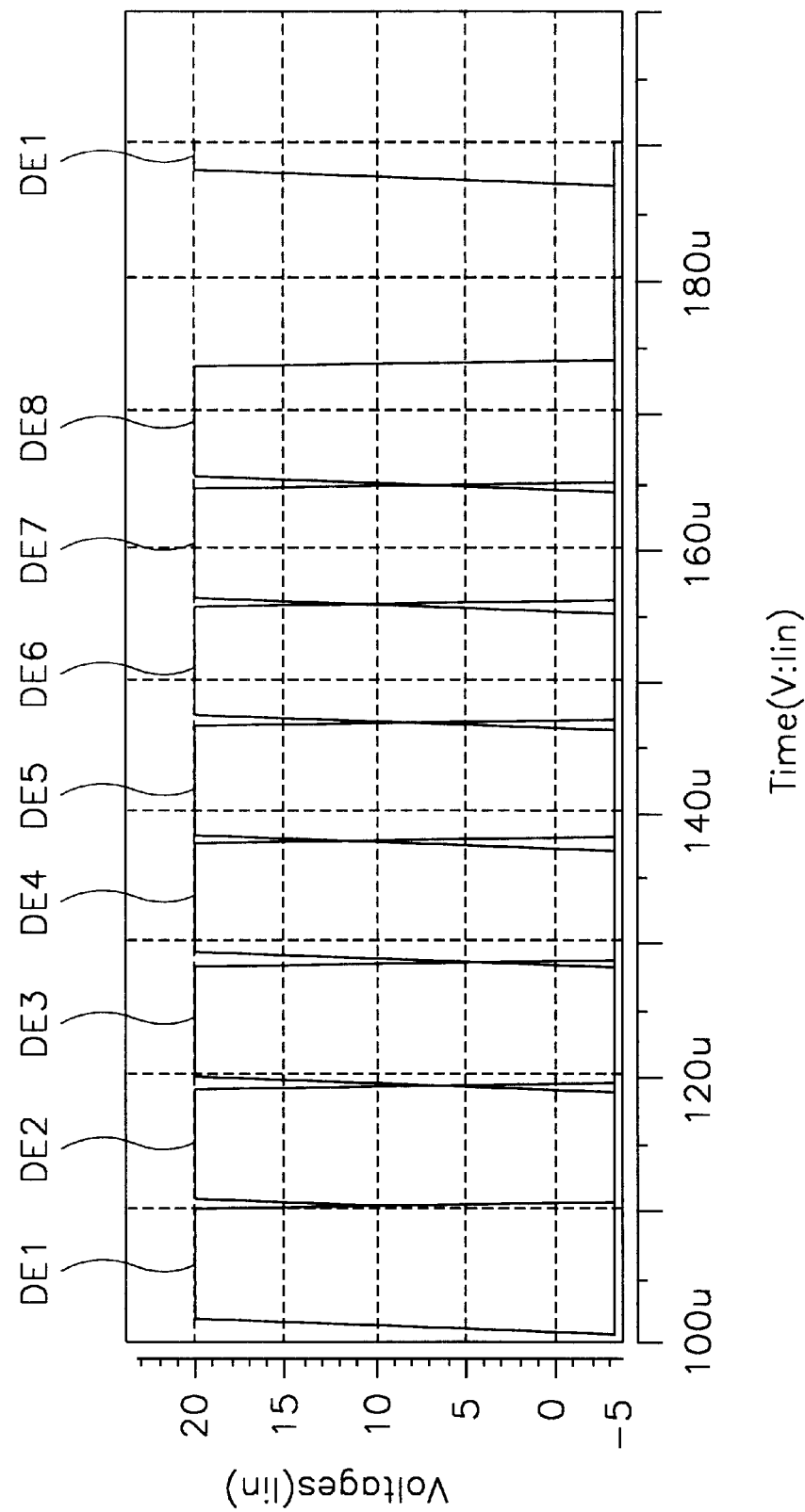
Figure 35:
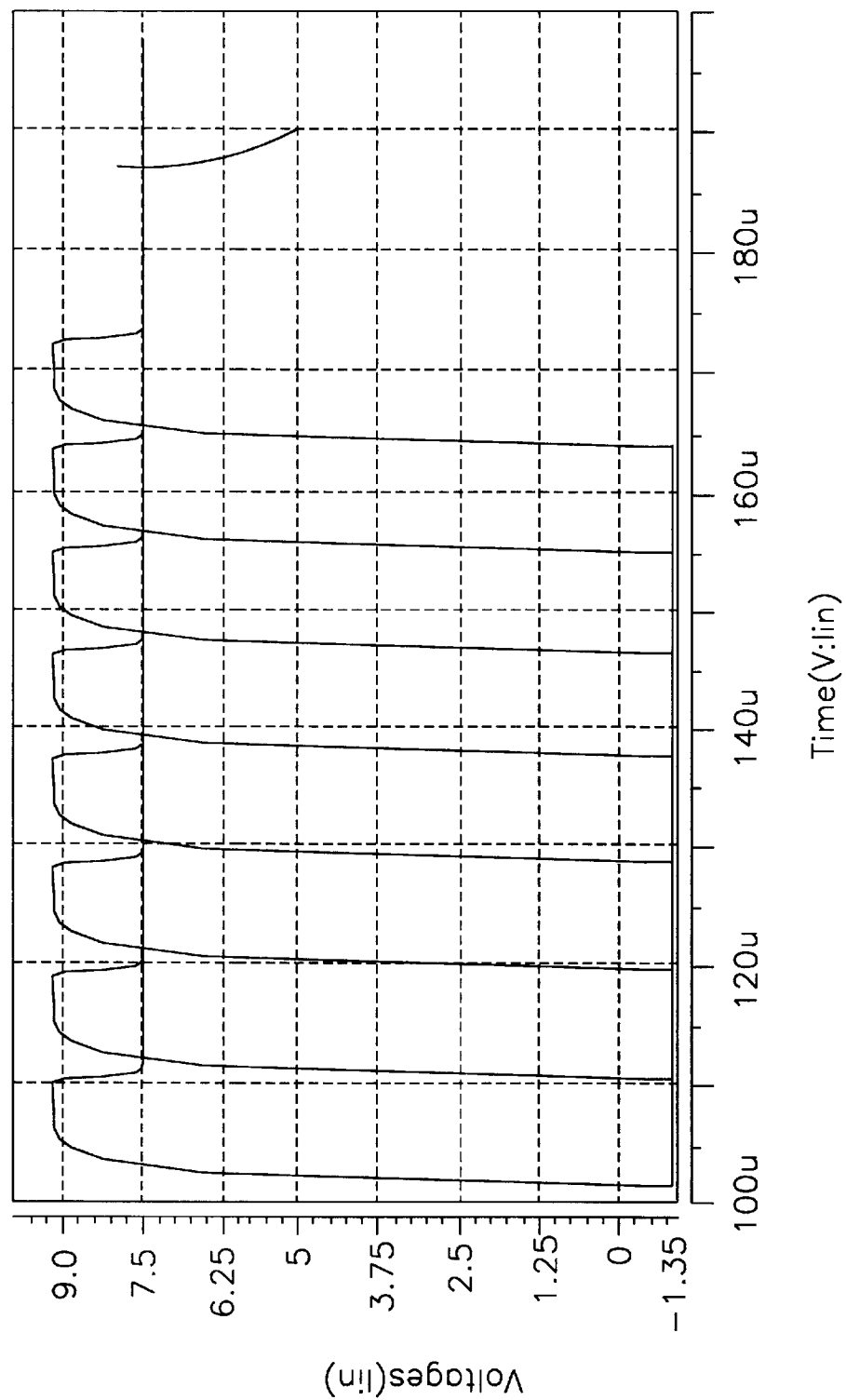

FIGS. 33 to 35 show simulation results of gate line driving signal, data line block selection signal and pixel charge characteristic when a switching transistor (SWT) was designed to have a width of 4,000 $\mu m$ and a length of 5 $\mu s$ and a voltage of 20 V is applied. Here, an active period of the gate line driving signal OUTi was 86 $\mu s$ and an active period of the data line block signal DEi was 10 $\mu s$.

As shown in FIG. 35, the simulation result shows that the pixel charge rate of the block operation is 99% or more.

The aforementioned embodiments show and describe that the shift register of the present invention is employed in both of the data driving circuit and the gate driving circuit. It is evident, however, that a modifications and variation in which the shift register of the present invention is employed in either the data driving circuit or the gate driving circuit will be apparent to those having skills in the art in light of the foregoing description.

As described above, the present invention uses two clock signals at a shift register mounted on the glass substrate of an LCD panel, so that it is possible to decrease the number of external connection terminals. Also, the second power voltage is continuously supplied to prevent the gate of the pull-down transistor from being floated in a disable state, so that it is possible to perform a stable operation regardless of the fluctuation in the threshold voltage of a-Si TFT LCD on a use of a long-term.

Moreover, the present invention employs the block driving method using the shift register in a small sized amorphous silicon TFT panel such as a 2" panel, so that the number of the connection channels decreases remarkably.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

What is claimed is:

1. A shift register in which multiple stages are connected one after another to each other, the multiple stage having a first stage in which a start signal is coupled to an input terminal, the shift register sequentially outputting output signals of respective stages, the multiple stages including odd stages for receiving a first clock signal and even stages for receiving a second clock signal having a phase opposite to the first clock signal, each of the multiple stages comprising:
a pull-up means for providing a corresponding one of the first and second clock signals to an output terminal;
a pull-up driving means connected to an input node of the pull-up means, for turning on the pull-up means in response to a front edge of an input signal and turning off the pull-up means in response to a front edge of an output signal of a next stage;
a pull-down means for providing a first power voltage to the output terminal; and
a pull-down driving means connected to an input node of the pull-down means, for turning off the pull-down means in response to the front edge of the input signal and turning on the pull-down means in response to the front edge of the output signal of the next stage.

2. The shift register of claim 1, wherein each of the multiple stages further comprises a floating preventing means connected to the input node of the pull-down means, wherein the floating preventing means provides a second power voltage to the input node of the pull-down means to prevent the input node of the pull-down means from being floated.

3. The shift register of claim 2, wherein each of the multiple stages further comprises a turn-on preventing means connected to the input node of the pull-down means, wherein the turn-on preventing means provides the first power voltage to the input node of the pull-down means in response to the output signal of the output terminal to prevent the pull-down means from being turned on.

4. The shift register of claim 3, wherein the turn-on preventing means comprises an NMOS transistor of which drain is connected to the input node of the pull-down means, gate is connected to the output terminal and source is connected to the first power voltage.

5. The shift register of claim 2, wherein the pull-up driving means comprises:
a capacitor connected between the input node of the pull-up means and the output terminal;
a first transistor of which drain and gate are commonly connected to the input terminal and source is connected to the input node of the pull-up means;
a second transistor of which drain is connected to the input node of the pull-up means, gate is connected to the input node of the pull-down means and source is connected to the first power voltage; and
a third transistor of which drain is connected to the input node of the pull-up means, gate is connected to the output signal of the next stage and source is connected to the first power voltage.

6. The shift register of claim 5, wherein the pull-down driving means comprises:
a fourth transistor of which drain is connected to the second power voltage, gate is connected to the output signal of the next stage and source is connected to the input node of the pull-down means; and
a fifth transistor of which drain is connected to the input node of the pull-down means, gate is connected to the input signal and source is connected to the first power voltage.

7. The shift register of claim 6, wherein the floating preventing means comprises a sixth transistor of which drain and gate are connected to the second power voltage and source is connected to the input node of the pull-down means, wherein the sixth transistor has a size smaller sufficiently than the fifth transistor.

8. The shift register of claim 7, wherein a size ratio of the fifth transistor to the sixth transistor is approximately 20:1.

9. An LCD comprising a display cell array circuit, a data driving circuit and a gate driving circuit formed on a transparent substrate, the display cell array circuit comprising multiple data lines and multiple gate lines, each of the display cell arrays connected to a corresponding pair of data line and gate line, the gate driving circuit comprising a shift register including multiple stages connected one after another to each other, the multiple stages having a first stage in which a start signal is coupled to an input terminal, for sequentially selecting the multiple gate lines using an output signal of each stage, and the multiple stages having odd stages for receiving a first clock signal, and even stages for receiving a second clock signal having a phase opposite to the first clock signal, wherein the each stage comprises:
an input terminal connected to an output terminal of a previous stage;
an output terminal connected to a corresponding gate line;
a control terminal connected to an output terminal of a next stage;
a clock terminal into which a corresponding clock signal is inputted;
a pull-up means connected between the clock terminal and the output terminal, for pulling-up the corresponding gate line during a duty period of the clock signal of when the pull-up means is turned on;
a pull-down means connected between the output terminal and a first power voltage, for pulling-down the corresponding gate line when the pull-down means is turned on;
a pull-up driving means connected to an input node of the pull-up means, for turning on the pull-up means in response to a front edge of an input signal supplied to the input terminal and turning off the pull-up means in response to a front edge of a control signal supplied to the control terminal;
a pull-down driving means connected to an input node of the pull-down means, for turning off the pull-down means in response to the front edge of the input signal and turning on the pull-down means in response to the front edge of the control signal; and
a floating preventing means connected between the input node of the pull-down means and a second power voltage, for always connecting the second power voltage to the input node of the pull-down means to prevent the input node of the pull-down means from being floated.

10. The LCD of claim 9, wherein each of the multiple stages further comprises a turn-on preventing means connected between the input node of the pull-down means and the first power voltage, wherein the turn-on preventing means connects the first power voltage to the input node of the full down means in response to the output signal of the output terminal to prevent the pull-down means from being turned on.

11. The LCD of claim 10, wherein the turn-on preventing means comprises an NMOS transistor of which drain is connected to the input node of the pull-down means, gate is connected to the output terminal and source is connected to the first power voltage.

12. The LCD of claim 11, wherein the pull-up driving means comprises:
a capacitor connected between the input node of the pull-up means and the output terminal;
a first transistor of which drain and gate are commonly connected to the input terminal and source is connected to the input node of the pull-up means;
a second transistor of which drain is connected to the input node of the pull-up means, gate is connected to the input node of the pull-down means and source is connected to the first power voltage; and
a third transistor of which drain is connected to the input node of the pull-up means, gate is connected to the control terminal and source is connected to the first power voltage.

13. The LCD of claim 12, wherein the pull-down driving means comprises:
a fourth transistor of which drain is connected to the second power voltage, gate is connected to the control terminal and source is connected to the input node of the pull-down means; and
a fifth transistor of which drain is connected to the input node of the pull-down means, gate is connected to the input terminal and source is connected to the first power voltage.

14. The LCD of claim 13, wherein the floating preventing means comprises a sixth transistor of which drain and gate are connected to the second power voltage and source is connected to the input node of the pull-down means, wherein the sixth transistor has a size smaller than the fifth transistor.

15. The LCD of claim 14, wherein a size ratio of the fifth transistor to the sixth transistor is approximately 20:1.

16. The LCD of claim 9, further comprising an external connection terminal having five terminals of a first clock signal input terminal, a second clock signal input terminal, a start signal input terminal, a first power voltage input terminal and a second power voltage input terminal.

17. The LCD of claim 9, wherein each of the display cell array circuit, the data driving circuit and the gate driving circuit is of an NMOS transistor made of amorphous silicon TFT.

18. An LCD comprising a display cell array circuit, a data driving circuit and a gate driving circuit formed on a transparent substrate, the display cell array circuit comprising multiple data lines and multiple gate lines, each of the display cell arrays connected to a corresponding pair of data line and gate line, wherein the data driving circuit comprises multiple data line blocks and a shift register,
wherein each of the data line blocks comprises multiple driving transistors each of which drain and source are respectively connected between a data input terminal and the data line and gate is commonly connected to a block selection terminal,
wherein the shift register comprises multiple stages connected one after another to each other, the multiple stages having a first stage in which a block selection start signal is coupled to an input terminal, for sequentially selecting the multiple data line blocks using an output signal of each stage, and the multiple stages consisting of odd stages for receiving a first clock signal; and even stages for receiving a second clock signal having a phase opposite to the first clock signal, wherein each stage comprises:
an input terminal connected to an output terminal of a previous stage;
an output terminal connected to a block selection terminal of a corresponding data line block;
a control terminal connected to an output terminal of a next stage;
a clock terminal into which a corresponding clock signal is input;

a pull-up means connected between the clock terminal and the output terminal, for pulling-up the corresponding gate line during a duty period of the clock signal of when the pull-up means is turned on;

a pull-down means connected between the output terminal and a first power voltage, for pulling-down the corresponding gate line using the first power voltage when the pull-down means is turned on;

a pull-up driving means connected to an input node of the pull-up means, for turning on the pull-up means in response to a front edge of an input signal supplied to the input terminal and turning off the pull-up means in response to a front edge of a control signal supplied to the control terminal; and a pull-down driving means connected to an input node of the pull-down means, for turning off the pull-down means in response to the front edge of the input signal and turning on the pull-down means in response to the front edge of the control signal.

19. The LCD of claim 18, wherein said each stage comprises a floating preventing means connected between the input node of the pull-down means and a second power voltage, the input node of the pull-down means being always connected to the second power voltage, for preventing the input node of the pull-down means from being floated.

20. The LCD of claim 19, wherein said each stage further comprises a turn-on preventing means connected between the input node of the pull-down means and the first power voltage, wherein the turn-on preventing means connects the first power voltage to the input node of the pull-down means in response to the output signal of the output terminal to prevent the pull-down means from being turned.

21. The LCD of claim 20, wherein the turn-on preventing means comprises an NMOS transistor of which drain is connected to the input node of the pull-down means, gate is connected to the output terminal and source is connected to the first power voltage.

22. The LCD of claim 21, wherein the pull-up driving means comprises:

a capacitor connected between the input node of the pull-up means and the output terminal;

a first transistor of which drain and gate are commonly connected to the input terminal and source is connected to the input node of the pull-up means;

a second transistor of which drain is connected to the input node of the pull-up means, gate is connected to the input node of the pull-down means and source is connected to the first power voltage; and a third transistor of which drain is connected to the input node of the pull-up means, gate is connected to the control terminal and source is connected to the first power voltage.

23. The LCD of claim 22, wherein the pull-down driving means comprises:

a fourth transistor of which drain is connected to the second power voltage, gate is connected to the control terminal and source is connected to the input node of the pull-down means; and a fifth transistor of which drain is connected to the input node of the pull-down means, gate is connected to the input terminal and source is connected to the first power voltage.

24. The LCD of claim 23, wherein the floating preventing means comprises a sixth transistor of which drain and gate are connected to the second power voltage and source is connected to the input node of the pull-down means, wherein the sixth transistor has a size smaller than the fifth transistor.

25. The LCD of claim 24, wherein a size ratio of the fifth transistor to the sixth transistor is approximately 20:1.

26. The LCD of claim 18, further comprising an external connection terminal having a first clock signal input terminal, a second clock signal input terminal, a block selection start signal input terminal and multiple data input terminals.

27. The LCD of claim 18, wherein each of the display cell array circuit, the data driving circuit and the gate driving circuit comprises a NMOS transistor made of amorphous silicon TFT.

28. An LCD having an LCD module in which a liquid crystal is interposed between a lower transparent substrate and an upper transparent substrate, the LCD comprising:

a display cell array circuit formed on the lower transparent substrate, comprising multiple data lines and multiple gate lines, each of the display cell arrays connected to a corresponding pair of data line and gate line, a gate driving circuit formed on the lower transparent substrate and comprising a first shift register comprising multiple stages connected one after another to each other, the multiple stages having a first stage in which a start signal is coupled to an input terminal, the first shift register sequentially selecting the multiple gate lines using an output signal of each stage;

a data driving circuit formed on the lower transparent substrate and comprising multiple data line blocks and a second shift register, each of the data line blocks comprising multiple driving transistors each of which drain and source are connected between a data input terminal and the data line and gate is commonly connected to a block selection terminal, the second shift register comprising multiple stages connected one after another to each other, the multiple stages having a first stage in which a block selection start signal is coupled to an input terminal, for sequentially selecting the multiple data line blocks using an output signal of each stage; and a flexible PCB on which an integral control and data driving chip is mounted, for providing a control signal and a data signal to the input terminal of the gate and data driving circuits.

29. The LCD of claim 28, wherein the multiple stages of each of the first and second shift registers consist of odd stages for receiving a first clock signal; and even stages for receiving a second clock signal having a phase opposite to the first clock signal, wherein each stage comprises:

an input terminal connected to an output terminal of a previous stage;

an output terminal connected to a corresponding gate line or data line block;

a control terminal connected to an output terminal of a next stage;

a clock terminal into which a corresponding clock signal is inputted;

a pull-up means connected between the clock terminal and the output terminal, for pulling-up the output terminal during a duty period of the clock signal of when the pull-up means is turned on;

a pull-down means connected between the output terminal and a first power voltage, for pulling-down the corresponding gate line when the pull-down means is turned on;

a pull-up driving means connected to an input node of the pull-up means, for turning on the pull-up means in response to a front edge of an input signal supplied to the input terminal and turning off the pull-up means in response to a front edge of a control signal supplied to the control terminal;

a pull-down driving means connected to an input node of the pull-down means, for turning off the pull-down means in response to a front edge of the input signal and turning on the pull-down means in response to the front edge of the control signal; and a floating preventing means connected between the input node of the pull-down means and a second power voltage, for always connecting the second power voltage to the input node of the pull-down means to prevent the input node of the pull-down means from being floated.

30. The LCD of claim 28, wherein a duty period of the first and second clock signals applied to the first shift register is greater than a period of a duty period of the first and second clock signals applied to the second shift register multiplied by a number of the data line blocks.

31. The LCD of claim 28, wherein the lower transparent substrate is connected to the flexible PCB through an external connection terminal, wherein the external connection terminal comprises: five terminals connected to the data driving circuit of a first clock signal input terminal, second clock signal input terminal, scan start signal input terminal, first power voltage input terminal and second power voltage input terminal; and three control terminals of first clock signal input terminal, second clock signal input terminal and block selection start signal input terminal and multiple data input terminals all of which are connected to the data driving circuit.

32. A shift register in which multiple stages are connected one after another to each other, the multiple stage having a first stage in which a start signal is inputted into an input terminal, the shift register sequentially outputting output signals of respective stages, the multiple stages including odd stages for receiving a first clock signal and even stages for receiving a second clock signal having a phase opposite to the first clock signal, each of the multiple stages comprising:
a pull-up means for providing a corresponding one of the first and second clock signals to an output terminal;
a pull-up driving means, connected to an input node of the pull-up means, for charging a capacitor in response to a front edge of an input signal to turn on the pull-up means and discharging the capacitor in response to a front edge of an output signal of a next stage to turn off the pull-up means;
a pull-down means for providing a first power voltage to the output terminal; and
pull-down driving means, connected to an input node of the pull-down means and the input node of the pull-up means, for turning off the pull-down means and turning on the pull-down means in response to the front edge of the output signal of the next stage.

33. The shift register of claim 32, wherein the pull-up driving means comprises:
a capacitor connected between the input node of the pull-up means and the output terminal;
a first transistor of which drain is connected to the input node of the pull-up means, gate is connected to an output signal of a next stage and source is connected to the first power voltage;
a second transistor of which drain is connected to the input node of the pull-up means, gate is connected to the output signal of the next stage and source is connected to the first power voltage; and a third transistor of which drain is connected to the input node of the pull-up means, gate is connected to the input node of the pull-down means and source is connected to the first power voltage.

34. The shift register of claim 33, wherein a size ratio of the first transistor to the second transistor is approximately 2:1.

35. The shift register of claim 33, wherein the pull-down driving means comprises:
a fourth transistor of which drain and gate are commonly connected to the second power voltage and source is connected to the input node of the pull-down means; and
a fifth transistor of which drain is connected to the input node of the pull-down means, gate is connected to the input node of the pull-up means and source is connected to the first power voltage.

36. The shift register of claim 35, wherein a size ratio of the third transistor to the fifth transistor is approximately 16:1.

37. The shift register of claim 32, further comprising an external connection terminal having five terminals of a first clock signal input terminal, a second clock signal input terminal, a start signal input terminal, a first power voltage input terminal and a second power voltage input terminal.

38. The shift register of claim 32, wherein a phase difference is placed between high level periods of the first and second clock signals.

39. A shift register in which multiple stages are connected one after another to each other, the multiple stage having a first stage in which a start signal is inputted into an input terminal, the shift register sequentially outputting output signals of respective stages, the multiple stages including odd stages for receiving a first clock signal and even stages for receiving a second clock signal having a phase opposite to the first clock signal, each of the multiple stages comprising:
an NMOS pull-up transistor of which drain is connected to a corresponding clock signal, gate is connected to a first node and source is connected to an output terminal;
an NMOS pull-down transistor of which drain is connected to the output terminal, gate is connected to a second node and source is connected to a first power voltage;
a capacitor connected between the first node and the output terminal;
a first transistor of which drain is connected to a second power voltage, gate is connected to an input signal and source is connected to the first node;
a second transistor of which drain is connected to the first node, gate is connected to an output signal of a next stage and source is connected to the first power voltage;
a third transistor of which drain is connected to the first node, gate is connected to the second node and source is connected to the first power voltage;
a fourth transistor of which drain and gate are commonly connected to the second power voltage and source is connected to the second node; and
a fifth transistor of which drain is connected to the second node, gate is connected to the first node and source is connected to the first power voltage.

40. The shift register of claim 39, wherein a size ratio of the first transistor to the third transistor is approximately 2:1.

41. The shift register of claim 39, wherein a size ratio of the fourth transistor to the fifth transistor is approximately 16:1.

42. The shift register of claim 39, wherein each of the transistors is of an NMOS transistor made of amorphous silicon TFT.

43. A shift register including multiple stages connected in a cascade fashion, the multiple stages having a first stage in which a start signal is coupled to an input terminal, for sequentially outputting output signals of the respective stages, the multiple stages having odd stages for receiving a first clock signal and a second clock signal having a phase opposite to the first clock signal at a first clock terminal and a second clock terminal of the odd stages, and even stages for receiving the second clock signal and the first clock signal at a first clock termianl and a second clock terminal of the even stages, wherein each of the multiple stages comprises:
an input terminal connected to an output terminal of a previous stage;
an output terminal connected to a corresponding gate line;
a first control terminal connected to a second control terminal of a stage after a next stage;
a second control terminal;
a clock terminal into which a corresponding clock signal is inputted;
a pull-up means for providing a corresponding one out of the first and second clock signals to the output terminal;
a pull-down means for providing a first power voltage to the output terminal;
a pull-up driving means connected to an input node of the pull-up means, for turning on the pull-up means in response to a front edge of an input signal and turning off the pull-up means in response to a front edge of a control signal supplied to the control terminal; and
a pull-down driving means connected to an input node of the pull-down means and an input node of the pull-up means, for turning off the pull-down means, and for turning on the pull-down means in response to a front edge of an output signal of the next stage.

44. The shift register of claim 43, wherein the pull-up driving means comprises:
a capacitor connected between the input node of the pull-up means and the output terminal;
a first transistor of which drain and gate are commonly connected to the input signal and source is connected to the input node of the pull-up means; and
a second transistor of which drain is connected to the input node of the pull-up means, gate is connected to the output signal of the next stage and source is connected to the first power voltage.

45. The shift register of claim 44, wherein the first transistor receives the start signal or the input signal from the previous stage through the commonly connected gate and drain, and charges the capacitor through a source thereof.

46. The shift register of claim 44, wherein the pull-up driving means discharges the control signal of the pull-up means using a pull-up control signal provided from the second control terminal.

47. The shift register of claim 43, wherein the pull-down driving means comprises:
a third transistor of which drain is connected to the first power voltage, gate is connected to the output signal of the next stage and source is connected to the input node of the pull-down means; and
a fourth transistor of which drain and gate are commonly connected to the second clock signal and source is connected to the input node of the pull-down means.

48. An LCD comprising a display cell array circuit, a data driving circuit and a gate driving circuit formed on a transparent substrate, the display cell array circuit comprising multiple data lines and multiple gate lines, each of the display cell arrays connected to a corresponding pair of data line and gate line, the gate driving circuit comprising a shift register including multiple stages connected in a cascade fashion, the multiple stages having a first stage in which a start signal is coupled to an input terminal, the shift register for sequentially outputting output signals of the respective stages, the multiple stages having odd stages for receiving a first clock signal and a second clock signal having a phase opposite to the first clock signal at a first clock terminal and a second clock terminal of the odd stages, and even stages for receiving the second clock signal and the first clock signal at a first clock termianl and a second clock terminal of the even stages, wherein each of the multiple stage comprises:
an input terminal connected to an output terminal of a previous stage;
an output terminal connected to a corresponding gate line;
a first control terminal connected to a second control terminal of a stage after a next stage;
a second control terminal;
a clock terminal into which a corresponding clock signal is inputted;
a pull-up means connected between the clock terminal and the output terminal, for turning on the corresponding gate line during a duty period of the clock signal;
a pull-down means connected between the output terminal and a first power voltage, for pulling-down the corresponding gate line when the pull-down means is turned on;
a pull-up driving means connected to an input node of the pull-up means, for turning on the pull-up means in response to a front edge of an input signal supplied to the input terminal and turning off the pull-up means in response to a front edge of a control signal of the stage after the next stage supplied to the control terminal; and
a pull-down driving means connected to an input node of the pull-down means and an input node of the pull-up means, for turning off the pull-down means and for turning on the pull-down means in response to a front edge of an output signal of the next stage.

49. The LCD of claim 48, wherein the pull-up driving means comprises:
a capacitor connected between the input node of the pull-up means and the output terminal;
a first transistor of which drain and gate are commonly connected to the input signal and source is connected to the input node of the pull-up means; and
a second transistor of which drain is connected to the input node of the pull-up means, gate is connected to the output signal of the next stage and source is connected to the first power voltage.

50. The LCD of claim 49, wherein the first transistor receives the start signal or the input signal from the previous stage through the commonly connected gate and drain, and charges the capacitor through a source thereof.

51. The LCD of claim 48, wherein the pull-up driving means discharges the control signal of the pull-up means using a pull-up control signal provided from the second control terminal of the stage after the next stage.

52. The LCD of claim 48, wherein the pull-down driving means comprises:
   a third transistor of which drain is connected to the first power voltage, gate is connected to the output signal of the next stage and source is connected to the input node of the pull-down means; and
   a fourth transistor of which drain and gate are commonly connected to the second clock signal and source is connected to the input node of the pull-down means.

53. A shift register including multiple stages connected in a cascade fashion, the multiple stages having a first stage in which a start signal is coupled to an input terminal, for sequentially outputting output signals of the respective stages, the multiple stages including odd stages for receiving a first clock signal and a second clock signal having a phase opposite to the first clock signal,
   wherein each of the multiple stages comprises:
      a pull-up means for providing a corresponding one out of the first and second clock signals;
      a pull-down means for providing a first power voltage to the output terminal;
      a pull-down driving means connected to an input node of the pull-down means, for turning off the pull-down means in response to a front edge of the input signal and turning on the pull-down means in response to a front edge of an output signal of a next stage; and
      a pull-up driving means provided with a capacitor of which a first end is connected to an input node of the pull-up means and a second end is connected to the output terminal, and a discharging means for forcibly discharging the capacitor depending on an external input control signal, the pull-up driving means turning on the pull-up means by charging the capacitor in response to the front edge of the input signal and turning off the pull-up means by forcibly discharging the capacitor in response to the front edge of the output signal of the next stage.

54. The shift register of claim 53, wherein the pull-up driving means comprises:
   a capacitor connected between the input node of the pull-up means and the output terminal;
   a first transistor of which gate is connected to the input signal, drain is connected to a second power voltage and source is connected to the input node of the pull-up means;
   a second transistor of which drain is connected to the input node of the pull-up means, gate is connected to the input node of the pull-down means and source is connected to the first power voltage;
   a third transistor of which drain is connected to the input node of the pull-up means, gate is connected to the output signal of the next stage and source is connected to the first power voltage; and
   a fourth transistor of which drain is connected to the input node of the pull-up means, source is connected to the first power voltage and gate forcibly discharges the capacitor which receives the external input control signal.

55. The shift register of claim 54, wherein the external input control signal has a voltage level capable of turning on the fourth transistor when a power is applied and turning off the fourth transistor before the start signal is applied to the first stage.

56. The shift register of claim 55, wherein the external input control signal has a voltage level capable of turning off the fourth transistor while the start signal is applied to the first stage and an output of a last shift register is generated, and turning on the fourth transistor after the output of the last shift register is generated, thereby discharging the capacitor of the last shift register.

57. The shift register of claim 53, wherein the pull-up driving means comprises:
   a capacitor connected between the input node of the pull-up means and the output terminal;
   a first transistor of which gate is connected to the input signal, drain is connected to a second power voltage and source is connected to the input node of the pull-up means;
   a second transistor of which drain is connected to the input node of the pull-up means, gate is connected to the input node of the pull-down means and source is connected to the first power voltage; and
   a third transistor of which drain is connected to the input node of the pull-up means, gate is connected to the output signal of the next stage and source receives the external input control signal to forcibly discharge the capacitor.

58. The shift register of claim 57, wherein the sources of the second transistor and the third transistor are commonly connected to each other.

59. The shift register of claim 57, wherein the external input control signal maintains a low state simultaneously with an application of a power to thereby forcibly discharge the capacitor, and maintains a high state before the start signal applied to the first stage is generated.

60. The shift register of claim 58, wherein the external input control signal maintains a low state simultaneously with an application of a power to thereby forcibly discharge the capacitor, and maintains a high state before the start signal applied to the first stage is generated.

61. The shift register of claim 59, wherein the external input control signal h as a voltage level capable of turning on the third transistor when a power is applied, and turning off the third transistor before the start signal is applied to the first stage.

62. The shift register of claim 61, wherein the turning on voltage level is the second power voltage, and the turning off voltage level is the first power voltage.

63. The shift register of claim 57, wherein the second power voltage is above a threshold voltage capable of turning on the third transistor even when the first power voltage is applied to the gate terminal of the third transistor and less than the first power voltage.

64. The shift register of claim 63, wherein the external input control signal has a voltage level capable of turning off the third transistor while the start signal is applied to the first stage and an output of a last shift register is generated, and turning on the third transistor after the output of the last shift register is generated, thereby discharging the capacitor of the last shift register.

65. An LCD comprising a display cell array circuit, a data driving circuit and a gate driving circuit formed on a transparent substrate, the display cell array circuit comprising multiple data lines and multiple gate lines, each of the display cell arrays connected to a corresponding pair of data line and gate line,
   the gate driving circuit comprising a shift register including multiple stages connected in cascade fashion, the multiple stages having a first stage in which a start signal is coupled to an input terminal, the shift register for sequentially selecting the multiple gate lines depending on output signals of the respective stages, the multiple stages having odd stages for receiving a first clock signal, and even stages for receiving a second clock signal having a phase opposite to the first clock signal, wherein each of the multiple stages comprises:
an input terminal connected to an output terminal of a previous stage;
an output terminal connected to a corresponding gate line;
a control terminal connected to a control terminal of a next stage;
a clock terminal into which a corresponding clock signal is inputted;
an external input control terminal for receiving an external input control signal;
a pull-up means for providing a corresponding one out of the first and second clock signals to the output terminal;
a pull-down means for providing a first power voltage to the output terminal;
a pull-down driving means connected to an input node of the pull-down means, for turning off the pull-down means in response to a front edge of the input signal and turning on the pull-down means in response to a front edge of an output signal of a next stage; and
a pull-up driving means provided with a capacitor of which one end is connected to an input node of the pull-up means and the other end is connected to the output terminal, and a discharging means for forcibly discharging the capacitor depending on the external input control signal applied to the external input control terminal, the pull-up driving means turning on the pull-up means by charging the capacitor in response to the front edge of the input signal and turning off the pull-up means by forcibly discharging the capacitor in response to the front edge of the output signal of the next stage.

66. The LCD of claim 65, wherein the pull-up driving means comprises:
a capacitor connected between the input node of the pull-up means and the output terminal;
a first transistor of which gate is connected to the input signal, drain is connected to a second power voltage and source is connected to the input node of the pull-up means;
a second transistor of which drain is connected to the input node of the pull-up means, gate is connected to the input node of the pull-down means and source is connected to the input node of the pull-up means;
a third transistor of which drain is connected to the input node of the pull-up means, gate is connected to the output signal of the next stage and source is connected to the first power voltage; and
a fourth transistor of which drain is connected to the input node of the pull-up means, source is connected to the first power voltage and gate forcibly discharges the capacitor which receives the external input control signal.

67. The LCD of claim 66, wherein the external input control signal has a voltage level capable of turning on the fourth transistor when a power is applied and turning off the fourth transistor before the start signal is applied to the first stage.

68. The LCD of claim 67, wherein the external input control signal has a voltage level capable of turning off the fourth transistor while the start signal is applied to the first stage and an output of a last shift register is generated, and turning on the fourth transistor after the output of the last shift register is generated, thereby discharging the capacitor of the last shift register.

69. The LCD of claim 65, wherein the pull-up driving means comprises:
a capacitor connected between the input node of the pull-up means and the output terminal;
a first transistor of which gate is connected to the input signal, drain is connected to a second power voltage and source is connected to the input node of the pull-up means;
a second transistor of which drain is connected to the input node of the pull-up means, gate is connected to the input node of the pull-down means and source is connected to the first power voltage; and
a third transistor of which drain is connected to the input node of the pull-up means, gate is connected to the output signal of the next stage and source receives the external input control signal to forcibly discharge the capacitor.

70. The LCD of claim 69, wherein the sources of the second transistor and the third transistor are commonly connected to each other.

71. The LCD of claim 69, wherein the external input control signal maintains a low state simultaneously with an application of a power to thereby forcibly discharge the capacitor, and maintains a high state before the start signal applied to the first stage is generated.

72. The LCD of claim 70, wherein the external input control signal maintains a low state simultaneously with an application of a power to thereby forcibly discharge the capacitor, and maintains a high state before the start signal applied to the first stage is generated.

73. The LCD of claim 70, wherein the external input control signal has a voltage level capable of turning on the third transistor when a power is applied and turning off the third transistor before the start signal is applied to the first stage.

74. The LCD of claim 73, wherein the turning on level is the second power voltage level and the turning off voltage level is the first power voltage level.

75. The LCD of claim 70, wherein the second power voltage is above a threshold voltage capable of turning on the third transistor even when the first power voltage is applied to the gate terminal of the third transistor and less than the first power voltage.

76. The LCD of claim 75, wherein the external input control signal has a voltage level capable of turning off the third transistor while the start signal is applied to the first stage and an output of a last shift register is generated, and turning on the third transistor after the output of the last shift register is generated, thereby discharging the capacitor of the last shift register.

* * * * *